(12) United States Patent
Hashimoto

(10) Patent No.: US 7,652,521 B2
(45) Date of Patent: Jan. 26, 2010

(54) INTEGRATED CIRCUIT, AND APPARATUS AND METHOD FOR PRODUCTION THEREOF

(75) Inventor: Yasuhiro Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/239,080

(22) Filed: Sep. 26, 2008

(65) Prior Publication Data

US 2009/0051412 A1 Feb. 26, 2009

Related U.S. Application Data

(63) Continuation of application No. PCT/JP2006/306967, filed on Mar. 31, 2006.

(51) Int. Cl.
*H01H 85/00* (2006.01)
(52) U.S. Cl. .................................. 327/525; 327/565
(58) Field of Classification Search ................ 327/524, 327/525, 564, 565, 566
See application file for complete search history.

(56) References Cited

U.S. PATENT DOCUMENTS

| | | | |
|---|---|---|---|
| 6,169,393 B1 | 1/2001 | Hashimoto | |
| 6,243,305 B1 | 6/2001 | Brady | |
| 6,621,324 B2 * | 9/2003 | Fifield et al. | 327/525 |
| 6,822,309 B2 | 11/2004 | Hirota | |
| 2002/0035718 A1 | 3/2002 | Fukushima et al. | |
| 2003/0052440 A1 | 3/2003 | Tsuura | |

FOREIGN PATENT DOCUMENTS

| | | | |
|---|---|---|---|
| JP | 6120349 A | 4/1994 |
| JP | 2000339987 A | 12/2000 |
| JP | 2000340656 A | 12/2000 |
| JP | 2001-057388 A | 2/2001 |
| JP | 2001-274251 A | 10/2001 |
| JP | 200243427 A | 2/2002 |
| JP | 2002270692 A | 9/2002 |
| JP | 2003163268 A | 6/2003 |

OTHER PUBLICATIONS

International Search Report of PCT/JP2006/306967, mailing date of May 30, 2006.

* cited by examiner

*Primary Examiner*—Jeffrey S Zweizig
(74) *Attorney, Agent, or Firm*—Westerman, Hattori, Daniels & Adrian, LLP

(57) ABSTRACT

An integrated circuit includes a trimming signal creating section, disposed downstream of a trimming circuit in which a number of fuses are arranged in alignment, creating a trimming signal corresponding to the trimming value on the basis of a signal output from said trimming circuit and arranges blown object fuses such that every two of the blown object fuses are interposed at least one un-blown fuses in the trimming circuit. An efficient arrangement of blowing points in addition to the above arrangement of blown object fuses can reduce the area occupied by the trimming circuit.

17 Claims, 58 Drawing Sheets

FIG. 3

| TRIMMING VALUE | TRIMMING PATTERN (BINARY) | PROHIBITION PATTERN |
|---|---|---|
| 0 | 000000 | |
| 1 | 000001 | |
| 2 | 000010 | |
| 3 | 000011 | YES |
| 4 | 000100 | |
| 5 | 000101 | |
| 6 | 000110 | YES |
| 7 | 000111 | YES |
| 8 | 001000 | |
| 9 | 001001 | |
| 10 | 001010 | |
| 11 | 001011 | YES |
| 12 | 001100 | YES |
| 13 | 001101 | YES |
| 14 | 001110 | YES |
| 15 | 001111 | YES |
| 16 | 010000 | |
| 17 | 010001 | |
| 18 | 010010 | |
| 19 | 010011 | YES |
| 20 | 010100 | |
| 21 | 010101 | |
| 22 | 010110 | YES |
| 23 | 010111 | YES |
| 24 | 011000 | YES |
| 25 | 011001 | YES |
| 26 | 011010 | YES |
| 27 | 011011 | YES |
| 28 | 011100 | YES |
| 29 | 011101 | YES |
| 30 | 011110 | YES |
| 31 | 011111 | YES |
| 32 | 100000 | |
| 33 | 100001 | |
| 34 | 100010 | |
| 35 | 100011 | YES |
| 36 | 100100 | |
| 37 | 100101 | |
| 38 | 100110 | YES |
| 39 | 100111 | YES |
| 40 | 101000 | |
| 41 | 101001 | |
| 42 | 101010 | |

FIG. 4

| ORIGINAL TRIMMING VALUE (DECIMAL) | TRIMMING PATTERN (BINARY) | PROHIBIT PATTERN | OTHERS | USABLE TRIMMING VALUE (DECIMAL) | USABLE TRIMMING PATTERN (BINARY) |
|---|---|---|---|---|---|
| 0 | 000000 | | | 0 | 000000 |
| 1 | 000001 | | | 1 | 000001 |
| 2 | 000010 | | | 2 | 000010 |
| 3 | 000011 | YES | UNUSABLE | 4 | 000100 |
| 4 | 000100 | | | 5 | 000101 |
| 5 | 000101 | | | 8 | 001000 |
| 6 | 000110 | YES | UNUSABLE | 9 | 001001 |
| 7 | 000111 | YES | UNUSABLE | 10 | 001010 |
| 8 | 001000 | | | 16 | 010000 |
| 9 | 001001 | | | 17 | 010001 |
| 10 | 001010 | | | 18 | 010010 |
| 11 | 001011 | YES | UNUSABLE | 20 | 010100 |
| 12 | 001100 | YES | UNUSABLE | 21 | 010101 |
| 13 | 001101 | YES | UNUSABLE | 32 | 100000 |
| 14 | 001110 | YES | UNUSABLE | 33 | 100001 |
| 15 | 001111 | YES | UNUSABLE | 34 | 100010 |

FIG. 5

| BEFORE CONVERSION | | AFTER CONVERSION | | |
|---|---|---|---|---|
| TRIMMING VALUE (DECIMAL) | TRIMMING PATTERN (BINARY) | TRIMMING SIGNAL | | |
| | | DECIMAL | BINARY | OTHERS |
| 0 | 000000 | 0 | 0000 | |
| 1 | 000001 | 1 | 0001 | |
| 2 | 000010 | 2 | 0010 | |
| 3 | 000011 | – | – | UNUSABLE |
| 4 | 000100 | 3 | 0011 | |
| 5 | 000101 | 4 | 0100 | |
| 6 | 000110 | – | – | UNUSABLE |
| 7 | 000111 | – | – | UNUSABLE |
| 8 | 001000 | 5 | 0101 | |
| 9 | 001001 | 6 | 0110 | |
| 10 | 001010 | 7 | 0111 | |
| 11 | 001011 | – | – | UNUSABLE |
| 12 | 001100 | – | – | UNUSABLE |
| 13 | 001101 | – | – | UNUSABLE |
| 14 | 001110 | – | – | UNUSABLE |
| 15 | 001111 | – | – | UNUSABLE |
| 16 | 010000 | 8 | 1000 | |
| 17 | 010001 | 9 | 1001 | |
| 18 | 010010 | 10 | 1010 | |
| 19 | 010011 | – | – | UNUSABLE |
| 20 | 010100 | 11 | 1011 | |
| 21 | 010101 | 12 | 1100 | |
| 22 | 010110 | – | – | UNUSABLE |
| 23 | 010111 | – | – | UNUSABLE |
| 24 | 011000 | – | – | UNUSABLE |
| 25 | 011001 | – | – | UNUSABLE |
| 26 | 011010 | – | – | UNUSABLE |
| 27 | 011011 | – | – | UNUSABLE |
| 28 | 011100 | – | – | UNUSABLE |
| 29 | 011101 | – | – | UNUSABLE |
| 30 | 011110 | – | – | UNUSABLE |
| 31 | 011111 | – | – | UNUSABLE |
| 32 | 100000 | 13 | 1101 | |
| 33 | 100001 | 14 | 1110 | |
| 34 | 100010 | 15 | 1111 | |
| 35 | 100011 | – | – | UNUSABLE |
| 36 | 100100 | * | * | SPARE BIT |
| 37 | 100101 | * | * | SPARE BIT |
| 38 | 100110 | – | – | UNUSABLE |
| 39 | 100111 | – | – | UNUSABLE |
| 40 | 101000 | * | * | SPARE BIT |
| 41 | 101001 | * | * | SPARE BIT |
| 42 | 101010 | * | * | SPARE BIT |

· TRIMMING VALUE 43 AND LATER ARE UNUSABLE AND THEREFORE OMITTED
· EXAMPLE PATTERNS WITHOUT "11" ARRANGED IN ASCENDING ORDER

FIG. 10

| BEFORE CONVERSION | | AFTER CONVERSION | | |
|---|---|---|---|---|
| TRIMMING VALUE (DECIMAL) | TRIMMING PATTERN (BINARY) | TRIMMING SIGNAL | | |
| | | DECIMAL | BINARY | OTHERS |
| 0 | 000000 | 0 | 0000 | |
| 1 | 000001 | 1 | 0001 | |
| 2 | 000010 | 2 | 0010 | |
| 3 | 000011 | – | – | UNUSABLE |
| 4 | 000100 | 3 | 0011 | |
| 5 | 000101 | 4 | 0100 | |
| 6 | 000110 | – | – | UNUSABLE |
| 7 | 000111 | – | – | UNUSABLE |
| 8 | 001000 | 5 | 0101 | |
| 9 | 001001 | 6 | 0110 | |
| 10 | 001010 | 7 | 0111 | |
| 11 | 001011 | – | – | UNUSABLE |
| 12 | 001100 | – | – | UNUSABLE |
| 13 | 001101 | – | – | UNUSABLE |
| 14 | 001110 | – | – | UNUSABLE |
| 15 | 001111 | – | – | UNUSABLE |
| 16 | 010000 | – | – | UNUSABLE |
| 17 | 010001 | – | – | UNUSABLE |
| 18 | 010010 | – | – | UNUSABLE |
| 19 | 010011 | – | – | UNUSABLE |
| 20 | 010100 | – | – | UNUSABLE |
| 21 | 010101 | – | – | UNUSABLE |
| 22 | 010110 | – | – | UNUSABLE |
| 23 | 010111 | – | – | UNUSABLE |
| 24 | 011000 | – | – | UNUSABLE |
| 25 | 011001 | – | – | UNUSABLE |
| 26 | 011010 | – | – | UNUSABLE |
| 27 | 011011 | – | – | UNUSABLE |
| 28 | 011100 | – | – | UNUSABLE |
| 29 | 011101 | – | – | UNUSABLE |
| 30 | 011110 | – | – | UNUSABLE |
| 31 | 011111 | – | – | UNUSABLE |
| 32 | 100000 | 8 | 1000 | |
| 33 | 100001 | 9 | 1001 | |
| 34 | 100010 | 10 | 1010 | |
| 35 | 100011 | – | – | UNUSABLE |
| 36 | 100100 | 11 | 1011 | |
| 37 | 100101 | 12 | 1100 | |
| 38 | 100110 | – | – | UNUSABLE |
| 39 | 100111 | – | – | UNUSABLE |
| 40 | 101000 | 13 | 1101 | |
| 41 | 101001 | 14 | 1110 | |
| 42 | 101010 | 15 | 1111 | |

FIG. 11

| BEFORE CONVERSION | | AFTER CONVERSION | | |
|---|---|---|---|---|
| TRIMMING VALUE (DECIMAL) | TRIMMING PATTERN (BINARY) | TRIMMING SIGNAL | | |
| | | DECIMAL | BINARY | OTHERS |
| 0 | 0x0000 | 0 | 0000 | |
| 1 | 0x0001 | 1 | 0001 | |
| 2 | 0x0010 | 2 | 0010 | |
| 3 | 0x0011 | − | − | UNUSABLE |
| 4 | 0x0100 | 3 | 0011 | |
| 5 | 0x0101 | 4 | 0100 | |
| 6 | 0x0110 | − | − | UNUSABLE |
| 7 | 0x0111 | − | − | UNUSABLE |
| 8 | 0x1000 | 5 | 0101 | |
| 9 | 0x1001 | 6 | 0110 | |
| 10 | 0x1010 | 7 | 0111 | |
| 11 | 0x1011 | − | − | UNUSABLE |
| 12 | 0x1100 | − | − | UNUSABLE |
| 13 | 0x1101 | − | − | UNUSABLE |
| 14 | 0x1110 | − | − | UNUSABLE |
| 15 | 0x1111 | − | − | UNUSABLE |
| 16 | 1x0000 | 8 | 1000 | |
| 17 | 1x0001 | 9 | 1001 | |
| 18 | 1x0010 | 10 | 1010 | |
| 19 | 1x0011 | − | − | UNUSABLE |
| 20 | 1x0100 | 11 | 1011 | |
| 21 | 1x0101 | 12 | 1100 | |
| 22 | 1x0110 | − | − | UNUSABLE |
| 23 | 1x0111 | − | − | UNUSABLE |
| 24 | 1x1000 | 13 | 1101 | |
| 25 | 1x1001 | 14 | 1110 | |
| 26 | 1x1010 | 15 | 1111 | |
| 27 | 1x1011 | − | − | UNUSABLE |
| 28 | 1x1100 | − | − | UNUSABLE |
| 29 | 1x1101 | − | − | UNUSABLE |
| 30 | 1x1110 | − | − | UNUSABLE |
| 31 | 1x1111 | − | − | UNUSABLE |

FIG. 12

| BEFORE CONVERSION | | | AFTER CONVERSION | | |
|---|---|---|---|---|---|
| TRIMMING VALUE (DECIMAL) | TRIMMING PATTERN (BINARY) | RISK | TRIMMING SIGNAL | | |
| | | | DECIMAL | BINARY | OTHERS |
| 0 | 000000 | 0 | 0 | 0000 | |
| 1 | 000001 | 0 | 1 | 0001 | |
| 2 | 000010 | 0 | 2 | 0010 | |
| 3 | 000011 | 3 | – | – | UNUSABLE |
| 4 | 000100 | 0 | 3 | 0011 | |
| 5 | 000101 | 1 | 4 | 0100 | |
| 6 | 000110 | 3 | – | – | UNUSABLE |
| 7 | 000111 | 3 | – | – | UNUSABLE |
| 8 | 001000 | 0 | 5 | 0101 | |
| 9 | 001001 | 0 | 6 | 0110 | |
| 10 | 001010 | 1 | 7 | 0111 | |
| 11 | 001011 | 3 | – | – | UNUSABLE |
| 12 | 001100 | 3 | – | – | UNUSABLE |
| 13 | 001101 | 3 | – | – | UNUSABLE |
| 14 | 001110 | 3 | – | – | UNUSABLE |
| 15 | 001111 | 3 | – | – | UNUSABLE |
| 16 | 010000 | 0 | 8 | 1000 | |
| 17 | 010001 | 0 | 9 | 1001 | |
| 18 | 010010 | 0 | 10 | 1010 | |
| 19 | 010011 | 3 | – | – | UNUSABLE |
| 20 | 010100 | 1 | 11 | 1011 | |
| 21 | 010101 | 2 | – | – | UNUSABLE |
| 22 | 010110 | 3 | – | – | UNUSABLE |
| 23 | 010111 | 3 | – | – | UNUSABLE |
| 24 | 011000 | 3 | – | – | UNUSABLE |
| 25 | 011001 | 3 | – | – | UNUSABLE |
| 26 | 011010 | 3 | – | – | UNUSABLE |
| 27 | 011011 | 3 | – | – | UNUSABLE |
| 28 | 011100 | 3 | – | – | UNUSABLE |
| 29 | 011101 | 3 | – | – | UNUSABLE |
| 30 | 011110 | 3 | – | – | UNUSABLE |
| 31 | 011111 | 3 | – | – | UNUSABLE |
| 32 | 100000 | 0 | 12 | 1100 | |
| 33 | 100001 | 0 | 13 | 1101 | |
| 34 | 100010 | 0 | 14 | 1110 | |
| 35 | 100011 | 3 | – | – | UNUSABLE |
| 36 | 100100 | 0 | 15 | 1111 | |
| 37 | 100101 | 1 | * | * | SPARE BIT |
| 38 | 100110 | 3 | – | – | UNUSABLE |
| 39 | 100111 | 3 | – | – | UNUSABLE |
| 40 | 101000 | 1 | * | * | SPARE BIT |
| 41 | 101001 | 1 | * | * | SPARE BIT |
| 42 | 101010 | 2 | – | – | UNUSABLE |

FIG. 13

| BEFORE CONVERSION | | AFTER CONVERSION | | |
|---|---|---|---|---|
| TRIMMING VALUE (DECIMAL) | TRIMMING PATTERN (BINARY) | TRIMMING SIGNAL | | |
| | | DECIMAL | BINARY | OTHERS |
| 0 | 000000 | 0 | 00000 | |
| 1 | 000001 | 1 | 00001 | |
| 2 | 000010 | 2 | 00010 | |
| 3 | 000011 | – | – | UNUSABLE |
| 4 | 000100 | 3 | 00011 | |
| 5 | 000101 | 4 | 00100 | |
| 6 | 000110 | – | – | UNUSABLE |
| 7 | 000111 | – | – | UNUSABLE |
| 8 | 001000 | 5 | 00101 | |
| 9 | 001001 | 6 | 00110 | |
| 10 | 001010 | 7 | 00111 | |
| 11 | 001011 | – | – | UNUSABLE |
| 12 | 001100 | – | – | UNUSABLE |
| 13 | 001101 | – | – | UNUSABLE |
| 14 | 001110 | – | – | UNUSABLE |
| 15 | 001111 | – | – | UNUSABLE |
| 16 | 010000 | 8 | 01000 | |
| 17 | 010001 | 9 | 01001 | |
| 18 | 010010 | 10 | 01010 | |
| 19 | 010011 | – | – | UNUSABLE |
| 20 | 010100 | 11 | 01011 | |
| 21 | 010101 | 12 | 01100 | |
| 22 | 010110 | – | – | UNUSABLE |
| 23 | 010111 | – | – | UNUSABLE |
| 24 | 011000 | – | – | UNUSABLE |
| 25 | 011001 | – | – | UNUSABLE |
| 26 | 011010 | – | – | UNUSABLE |
| 27 | 011011 | – | – | UNUSABLE |
| 28 | 011100 | – | – | UNUSABLE |
| 29 | 011101 | – | – | UNUSABLE |
| 30 | 011110 | – | – | UNUSABLE |
| 31 | 011111 | – | – | UNUSABLE |
| 32 | 100000 | 13 | 01101 | |
| 33 | 100001 | 14 | 01110 | |
| 34 | 100010 | 15 | 01111 | |
| 35 | 100011 | – | – | UNUSABLE |
| 36 | 100100 | 16 | 10000 | |
| 37 | 100101 | 17 | 10001 | |
| 38 | 100110 | – | – | UNUSABLE |
| 39 | 100111 | – | – | UNUSABLE |
| 40 | 101000 | 18 | 10010 | |
| 41 | 101001 | 19 | 10011 | |
| 42 | 101010 | 20 | 10100 | |

FIG. 14

| BEFORE CONVERSION | | AFTER CONVERSION | | |
|---|---|---|---|---|
| TRIMMING VALUE (DECIMAL) | TRIMMING PATTERN (BINARY) | TRIMMING SIGNAL | | |
| | | DECIMAL | BINARY | OTHERS |
| 0 | 000000 | 0 | 0000 | |
| 1 | 000001 | 1 | 0001 | |
| 2 | 000010 | 2 | 0010 | |
| 3 | 000011 | – | – | UNUSABLE |
| 4 | 000100 | 3 | 0011 | |
| 5 | 000101 | – | – | UNUSABLE |
| 6 | 000110 | – | – | UNUSABLE |
| 7 | 000111 | – | – | UNUSABLE |
| 8 | 001000 | 4 | 0100 | |
| 9 | 001001 | 5 | 0101 | |
| 10 | 001010 | – | – | UNUSABLE |
| 11 | 001011 | – | – | UNUSABLE |
| 12 | 001100 | – | – | UNUSABLE |
| 13 | 001101 | – | – | UNUSABLE |
| 14 | 001110 | – | – | UNUSABLE |
| 15 | 001111 | – | – | UNUSABLE |
| 16 | 010000 | 6 | 0110 | |
| 17 | 010001 | 7 | 0111 | |
| 18 | 010010 | 8 | 1000 | |
| 19 | 010011 | – | – | UNUSABLE |
| 20 | 010100 | – | – | UNUSABLE |
| 21 | 010101 | – | – | UNUSABLE |
| 22 | 010110 | – | – | UNUSABLE |
| 23 | 010111 | – | – | UNUSABLE |
| 24 | 011000 | – | – | UNUSABLE |
| 25 | 011001 | – | – | UNUSABLE |
| 26 | 011010 | – | – | UNUSABLE |
| 27 | 011011 | – | – | UNUSABLE |
| 28 | 011100 | – | – | UNUSABLE |
| 29 | 011101 | – | – | UNUSABLE |
| 30 | 011110 | – | – | UNUSABLE |
| 31 | 011111 | – | – | UNUSABLE |
| 32 | 100000 | 9 | 1001 | |
| 33 | 100001 | 10 | 1010 | |
| 34 | 100010 | 11 | 1011 | |
| 35 | 100011 | – | – | UNUSABLE |
| 36 | 100100 | 12 | 1100 | |
| 37 | 100101 | – | – | UNUSABLE |
| 38 | 100110 | – | – | UNUSABLE |
| 39 | 100111 | – | – | UNUSABLE |
| 40 | 101000 | – | – | UNUSABLE |
| 41 | 101001 | – | – | UNUSABLE |
| 42 | 101010 | – | – | UNUSABLE |

FIG. 18

| COUNTER VALUE | | TRIMMING VALUE | |
|---|---|---|---|
| DECIMAL | BINARY | DECIMAL | BINARY |
| 0 | 0000 | 0 | 000000 |
| 1 | 0001 | 1 | 000001 |
| 2 | 0010 | 2 | 000010 |
| 3 | 0011 | 4 | 000100 |
| 4 | 0100 | 5 | 000101 |
| 5 | 0101 | 8 | 001000 |
| 6 | 0110 | 9 | 001001 |
| 7 | 0111 | 10 | 001010 |
| 8 | 1000 | 32 | 100000 |
| 9 | 1001 | 33 | 100001 |
| 10 | 1010 | 34 | 100010 |
| 11 | 1011 | 36 | 100100 |
| 12 | 1100 | 37 | 100101 |
| 13 | 1101 | 40 | 101000 |
| 14 | 1110 | 41 | 101001 |
| 15 | 1111 | 42 | 101010 |

FIG. 20

| BEFORE CONVERSION | | AFTER CONVERSION | | RISK |
|---|---|---|---|---|
| TRIMMING PATTERN (BINARY) | TRIMMING PATTERN (BINARY) | TRIMMING SIGNAL | | |
| | | DECIMAL | BINARY | |
| 0 | 0000.0000.0000 | 0 | 0000.0000 | 0 |
| 1 | 0000.0000.0001 | 1 | 0000.0001 | 0 |
| 2 | 0000.0000.0010 | 2 | 0000.0010 | 0 |
| 4 | 0000.0000.0100 | 3 | 0000.0011 | 0 |
| 5 | 0000.0000.0101 | 4 | 0000.0100 | 1 |
| 8 | 0000.0000.1000 | 5 | 0000.0101 | 0 |
| 9 | 0000.0000.1001 | 6 | 0000.0110 | 0 |
| 10 | 0000.0000.1010 | 7 | 0000.0111 | 1 |
| 16 | 0000.0001.0000 | 8 | 0000.1000 | 0 |
| 17 | 0000.0001.0001 | 9 | 0000.1001 | 0 |
| 18 | 0000.0001.0010 | 10 | 0000.1010 | 0 |
| 20 | 0000.0001.0100 | 11 | 0000.1011 | 1 |
| 21 | 0000.0001.0101 | 12 | 0000.1100 | 2 |
| 32 | 0000.0010.0000 | 13 | 0000.1101 | 0 |
| 33 | 0000.0010.0001 | 14 | 0000.1110 | 0 |
| 34 | 0000.0010.0010 | 15 | 0000.1111 | 0 |
| 36 | 0000.0010.0100 | 16 | 0001.0000 | 0 |
| 37 | 0000.0010.0101 | 17 | 0001.0001 | 1 |
| 40 | 0000.0010.1000 | 18 | 0001.0010 | 1 |
| 41 | 0000.0010.1001 | 19 | 0001.0011 | 1 |
| 42 | 0000.0010.1010 | 20 | 0001.0100 | 2 |
| 64 | 0000.0100.0000 | 21 | 0001.0101 | 0 |
| 65 | 0000.0100.0001 | 22 | 0001.0110 | 0 |
| 66 | 0000.0100.0010 | 23 | 0001.0111 | 0 |
| 68 | 0000.0100.0100 | 24 | 0001.1000 | 0 |
| 69 | 0000.0100.0101 | 25 | 0001.1001 | 1 |
| 72 | 0000.0100.1000 | 26 | 0001.1010 | 0 |
| 73 | 0000.0100.1001 | 27 | 0001.1011 | 0 |
| 74 | 0000.0100.1010 | 28 | 0001.1100 | 1 |
| 80 | 0000.0101.0000 | 29 | 0001.1101 | 1 |
| 81 | 0000.0101.0001 | 30 | 0001.1110 | 1 |
| 82 | 0000.0101.0010 | 31 | 0001.1111 | 1 |
| 84 | 0000.0101.0100 | 32 | 0010.0000 | 2 |
| 85 | 0000.0101.0101 | 33 | 0010.0001 | 2 |
| 128 | 0000.1000.0000 | 34 | 0010.0010 | 0 |
| 129 | 0000.1000.0001 | 35 | 0010.0011 | 0 |
| 130 | 0000.1000.0010 | 36 | 0010.0100 | 0 |
| 132 | 0000.1000.0100 | 37 | 0010.0101 | 0 |
| 133 | 0000.1000.0101 | 38 | 0010.0110 | 1 |
| 136 | 0000.1000.1000 | 39 | 0010.0111 | 0 |
| 137 | 0000.1000.1001 | 40 | 0010.1000 | 0 |
| 138 | 0000.1000.1010 | 41 | 0010.1001 | 1 |
| 144 | 0000.1001.0000 | 42 | 0010.1010 | 0 |
| 145 | 0000.1001.0001 | 43 | 0010.1011 | 0 |
| 146 | 0000.1001.0010 | 44 | 0010.1100 | 0 |
| 148 | 0000.1001.0100 | 45 | 0010.1101 | 1 |
| 149 | 0000.1001.0101 | 46 | 0010.1110 | 2 |
| 160 | 0000.1010.0000 | 47 | 0010.1111 | 1 |
| 161 | 0000.1010.0001 | 48 | 0011.0000 | 1 |
| 162 | 0000.1010.0010 | 49 | 0011.0001 | 1 |
| 164 | 0000.1010.0100 | 50 | 0011.0010 | 1 |
| 165 | 0000.1010.0101 | 51 | 0011.0011 | 1 |
| 168 | 0000.1010.1000 | 52 | 0011.0100 | 2 |

FIG. 21

| | | | | |
|---|---|---|---|---|
| 169 | 0000.1010.1001 | 53 | 0011.0101 | 2 |
| 170 | 0000.1010.1010 | 54 | 0011.0110 | 2 |
| 256 | 0001.0000.0000 | 55 | 0011.0111 | 0 |
| 257 | 0001.0000.0001 | 56 | 0011.1000 | 0 |
| 258 | 0001.0000.0010 | 57 | 0011.1001 | 0 |
| 260 | 0001.0000.0100 | 58 | 0011.1010 | 0 |
| 261 | 0001.0000.0101 | 59 | 0011.1011 | 1 |
| 264 | 0001.0000.1000 | 60 | 0011.1100 | 0 |
| 265 | 0001.0000.1001 | 61 | 0011.1101 | 0 |
| 266 | 0001.0000.1010 | 62 | 0011.1110 | 1 |
| 272 | 0001.0001.0000 | 63 | 0011.1111 | 0 |
| 273 | 0001.0001.0001 | 64 | 0100.0000 | 0 |
| 274 | 0001.0001.0010 | 65 | 0100.0001 | 0 |
| 276 | 0001.0001.0100 | 66 | 0100.0010 | 1 |
| 277 | 0001.0001.0101 | 67 | 0100.0011 | 2 |
| 288 | 0001.0010.0000 | 68 | 0100.0100 | 0 |
| 289 | 0001.0010.0001 | 69 | 0100.0101 | 0 |
| 290 | 0001.0010.0010 | 70 | 0100.0110 | 0 |
| 292 | 0001.0010.0100 | 71 | 0100.0111 | 0 |
| 293 | 0001.0010.0101 | 72 | 0100.1000 | 1 |
| 296 | 0001.0010.1000 | 73 | 0100.1001 | 1 |
| 297 | 0001.0010.1001 | 74 | 0100.1010 | 1 |
| 298 | 0001.0010.1010 | 75 | 0100.1011 | 2 |
| 320 | 0001.0100.0000 | 76 | 0100.1100 | 1 |
| 321 | 0001.0100.0001 | 77 | 0100.1101 | 1 |
| 322 | 0001.0100.0010 | 78 | 0100.1110 | 1 |
| 324 | 0001.0100.0100 | 79 | 0100.1111 | 1 |
| 325 | 0001.0100.0101 | 80 | 0101.0000 | 1 |
| 328 | 0001.0100.1000 | 81 | 0101.0001 | 1 |
| 329 | 0001.0100.1001 | 82 | 0101.0010 | 1 |
| 330 | 0001.0100.1010 | 83 | 0101.0011 | 1 |
| 336 | 0001.0101.0000 | 84 | 0101.0100 | 2 |
| 337 | 0001.0101.0001 | 85 | 0101.0101 | 2 |
| 338 | 0001.0101.0010 | 86 | 0101.0110 | 2 |
| 340 | 0001.0101.0100 | 87 | 0101.0111 | 2 |
| 341 | 0001.0101.0101 | 88 | 0101.1000 | 2 |
| 512 | 0010.0000.0000 | 89 | 0101.1001 | 0 |
| 513 | 0010.0000.0001 | 90 | 0101.1010 | 0 |
| 514 | 0010.0000.0010 | 91 | 0101.1011 | 0 |
| 516 | 0010.0000.0100 | 92 | 0101.1100 | 0 |
| 517 | 0010.0000.0101 | 93 | 0101.1101 | 1 |
| 520 | 0010.0000.1000 | 94 | 0101.1110 | 0 |
| 521 | 0010.0000.1001 | 95 | 0101.1111 | 0 |
| 522 | 0010.0000.1010 | 96 | 0110.0000 | 1 |
| 528 | 0010.0001.0000 | 97 | 0110.0001 | 0 |
| 529 | 0010.0001.0001 | 98 | 0110.0010 | 0 |
| 530 | 0010.0001.0010 | 99 | 0110.0011 | 0 |
| 532 | 0010.0001.0100 | 100 | 0110.0100 | 1 |
| 533 | 0010.0001.0101 | 101 | 0110.0101 | 2 |
| 544 | 0010.0010.0000 | 102 | 0110.0110 | 0 |
| 545 | 0010.0010.0001 | 103 | 0110.0111 | 0 |
| 546 | 0010.0010.0010 | 104 | 0110.1000 | 0 |
| 548 | 0010.0010.0100 | 105 | 0110.1001 | 0 |
| 549 | 0010.0010.0101 | 106 | 0110.1010 | 1 |
| 552 | 0010.0010.1000 | 107 | 0110.1011 | 1 |
| 553 | 0010.0010.1001 | 108 | 0110.1100 | 1 |
| 554 | 0010.0010.1010 | 109 | 0110.1101 | 2 |
| 576 | 0010.0100.0000 | 110 | 0110.1110 | 0 |
| 577 | 0010.0100.0001 | 111 | 0110.1111 | 0 |

FIG. 22

| | | | | |
|---|---|---|---|---|
| 578 | 0010.0100.0010 | 112 | 0111.0000 | 0 |
| 580 | 0010.0100.0100 | 113 | 0111.0001 | 0 |
| 581 | 0010.0100.0101 | 114 | 0111.0010 | 1 |
| 584 | 0010.0100.1000 | 115 | 0111.0011 | 0 |
| 585 | 0010.0100.1001 | 116 | 0111.0100 | 0 |
| 586 | 0010.0100.1010 | 117 | 0111.0101 | 1 |
| 592 | 0010.0101.0000 | 118 | 0111.0110 | 1 |
| 593 | 0010.0101.0001 | 119 | 0111.0111 | 1 |
| 594 | 0010.0101.0010 | 120 | 0111.1000 | 1 |
| 596 | 0010.0101.0100 | 121 | 0111.1001 | 2 |
| 597 | 0010.0101.0101 | 122 | 0111.1010 | 2 |
| 640 | 0010.1000.0000 | 123 | 0111.1011 | 1 |
| 641 | 0010.1000.0001 | 124 | 0111.1100 | 1 |
| 642 | 0010.1000.0010 | 125 | 0111.1101 | 1 |
| 644 | 0010.1000.0100 | 126 | 0111.1110 | 1 |
| 645 | 0010.1000.0101 | 127 | 0111.1111 | 1 |
| 648 | 0010.1000.1000 | 128 | 1000.0000 | 1 |
| 649 | 0010.1000.1001 | 129 | 1000.0001 | 1 |
| 650 | 0010.1000.1010 | 130 | 1000.0010 | 1 |
| 656 | 0010.1001.0000 | 131 | 1000.0011 | 1 |
| 657 | 0010.1001.0001 | 132 | 1000.0100 | 1 |
| 658 | 0010.1001.0010 | 133 | 1000.0101 | 1 |
| 660 | 0010.1001.0100 | 134 | 1000.0110 | 1 |
| 661 | 0010.1001.0101 | 135 | 1000.0111 | 2 |
| 672 | 0010.1010.0000 | 136 | 1000.1000 | 2 |
| 673 | 0010.1010.0001 | 137 | 1000.1001 | 2 |
| 674 | 0010.1010.0010 | 138 | 1000.1010 | 2 |
| 676 | 0010.1010.0100 | 139 | 1000.1011 | 2 |
| 677 | 0010.1010.0101 | 140 | 1000.1100 | 2 |
| 680 | 0010.1010.1000 | 141 | 1000.1101 | 2 |
| 681 | 0010.1010.1001 | 142 | 1000.1110 | 2 |
| 682 | 0010.1010.1010 | 143 | 1000.1111 | 2 |
| 1024 | 0100.0000.0000 | 144 | 1001.0000 | 0 |
| 1025 | 0100.0000.0001 | 145 | 1001.0001 | 0 |
| 1026 | 0100.0000.0010 | 146 | 1001.0010 | 0 |
| 1028 | 0100.0000.0100 | 147 | 1001.0011 | 0 |
| 1029 | 0100.0000.0101 | 148 | 1001.0100 | 1 |
| 1032 | 0100.0000.1000 | 149 | 1001.0101 | 0 |
| 1033 | 0100.0000.1001 | 150 | 1001.0110 | 0 |
| 1034 | 0100.0000.1010 | 151 | 1001.0111 | 1 |
| 1040 | 0100.0001.0000 | 152 | 1001.1000 | 0 |
| 1041 | 0100.0001.0001 | 153 | 1001.1001 | 0 |
| 1042 | 0100.0001.0010 | 154 | 1001.1010 | 0 |
| 1044 | 0100.0001.0100 | 155 | 1001.1011 | 1 |
| 1045 | 0100.0001.0101 | 156 | 1001.1100 | 2 |
| 1056 | 0100.0010.0000 | 157 | 1001.1101 | 0 |
| 1057 | 0100.0010.0001 | 158 | 1001.1110 | 0 |
| 1058 | 0100.0010.0010 | 159 | 1001.1111 | 0 |
| 1060 | 0100.0010.0100 | 160 | 1010.0000 | 0 |
| 1061 | 0100.0010.0101 | 161 | 1010.0001 | 1 |
| 1064 | 0100.0010.1000 | 162 | 1010.0010 | 1 |
| 1065 | 0100.0010.1001 | 163 | 1010.0011 | 1 |
| 1066 | 0100.0010.1010 | 164 | 1010.0100 | 2 |
| 1088 | 0100.0100.0000 | 165 | 1010.0101 | 0 |
| 1089 | 0100.0100.0001 | 166 | 1010.0110 | 0 |
| 1090 | 0100.0100.0010 | 167 | 1010.0111 | 0 |
| 1092 | 0100.0100.0100 | 168 | 1010.1000 | 0 |
| 1093 | 0100.0100.0101 | 169 | 1010.1001 | 1 |
| 1096 | 0100.0100.1000 | 170 | 1010.1010 | 0 |

FIG. 23

| 1097 | 0100.0100.1001 | 171 | 1010.1011 | 0 |
|---|---|---|---|---|
| 1098 | 0100.0100.1010 | 172 | 1010.1100 | 1 |
| 1104 | 0100.0101.0000 | 173 | 1010.1101 | 1 |
| 1105 | 0100.0101.0001 | 174 | 1010.1110 | 1 |
| 1106 | 0100.0101.0010 | 175 | 1010.1111 | 1 |
| 1108 | 0100.0101.0100 | 176 | 1011.0000 | 2 |
| 1109 | 0100.0101.0101 | 177 | 1011.0001 | 2 |
| 1152 | 0100.1000.0000 | 178 | 1011.0010 | 0 |
| 1153 | 0100.1000.0001 | 179 | 1011.0011 | 0 |
| 1154 | 0100.1000.0010 | 180 | 1011.0100 | 0 |
| 1156 | 0100.1000.0100 | 181 | 1011.0101 | 0 |
| 1157 | 0100.1000.0101 | 182 | 1011.0110 | 1 |
| 1160 | 0100.1000.1000 | 183 | 1011.0111 | 0 |
| 1161 | 0100.1000.1001 | 184 | 1011.1000 | 0 |
| 1162 | 0100.1000.1010 | 185 | 1011.1001 | 1 |
| 1168 | 0100.1001.0000 | 186 | 1011.1010 | 0 |
| 1169 | 0100.1001.0001 | 187 | 1011.1011 | 0 |
| 1170 | 0100.1001.0010 | 188 | 1011.1100 | 0 |
| 1172 | 0100.1001.0100 | 189 | 1011.1101 | 1 |
| 1173 | 0100.1001.0101 | 190 | 1011.1110 | 2 |
| 1184 | 0100.1010.0000 | 191 | 1011.1111 | 1 |
| 1185 | 0100.1010.0001 | 192 | 1100.0000 | 1 |
| 1186 | 0100.1010.0010 | 193 | 1100.0001 | 1 |
| 1188 | 0100.1010.0100 | 194 | 1100.0010 | 1 |
| 1189 | 0100.1010.0101 | 195 | 1100.0011 | 1 |
| 1192 | 0100.1010.1000 | 196 | 1100.0100 | 2 |
| 1193 | 0100.1010.1001 | 197 | 1100.0101 | 2 |
| 1194 | 0100.1010.1010 | 198 | 1100.0110 | 2 |
| 1280 | 0101.0000.0000 | 199 | 1100.0111 | 1 |
| 1281 | 0101.0000.0001 | 200 | 1100.1000 | 1 |
| 1282 | 0101.0000.0010 | 201 | 1100.1001 | 1 |
| 1284 | 0101.0000.0100 | 202 | 1100.1010 | 1 |
| 1285 | 0101.0000.0101 | 203 | 1100.1011 | 1 |
| 1288 | 0101.0000.1000 | 204 | 1100.1100 | 1 |
| 1289 | 0101.0000.1001 | 205 | 1100.1101 | 1 |
| 1290 | 0101.0000.1010 | 206 | 1100.1110 | 1 |
| 1296 | 0101.0001.0000 | 207 | 1100.1111 | 1. |
| 1297 | 0101.0001.0001 | 208 | 1101.0000 | 1 |
| 1298 | 0101.0001.0010 | 209 | 1101.0001 | 1 |
| 1300 | 0101.0001.0100 | 210 | 1101.0010 | 1 |
| 1301 | 0101.0001.0101 | 211 | 1101.0011 | 2 |
| 1312 | 0101.0010.0000 | 212 | 1101.0100 | 1 |
| 1313 | 0101.0010.0001 | 213 | 1101.0101 | 1 |
| 1314 | 0101.0010.0010 | 214 | 1101.0110 | 1 |
| 1316 | 0101.0010.0100 | 215 | 1101.0111 | 1 |
| 1317 | 0101.0010.0101 | 216 | 1101.1000 | 1 |
| 1320 | 0101.0010.1000 | 217 | 1101.1001 | 1 |
| 1321 | 0101.0010.1001 | 218 | 1101.1010 | 1 |
| 1322 | 0101.0010.1010 | 219 | 1101.1011 | 2 |
| 1344 | 0101.0100.0000 | 220 | 1101.1100 | 2 |
| 1345 | 0101.0100.0001 | 221 | 1101.1101 | 2 |
| 1346 | 0101.0100.0010 | 222 | 1101.1110 | 2 |
| 1348 | 0101.0100.0100 | 223 | 1101.1111 | 2 |
| 1349 | 0101.0100.0101 | 224 | 1110.0000 | 2 |
| 1352 | 0101.0100.1000 | 225 | 1110.0001 | 2 |
| 1353 | 0101.0100.1001 | 226 | 1110.0010 | 2 |
| 1354 | 0101.0100.1010 | 227 | 1110.0011 | 2 |
| 1360 | 0101.0101.0000 | 228 | 1110.0100 | 2 |
| 1361 | 0101.0101.0001 | 229 | 1110.0101 | 2 |

FIG. 24

| BEFORE CONVERSION | | AFTER CONVERSION | | RISK |
|---|---|---|---|---|
| 1362 | 0101.0101.0010 | 230 | 1110.0110 | 2 |
| 1364 | 0101.0101.0100 | 231 | 1110.0111 | 2 |
| 1365 | 0101.0101.0101 | 232 | 1110.1000 | 2 |
| 2048 | 1000.0000.0000 | 233 | 1110.1001 | 0 |
| 2049 | 1000.0000.0001 | 234 | 1110.1010 | 0 |
| 2050 | 1000.0000.0010 | 235 | 1110.1011 | 0 |
| 2052 | 1000.0000.0100 | 236 | 1110.1100 | 0 |
| 2053 | 1000.0000.0101 | 237 | 1110.1101 | 1 |
| 2056 | 1000.0000.1000 | 238 | 1110.1110 | 0 |
| 2057 | 1000.0000.1001 | 239 | 1110.1111 | 0 |
| 2058 | 1000.0000.1010 | 240 | 1111.0000 | 1 |
| 2064 | 1000.0001.0000 | 241 | 1111.0001 | 0 |
| 2065 | 1000.0001.0001 | 242 | 1111.0010 | 0 |
| 2066 | 1000.0001.0010 | 243 | 1111.0011 | 0 |
| 2068 | 1000.0001.0100 | 244 | 1111.0100 | 1 |
| 2069 | 1000.0001.0101 | 245 | 1111.0101 | 2 |
| 2080 | 1000.0010.0000 | 246 | 1111.0110 | 0 |
| 2081 | 1000.0010.0001 | 247 | 1111.0111 | 0 |
| 2082 | 1000.0010.0010 | 248 | 1111.1000 | 0 |
| 2084 | 1000.0010.0100 | 249 | 1111.1001 | 0 |
| 2085 | 1000.0010.0101 | 250 | 1111.1010 | 1 |
| 2088 | 1000.0010.1000 | 251 | 1111.1011 | 1 |
| 2089 | 1000.0010.1001 | 252 | 1111.1100 | 1 |
| 2090 | 1000.0010.1010 | 253 | 1111.1101 | 2 |
| 2112 | 1000.0100.0000 | 254 | 1111.1110 | 0 |
| 2113 | 1000.0100.0001 | 255 | 1111.1111 | 0 |

| BEFORE CONVERSION | | AFTER CONVERSION | | RISK |
|---|---|---|---|---|
| 2114 | 1000.0100.0010 | 256 | SPARE BIT | 0 |
| 2116 | 1000.0100.0100 | 257 | SPARE BIT | 0 |
| 2117 | 1000.0100.0101 | 258 | SPARE BIT | 1 |
| 2120 | 1000.0100.1000 | 259 | SPARE BIT | 0 |
| 2121 | 1000.0100.1001 | 260 | SPARE BIT | 0 |
| 2122 | 1000.0100.1010 | 261 | SPARE BIT | 1 |
| 2128 | 1000.0101.0000 | 262 | SPARE BIT | 1 |
| 2129 | 1000.0101.0001 | 263 | SPARE BIT | 1 |
| 2130 | 1000.0101.0010 | 264 | SPARE BIT | 1 |
| 2132 | 1000.0101.0100 | 265 | SPARE BIT | 2 |
| 2133 | 1000.0101.0101 | 266 | SPARE BIT | 2 |
| 2176 | 1000.1000.0000 | 267 | SPARE BIT | 0 |
| 2177 | 1000.1000.0001 | 268 | SPARE BIT | 0 |
| 2178 | 1000.1000.0010 | 269 | SPARE BIT | 0 |
| 2180 | 1000.1000.0100 | 270 | SPARE BIT | 0 |
| 2181 | 1000.1000.0101 | 271 | SPARE BIT | 1 |
| 2184 | 1000.1000.1000 | 272 | SPARE BIT | 0 |
| 2185 | 1000.1000.1001 | 273 | SPARE BIT | 0 |
| 2186 | 1000.1000.1010 | 274 | SPARE BIT | 1 |
| 2192 | 1000.1001.0000 | 275 | SPARE BIT | 0 |
| 2193 | 1000.1001.0001 | 276 | SPARE BIT | 0 |
| 2194 | 1000.1001.0010 | 277 | SPARE BIT | 0 |
| 2196 | 1000.1001.0100 | 278 | SPARE BIT | 1 |
| 2197 | 1000.1001.0101 | 279 | SPARE BIT | 2 |
| 2208 | 1000.1010.0000 | 280 | SPARE BIT | 1 |
| 2209 | 1000.1010.0001 | 281 | SPARE BIT | 1 |
| 2210 | 1000.1010.0010 | 282 | SPARE BIT | 1 |
| 2212 | 1000.1010.0100 | 283 | SPARE BIT | 1 |
| 2213 | 1000.1010.0101 | 284 | SPARE BIT | 1 |
| 2216 | 1000.1010.1000 | 285 | SPARE BIT | 2 |
| 2217 | 1000.1010.1001 | 286 | SPARE BIT | 2 |

FIG. 25

| | | | | |
|---|---|---|---|---|
| 2218 | 1000.1010.1010 | 287 | SPARE BIT | 2 |
| 2304 | 1001.0000.0000 | 288 | SPARE BIT | 0 |
| 2305 | 1001.0000.0001 | 289 | SPARE BIT | 0 |
| 2306 | 1001.0000.0010 | 290 | SPARE BIT | 0 |
| 2308 | 1001.0000.0100 | 291 | SPARE BIT | 0 |
| 2309 | 1001.0000.0101 | 292 | SPARE BIT | 1 |
| 2312 | 1001.0000.1000 | 293 | SPARE BIT | 0 |
| 2313 | 1001.0000.1001 | 294 | SPARE BIT | 0 |
| 2314 | 1001.0000.1010 | 295 | SPARE BIT | 1 |
| 2320 | 1001.0001.0000 | 296 | SPARE BIT | 0 |
| 2321 | 1001.0001.0001 | 297 | SPARE BIT | 0 |
| 2322 | 1001.0001.0010 | 298 | SPARE BIT | 0 |
| 2324 | 1001.0001.0100 | 299 | SPARE BIT | 1 |
| 2325 | 1001.0001.0101 | 300 | SPARE BIT | 2 |
| 2336 | 1001.0010.0000 | 301 | SPARE BIT | 0 |
| 2337 | 1001.0010.0001 | 302 | SPARE BIT | 0 |
| 2338 | 1001.0010.0010 | 303 | SPARE BIT | 0 |
| 2340 | 1001.0010.0100 | 304 | SPARE BIT | 0 |
| 2341 | 1001.0010.0101 | 305 | SPARE BIT | 1 |
| 2344 | 1001.0010.1000 | 306 | SPARE BIT | 1 |
| 2345 | 1001.0010.1001 | 307 | SPARE BIT | 1 |
| 2346 | 1001.0010.1010 | 308 | SPARE BIT | 2 |
| 2368 | 1001.0100.0000 | 309 | SPARE BIT | 1 |
| 2369 | 1001.0100.0001 | 310 | SPARE BIT | 1 |
| 2370 | 1001.0100.0010 | 311 | SPARE BIT | 1 |
| 2372 | 1001.0100.0100 | 312 | SPARE BIT | 1 |
| 2373 | 1001.0100.0101 | 313 | SPARE BIT | 1 |
| 2376 | 1001.0100.1000 | 314 | SPARE BIT | 1 |
| 2377 | 1001.0100.1001 | 315 | SPARE BIT | 1 |
| 2378 | 1001.0100.1010 | 316 | SPARE BIT | 1 |
| 2384 | 1001.0101.0000 | 317 | SPARE BIT | 2 |
| 2385 | 1001.0101.0001 | 318 | SPARE BIT | 2 |
| 2386 | 1001.0101.0010 | 319 | SPARE BIT | 2 |
| 2388 | 1001.0101.0100 | 320 | SPARE BIT | 2 |
| 2389 | 1001.0101.0101 | 321 | SPARE BIT | 2 |
| 2560 | 1010.0000.0000 | 322 | SPARE BIT | 1 |
| 2561 | 1010.0000.0001 | 323 | SPARE BIT | 1 |
| 2562 | 1010.0000.0010 | 324 | SPARE BIT | 1 |
| 2564 | 1010.0000.0100 | 325 | SPARE BIT | 1 |
| 2565 | 1010.0000.0101 | 326 | SPARE BIT | 1 |
| 2568 | 1010.0000.1000 | 327 | SPARE BIT | 1 |
| 2569 | 1010.0000.1001 | 328 | SPARE BIT | 1 |
| 2570 | 1010.0000.1010 | 329 | SPARE BIT | 1 |
| 2576 | 1010.0001.0000 | 330 | SPARE BIT | 1 |
| 2577 | 1010.0001.0001 | 331 | SPARE BIT | 1 |
| 2578 | 1010.0001.0010 | 332 | SPARE BIT | 1 |
| 2580 | 1010.0001.0100 | 333 | SPARE BIT | 1 |
| 2581 | 1010.0001.0101 | 334 | SPARE BIT | 2 |
| 2592 | 1010.0010.0000 | 335 | SPARE BIT | 1 |
| 2593 | 1010.0010.0001 | 336 | SPARE BIT | 1 |
| 2594 | 1010.0010.0010 | 337 | SPARE BIT | 1 |
| 2596 | 1010.0010.0100 | 338 | SPARE BIT | 1 |
| 2597 | 1010.0010.0101 | 339 | SPARE BIT | 1 |
| 2600 | 1010.0010.1000 | 340 | SPARE BIT | 1 |
| 2601 | 1010.0010.1001 | 341 | SPARE BIT | 1 |
| 2602 | 1010.0010.1010 | 342 | SPARE BIT | 2 |
| 2624 | 1010.0100.0000 | 343 | SPARE BIT | 1 |
| 2625 | 1010.0100.0001 | 344 | SPARE BIT | 1 |
| 2626 | 1010.0100.0010 | 345 | SPARE BIT | 1 |

FIG. 26

| 2628 | 1010.0100.0100 | 346 | SPARE BIT | 1 |
|---|---|---|---|---|
| 2629 | 1010.0100.0101 | 347 | SPARE BIT | 1 |
| 2632 | 1010.0100.1000 | 348 | SPARE BIT | 1 |
| 2633 | 1010.0100.1001 | 349 | SPARE BIT | 1 |
| 2634 | 1010.0100.1010 | 350 | SPARE BIT | 1 |
| 2640 | 1010.0101.0000 | 351 | SPARE BIT | 1 |
| 2641 | 1010.0101.0001 | 352 | SPARE BIT | 1 |
| 2642 | 1010.0101.0010 | 353 | SPARE BIT | 1 |
| 2644 | 1010.0101.0100 | 354 | SPARE BIT | 2 |
| 2645 | 1010.0101.0101 | 355 | SPARE BIT | 2 |
| 2688 | 1010.1000.0000 | 356 | SPARE BIT | 2 |
| 2689 | 1010.1000.0001 | 357 | SPARE BIT | 2 |
| 2690 | 1010.1000.0010 | 358 | SPARE BIT | 2 |
| 2692 | 1010.1000.0100 | 359 | SPARE BIT | 2 |
| 2693 | 1010.1000.0101 | 360 | SPARE BIT | 2 |
| 2696 | 1010.1000.1000 | 361 | SPARE BIT | 2 |
| 2697 | 1010.1000.1001 | 362 | SPARE BIT | 2 |
| 2698 | 1010.1000.1010 | 363 | SPARE BIT | 2 |
| 2704 | 1010.1001.0000 | 364 | SPARE BIT | 2 |
| 2705 | 1010.1001.0001 | 365 | SPARE BIT | 2 |
| 2706 | 1010.1001.0010 | 366 | SPARE BIT | 2 |
| 2708 | 1010.1001.0100 | 367 | SPARE BIT | 2 |
| 2709 | 1010.1001.0101 | 368 | SPARE BIT | 2 |
| 2720 | 1010.1010.0000 | 369 | SPARE BIT | 2 |
| 2721 | 1010.1010.0001 | 370 | SPARE BIT | 2 |
| 2722 | 1010.1010.0010 | 371 | SPARE BIT | 2 |
| 2724 | 1010.1010.0100 | 372 | SPARE BIT | 2 |
| 2725 | 1010.1010.0101 | 373 | SPARE BIT | 2 |
| 2728 | 1010.1010.1000 | 374 | SPARE BIT | 2 |
| 2729 | 1010.1010.1001 | 375 | SPARE BIT | 2 |
| 2730 | 1010.1010.1010 | 376 | SPARE BIT | 2 |

FIG. 27

| BEFORE CONVERSION | | AFTER CONVERSION | | RISK |
|---|---|---|---|---|
| TRIMMING VALUE (DECIMAL) | TRIMMING PATTERN (BINARY) | TRIMMING SIGNAL | | |
| | | DECIMAL | BINARY | |
| 0 | 000.0000.0000 | 0 | 0000.0000 | 0 |
| 1 | 000.0000.0001 | 1 | 0000.0001 | 0 |
| 2 | 000.0000.0010 | 2 | 0000.0010 | 0 |
| 4 | 000.0000.0100 | 3 | 0000.0011 | 0 |
| 5 | 000.0000.0101 | 4 | 0000.0100 | 1 |
| 8 | 000.0000.1000 | 5 | 0000.0101 | 0 |
| 9 | 000.0000.1001 | 6 | 0000.0110 | 0 |
| 10 | 000.0000.1010 | 7 | 0000.0111 | 1 |
| 16 | 000.0001.0000 | 8 | 0000.1000 | 0 |
| 17 | 000.0001.0001 | 9 | 0000.1001 | 0 |
| 18 | 000.0001.0010 | 10 | 0000.1010 | 0 |
| 20 | 000.0001.0100 | 11 | 0000.1011 | 1 |
| 21 | 000.0001.0101 | 12 | 0000.1100 | 2 |
| 32 | 000.0010.0000 | 13 | 0000.1101 | 0 |
| 33 | 000.0010.0001 | 14 | 0000.1110 | 0 |
| 34 | 000.0010.0010 | 15 | 0000.1111 | 0 |
| 36 | 000.0010.0100 | 16 | 0001.0000 | 0 |
| 37 | 000.0010.0101 | 17 | 0001.0001 | 1 |
| 40 | 000.0010.1000 | 18 | 0001.0010 | 1 |
| 41 | 000.0010.1001 | 19 | 0001.0011 | 1 |
| 42 | 000.0010.1010 | 20 | 0001.0100 | 2 |
| 64 | 000.0100.0000 | 21 | 0001.0101 | 0 |
| 65 | 000.0100.0001 | 22 | 0001.0110 | 0 |
| 66 | 000.0100.0010 | 23 | 0001.0111 | 0 |
| 68 | 000.0100.0100 | 24 | 0001.1000 | 0 |
| 69 | 000.0100.0101 | 25 | 0001.1001 | 1 |
| 72 | 000.0100.1000 | 26 | 0001.1010 | 0 |
| 73 | 000.0100.1001 | 27 | 0001.1011 | 0 |
| 74 | 000.0100.1010 | 28 | 0001.1100 | 1 |
| 80 | 000.0101.0000 | 29 | 0001.1101 | 1 |
| 81 | 000.0101.0001 | 30 | 0001.1110 | 1 |
| 82 | 000.0101.0010 | 31 | 0001.1111 | 1 |
| 84 | 000.0101.0100 | 32 | 0010.0000 | 2 |
| 85 | 000.0101.0101 | 33 | 0010.0001 | 2 |
| 128 | 000.1000.0000 | 34 | 0010.0010 | 0 |
| 129 | 000.1000.0001 | 35 | 0010.0011 | 0 |
| 130 | 000.1000.0010 | 36 | 0010.0100 | 0 |
| 132 | 000.1000.0100 | 37 | 0010.0101 | 0 |
| 133 | 000.1000.0101 | 38 | 0010.0110 | 1 |
| 136 | 000.1000.1000 | 39 | 0010.0111 | 0 |
| 137 | 000.1000.1001 | 40 | 0010.1000 | 0 |
| 138 | 000.1000.1010 | 41 | 0010.1001 | 1 |
| 144 | 000.1001.0000 | 42 | 0010.1010 | 0 |
| 145 | 000.1001.0001 | 43 | 0010.1011 | 0 |
| 146 | 000.1001.0010 | 44 | 0010.1100 | 0 |
| 148 | 000.1001.0100 | 45 | 0010.1101 | 1 |
| 149 | 000.1001.0101 | 46 | 0010.1110 | 2 |
| 160 | 000.1010.0000 | 47 | 0010.1111 | 1 |
| 161 | 000.1010.0001 | 48 | 0011.0000 | 1 |
| 162 | 000.1010.0010 | 49 | 0011.0001 | 1 |
| 164 | 000.1010.0100 | 50 | 0011.0010 | 1 |
| 165 | 000.1010.0101 | 51 | 0011.0011 | 1 |
| 168 | 000.1010.1000 | 52 | 0011.0100 | 2 |
| 169 | 000.1010.1001 | 53 | 0011.0101 | 2 |
| 170 | 000.1010.1010 | 54 | 0011.0110 | 2 |
| 256 | 001.0000.0000 | 55 | 0011.0111 | 0 |

FIG. 28

| | | | | |
|---|---|---|---|---|
| 257 | 001.0000.0001 | 56 | 0011.1000 | 0 |
| 258 | 001.0000.0010 | 57 | 0011.1001 | 0 |
| 260 | 001.0000.0100 | 58 | 0011.1010 | 0 |
| 261 | 001.0000.0101 | 59 | 0011.1011 | 1 |
| 264 | 001.0000.1000 | 60 | 0011.1100 | 0 |
| 265 | 001.0000.1001 | 61 | 0011.1101 | 0 |
| 266 | 001.0000.1010 | 62 | 0011.1110 | 1 |
| 272 | 001.0001.0000 | 63 | 0011.1111 | 0 |
| 273 | 001.0001.0001 | 64 | 0100.0000 | 0 |
| 274 | 001.0001.0010 | 65 | 0100.0001 | 0 |
| 276 | 001.0001.0100 | 66 | 0100.0010 | 1 |
| 277 | 001.0001.0101 | 67 | 0100.0011 | 2 |
| 288 | 001.0010.0000 | 68 | 0100.0100 | 0 |
| 289 | 001.0010.0001 | 69 | 0100.0101 | 0 |
| 290 | 001.0010.0010 | 70 | 0100.0110 | 0 |
| 292 | 001.0010.0100 | 71 | 0100.0111 | 0 |
| 293 | 001.0010.0101 | 72 | 0100.1000 | 1 |
| 296 | 001.0010.1000 | 73 | 0100.1001 | 1 |
| 297 | 001.0010.1001 | 74 | 0100.1010 | 1 |
| 298 | 001.0010.1010 | 75 | 0100.1011 | 2 |
| 320 | 001.0100.0000 | 76 | 0100.1100 | 1 |
| 321 | 001.0100.0001 | 77 | 0100.1101 | 1 |
| 322 | 001.0100.0010 | 78 | 0100.1110 | 1 |
| 324 | 001.0100.0100 | 79 | 0100.1111 | 1 |
| 325 | 001.0100.0101 | 80 | 0101.0000 | 1 |
| 328 | 001.0100.1000 | 81 | 0101.0001 | 1 |
| 329 | 001.0100.1001 | 82 | 0101.0010 | 1 |
| 330 | 001.0100.1010 | 83 | 0101.0011 | 1 |
| 336 | 001.0101.0000 | 84 | 0101.0100 | 2 |
| 337 | 001.0101.0001 | 85 | 0101.0101 | 2 |
| 338 | 001.0101.0010 | 86 | 0101.0110 | 2 |
| 340 | 001.0101.0100 | 87 | 0101.0111 | 2 |
| 341 | 001.0101.0101 | 88 | 0101.1000 | 2 |
| 512 | 010.0000.0000 | 89 | 0101.1001 | 0 |
| 513 | 010.0000.0001 | 90 | 0101.1010 | 0 |
| 514 | 010.0000.0010 | 91 | 0101.1011 | 0 |
| 516 | 010.0000.0100 | 92 | 0101.1100 | 0 |
| 517 | 010.0000.0101 | 93 | 0101.1101 | 1 |
| 520 | 010.0000.1000 | 94 | 0101.1110 | 0 |
| 521 | 010.0000.1001 | 95 | 0101.1111 | 0 |
| 522 | 010.0000.1010 | 96 | 0110.0000 | 1 |
| 528 | 010.0001.0000 | 97 | 0110.0001 | 0 |
| 529 | 010.0001.0001 | 98 | 0110.0010 | 0 |
| 530 | 010.0001.0010 | 99 | 0110.0011 | 0 |
| 532 | 010.0001.0100 | 100 | 0110.0100 | 1 |
| 533 | 010.0001.0101 | 101 | 0110.0101 | 2 |
| 544 | 010.0010.0000 | 102 | 0110.0110 | 0 |
| 545 | 010.0010.0001 | 103 | 0110.0111 | 0 |
| 546 | 010.0010.0010 | 104 | 0110.1000 | 0 |
| 548 | 010.0010.0100 | 105 | 0110.1001 | 0 |
| 549 | 010.0010.0101 | 106 | 0110.1010 | 1 |
| 552 | 010.0010.1000 | 107 | 0110.1011 | 1 |
| 553 | 010.0010.1001 | 108 | 0110.1100 | 1 |
| 554 | 010.0010.1010 | 109 | 0110.1101 | 2 |
| 576 | 010.0100.0000 | 110 | 0110.1110 | 0 |
| 577 | 010.0100.0001 | 111 | 0110.1111 | 0 |
| 578 | 010.0100.0010 | 112 | 0111.0000 | 0 |
| 580 | 010.0100.0100 | 113 | 0111.0001 | 0 |
| 581 | 010.0100.0101 | 114 | 0111.0010 | 1 |

FIG. 29

| | | | | |
|---|---|---|---|---|
| 584 | 010.0100.1000 | 115 | 0111.0011 | 0 |
| 585 | 010.0100.1001 | 116 | 0111.0100 | 0 |
| 586 | 010.0100.1010 | 117 | 0111.0101 | 1 |
| 592 | 010.0101.0000 | 118 | 0111.0110 | 1 |
| 593 | 010.0101.0001 | 119 | 0111.0111 | 1 |
| 594 | 010.0101.0010 | 120 | 0111.1000 | 1 |
| 596 | 010.0101.0100 | 121 | 0111.1001 | 2 |
| 597 | 010.0101.0101 | 122 | 0111.1010 | 2 |
| 640 | 010.1000.0000 | 123 | 0111.1011 | 1 |
| 641 | 010.1000.0001 | 124 | 0111.1100 | 1 |
| 642 | 010.1000.0010 | 125 | 0111.1101 | 1 |
| 644 | 010.1000.0100 | 126 | 0111.1110 | 1 |
| 645 | 010.1000.0101 | 127 | 0111.1111 | 1 |
| 648 | 010.1000.1000 | 128 | 1000.0000 | 1 |
| 649 | 010.1000.1001 | 129 | 1000.0001 | 1 |
| 650 | 010.1000.1010 | 130 | 1000.0010 | 1 |
| 656 | 010.1001.0000 | 131 | 1000.0011 | 1 |
| 657 | 010.1001.0001 | 132 | 1000.0100 | 1 |
| 658 | 010.1001.0010 | 133 | 1000.0101 | 1 |
| 660 | 010.1001.0100 | 134 | 1000.0110 | 1 |
| 661 | 010.1001.0101 | 135 | 1000.0111 | 2 |
| 672 | 010.1010.0000 | 136 | 1000.1000 | 2 |
| 673 | 010.1010.0001 | 137 | 1000.1001 | 2 |
| 674 | 010.1010.0010 | 138 | 1000.1010 | 2 |
| 676 | 010.1010.0100 | 139 | 1000.1011 | 2 |
| 677 | 010.1010.0101 | 140 | 1000.1100 | 2 |
| 680 | 010.1010.1000 | 141 | 1000.1101 | 2 |
| 681 | 010.1010.1001 | 142 | 1000.1110 | 2 |
| 682 | 010.1010.1010 | 143 | 1000.1111 | 2 |
| 1024 | 100.0000.0000 | 144 | 1001.0000 | 0 |
| 1025 | 100.0000.0001 | 145 | 1001.0001 | 0 |
| 1026 | 100.0000.0010 | 146 | 1001.0010 | 0 |
| 1028 | 100.0000.0100 | 147 | 1001.0011 | 0 |
| 1029 | 100.0000.0101 | 148 | 1001.0100 | 1 |
| 1032 | 100.0000.1000 | 149 | 1001.0101 | 0 |
| 1033 | 100.0000.1001 | 150 | 1001.0110 | 0 |
| 1034 | 100.0000.1010 | 151 | 1001.0111 | 1 |
| 1040 | 100.0001.0000 | 152 | 1001.1000 | 0 |
| 1041 | 100.0001.0001 | 153 | 1001.1001 | 0 |
| 1042 | 100.0001.0010 | 154 | 1001.1010 | 0 |
| 1044 | 100.0001.0100 | 155 | 1001.1011 | 1 |
| 1045 | 100.0001.0101 | 156 | 1001.1100 | 2 |
| 1056 | 100.0010.0000 | 157 | 1001.1101 | 0 |
| 1057 | 100.0010.0001 | 158 | 1001.1110 | 0 |
| 1058 | 100.0010.0010 | 159 | 1001.1111 | 0 |
| 1060 | 100.0010.0100 | 160 | 1010.0000 | 0 |
| 1061 | 100.0010.0101 | 161 | 1010.0001 | 1 |
| 1064 | 100.0010.1000 | 162 | 1010.0010 | 1 |
| 1065 | 100.0010.1001 | 163 | 1010.0011 | 1 |
| 1066 | 100.0010.1010 | 164 | 1010.0100 | 2 |
| 1088 | 100.0100.0000 | 165 | 1010.0101 | 0 |
| 1089 | 100.0100.0001 | 166 | 1010.0110 | 0 |
| 1090 | 100.0100.0010 | 167 | 1010.0111 | 0 |
| 1092 | 100.0100.0100 | 168 | 1010.1000 | 0 |
| 1093 | 100.0100.0101 | 169 | 1010.1001 | 1 |
| 1096 | 100.0100.1000 | 170 | 1010.1010 | 0 |
| 1097 | 100.0100.1001 | 171 | 1010.1011 | 0 |
| 1098 | 100.0100.1010 | 172 | 1010.1100 | 1 |
| 1104 | 100.0101.0000 | 173 | 1010.1101 | 1 |

FIG. 30

| | | | | |
|---|---|---|---|---|
| 1105 | 100.0101.0001 | 174 | 1010.1110 | 1 |
| 1106 | 100.0101.0010 | 175 | 1010.1111 | 1 |
| 1108 | 100.0101.0100 | 176 | 1011.0000 | 2 |
| 1109 | 100.0101.0101 | 177 | 1011.0001 | 2 |
| 1152 | 100.1000.0000 | 178 | 1011.0010 | 0 |
| 1153 | 100.1000.0001 | 179 | 1011.0011 | 0 |
| 1154 | 100.1000.0010 | 180 | 1011.0100 | 0 |
| 1156 | 100.1000.0100 | 181 | 1011.0101 | 0 |
| 1157 | 100.1000.0101 | 182 | 1011.0110 | 1 |
| 1160 | 100.1000.1000 | 183 | 1011.0111 | 0 |
| 1161 | 100.1000.1001 | 184 | 1011.1000 | 0 |
| 1162 | 100.1000.1010 | 185 | 1011.1001 | 1 |
| 1168 | 100.1001.0000 | 186 | 1011.1010 | 0 |
| 1169 | 100.1001.0001 | 187 | 1011.1011 | 0 |
| 1170 | 100.1001.0010 | 188 | 1011.1100 | 0 |
| 1172 | 100.1001.0100 | 189 | 1011.1101 | 1 |
| 1173 | 100.1001.0101 | 190 | 1011.1110 | 2 |
| 1184 | 100.1010.0000 | 191 | 1011.1111 | 1 |
| 1185 | 100.1010.0001 | 192 | 1100.0000 | 1 |
| 1186 | 100.1010.0010 | 193 | 1100.0001 | 1 |
| 1188 | 100.1010.0100 | 194 | 1100.0010 | 1 |
| 1189 | 100.1010.0101 | 195 | 1100.0011 | 1 |
| 1192 | 100.1010.1000 | 196 | 1100.0100 | 2 |
| 1193 | 100.1010.1001 | 197 | 1100.0101 | 2 |
| 1194 | 100.1010.1010 | 198 | 1100.0110 | 2 |
| 1280 | 101.0000.0000 | 199 | 1100.0111 | 1 |
| 1281 | 101.0000.0001 | 200 | 1100.1000 | 1 |
| 1282 | 101.0000.0010 | 201 | 1100.1001 | 1 |
| 1284 | 101.0000.0100 | 202 | 1100.1010 | 1 |
| 1285 | 101.0000.0101 | 203 | 1100.1011 | 1 |
| 1288 | 101.0000.1000 | 204 | 1100.1100 | 1 |
| 1289 | 101.0000.1001 | 205 | 1100.1101 | 1 |
| 1290 | 101.0000.1010 | 206 | 1100.1110 | 1 |
| 1296 | 101.0001.0000 | 207 | 1100.1111 | 1 |
| 1297 | 101.0001.0001 | 208 | 1101.0000 | 1 |
| 1298 | 101.0001.0010 | 209 | 1101.0001 | 1 |
| 1300 | 101.0001.0100 | 210 | 1101.0010 | 1 |
| 1301 | 101.0001.0101 | 211 | 1101.0011 | 2 |
| 1312 | 101.0010.0000 | 212 | 1101.0100 | 1 |
| 1313 | 101.0010.0001 | 213 | 1101.0101 | 1 |
| 1314 | 101.0010.0010 | 214 | 1101.0110 | 1 |
| 1316 | 101.0010.0100 | 215 | 1101.0111 | 1 |
| 1317 | 101.0010.0101 | 216 | 1101.1000 | 1 |
| 1320 | 101.0010.1000 | 217 | 1101.1001 | 1 |
| 1321 | 101.0010.1001 | 218 | 1101.1010 | 1 |
| 1322 | 101.0010.1010 | 219 | 1101.1011 | 2 |
| 1344 | 101.0100.0000 | 220 | 1101.1100 | 2 |
| 1345 | 101.0100.0001 | 221 | 1101.1101 | 2 |
| 1346 | 101.0100.0010 | 222 | 1101.1110 | 2 |
| 1348 | 101.0100.0100 | 223 | 1101.1111 | 2 |
| 1349 | 101.0100.0101 | 224 | 1110.0000 | 2 |
| 1352 | 101.0100.1000 | 225 | 1110.0001 | 2 |
| 1353 | 101.0100.1001 | 226 | 1110.0010 | 2 |
| 1354 | 101.0100.1010 | 227 | 1110.0011 | 2 |
| 1360 | 101.0101.0000 | 228 | 1110.0100 | 2 |
| 1361 | 101.0101.0001 | 229 | 1110.0101 | 2 |
| 1362 | 101.0101.0010 | 230 | 1110.0110 | 2 |
| 1364 | 101.0101.0100 | 231 | 1110.0111 | 2 |
| 1365 | 101.0101.0101 | 232 | 1110.1000 | 2 |

FIG. 31

| TRIMMING VALUE (DECIMAL) | TRIMMING PATTERN (BINARY) | RISK | TRIMMING SIGNAL | | |
|---|---|---|---|---|---|
| | | | DECIMAL | BINARY | OTHERS |
| 0 | 0000000 | 0 | 0 | 00000 | |
| 1 | 0000001 | 0 | 1 | 00001 | |
| 2 | 0000010 | 0 | 2 | 00010 | |
| 4 | 0000100 | 0 | 3 | 00011 | |
| 5 | 0000101 | 1 | 4 | 00100 | |
| 8 | 0001000 | 0 | 5 | 00101 | |
| 9 | 0001001 | 0 | 6 | 00110 | |
| 10 | 0001010 | 1 | 7 | 00111 | |
| 16 | 0010000 | 0 | 8 | 01000 | |
| 17 | 0010001 | 0 | 9 | 01001 | |
| 18 | 0010010 | 0 | 10 | 01010 | |
| 20 | 0010100 | 1 | 11 | 01011 | |
| 21 | 0010101 | 2 | 12 | 01100 | |
| 32 | 0100000 | 0 | 13 | 01101 | |
| 33 | 0100001 | 0 | 14 | 01110 | |
| 34 | 0100010 | 0 | 15 | 01111 | |
| 36 | 0100100 | 0 | 16 | 10000 | |
| 37 | 0100101 | 1 | 17 | 10001 | |
| 40 | 0101000 | 1 | 18 | 10010 | |
| 41 | 0101001 | 1 | 19 | 10011 | |
| 42 | 0101010 | 2 | 20 | 10100 | |
| 64 | 1000000 | 0 | 21 | 10101 | |
| 65 | 1000001 | 0 | 22 | 10110 | |
| 66 | 1000010 | 0 | 23 | 10111 | |
| 68 | 1000100 | 0 | 24 | 11000 | |
| 69 | 1000101 | 1 | 25 | 11001 | |
| 72 | 1001000 | 0 | 26 | 11010 | |
| 73 | 1001001 | 0 | 27 | 11011 | |
| 74 | 1001010 | 1 | 28 | 11100 | |
| 80 | 1010000 | 1 | 29 | 11101 | |
| 81 | 1010001 | 1 | 30 | 11110 | |
| 82 | 1010010 | 1 | 31 | 11111 | |
| 84 | 1010100 | 2 | – | – | SPARE BIT |
| 85 | 1010101 | 2 | – | – | |

FIG. 33

| BEFORE CONVERSION | | AFTER CONVERSION | | RISK |
|---|---|---|---|---|
| TRIMMING VALUE (DECIMAL) | TRIMMING PATTERN (BINARY) | TRIMMING SIGNAL | | |
| | | DECIMAL | BINARY | |
| 0 | 0000.0000.0000 | 0 | 0000.0000 | 0 |
| 1 | 0000.0000.0001 | 1 | 0000.0001 | 0 |
| 2 | 0000.0000.0010 | 2 | 0000.0010 | 0 |
| 4 | 0000.0000.0100 | 3 | 0000.0011 | 0 |
| 5 | 0000.0000.0101 | 4 | 0000.0100 | 1 |
| 8 | 0000.0000.1000 | 5 | 0000.0101 | 0 |
| 9 | 0000.0000.1001 | 6 | 0000.0110 | 0 |
| 10 | 0000.0000.1010 | 7 | 0000.0111 | 1 |
| 16 | 0000.0001.0000 | 8 | 0000.1000 | 0 |
| 17 | 0000.0001.0001 | 9 | 0000.1001 | 0 |
| 18 | 0000.0001.0010 | 10 | 0000.1010 | 0 |
| 20 | 0000.0001.0100 | 11 | 0000.1011 | 1 |
| 32 | 0000.0010.0000 | 12 | 0000.1100 | 0 |
| 33 | 0000.0010.0001 | 13 | 0000.1101 | 0 |
| 34 | 0000.0010.0010 | 14 | 0000.1110 | 0 |
| 36 | 0000.0010.0100 | 15 | 0000.1111 | 0 |
| 37 | 0000.0010.0101 | 16 | 0001.0000 | 1 |
| 40 | 0000.0010.1000 | 17 | 0001.0001 | 1 |
| 41 | 0000.0010.1001 | 18 | 0001.0010 | 1 |
| 64 | 0000.0100.0000 | 19 | 0001.0011 | 0 |
| 65 | 0000.0100.0001 | 20 | 0001.0100 | 0 |
| 66 | 0000.0100.0010 | 21 | 0001.0101 | 0 |
| 68 | 0000.0100.0100 | 22 | 0001.0110 | 0 |
| 69 | 0000.0100.0101 | 23 | 0001.0111 | 1 |
| 72 | 0000.0100.1000 | 24 | 0001.1000 | 0 |
| 73 | 0000.0100.1001 | 25 | 0001.1001 | 0 |
| 74 | 0000.0100.1010 | 26 | 0001.1010 | 1 |
| 80 | 0000.0101.0000 | 27 | 0001.1011 | 1 |
| 81 | 0000.0101.0001 | 28 | 0001.1100 | 1 |
| 82 | 0000.0101.0010 | 29 | 0001.1101 | 1 |
| 128 | 0000.1000.0000 | 30 | 0001.1110 | 0 |
| 129 | 0000.1000.0001 | 31 | 0001.1111 | 0 |
| 130 | 0000.1000.0010 | 32 | 0010.0000 | 0 |
| 132 | 0000.1000.0100 | 33 | 0010.0001 | 0 |
| 133 | 0000.1000.0101 | 34 | 0010.0010 | 1 |
| 136 | 0000.1000.1000 | 35 | 0010.0011 | 0 |
| 137 | 0000.1000.1001 | 36 | 0010.0100 | 0 |
| 138 | 0000.1000.1010 | 37 | 0010.0101 | 1 |
| 144 | 0000.1001.0000 | 38 | 0010.0110 | 0 |
| 145 | 0000.1001.0001 | 39 | 0010.0111 | 0 |
| 146 | 0000.1001.0010 | 40 | 0010.1000 | 0 |
| 148 | 0000.1001.0100 | 41 | 0010.1001 | 1 |
| 160 | 0000.1010.0000 | 42 | 0010.1010 | 1 |
| 161 | 0000.1010.0001 | 43 | 0010.1011 | 1 |
| 162 | 0000.1010.0010 | 44 | 0010.1100 | 1 |
| 164 | 0000.1010.0100 | 45 | 0010.1101 | 1 |
| 165 | 0000.1010.0101 | 46 | 0010.1110 | 1 |
| 256 | 0001.0000.0000 | 47 | 0010.1111 | 0 |
| 257 | 0001.0000.0001 | 48 | 0011.0000 | 0 |
| 258 | 0001.0000.0010 | 49 | 0011.0001 | 0 |
| 260 | 0001.0000.0100 | 50 | 0011.0010 | 0 |
| 261 | 0001.0000.0101 | 51 | 0011.0011 | 1 |

FIG. 34

| | | | | |
|---|---|---|---|---|
| 264 | 0001.0000.1000 | 52 | 0011.0100 | 0 |
| 265 | 0001.0000.1001 | 53 | 0011.0101 | 0 |
| 266 | 0001.0000.1010 | 54 | 0011.0110 | 1 |
| 272 | 0001.0001.0000 | 55 | 0011.0111 | 0 |
| 273 | 0001.0001.0001 | 56 | 0011.1000 | 0 |
| 274 | 0001.0001.0010 | 57 | 0011.1001 | 0 |
| 276 | 0001.0001.0100 | 58 | 0011.1010 | 1 |
| 288 | 0001.0010.0000 | 59 | 0011.1011 | 0 |
| 289 | 0001.0010.0001 | 60 | 0011.1100 | 0 |
| 290 | 0001.0010.0010 | 61 | 0011.1101 | 0 |
| 292 | 0001.0010.0100 | 62 | 0011.1110 | 0 |
| 293 | 0001.0010.0101 | 63 | 0011.1111 | 1 |
| 296 | 0001.0010.1000 | 64 | 0100.0000 | 1 |
| 297 | 0001.0010.1001 | 65 | 0100.0001 | 1 |
| 320 | 0001.0100.0000 | 66 | 0100.0010 | 1 |
| 321 | 0001.0100.0001 | 67 | 0100.0011 | 1 |
| 322 | 0001.0100.0010 | 68 | 0100.0100 | 1 |
| 324 | 0001.0100.0100 | 69 | 0100.0101 | 1 |
| 325 | 0001.0100.0101 | 70 | 0100.0110 | 1 |
| 328 | 0001.0100.1000 | 71 | 0100.0111 | 1 |
| 329 | 0001.0100.1001 | 72 | 0100.1000 | 1 |
| 330 | 0001.0100.1010 | 73 | 0100.1001 | 1 |
| 512 | 0010.0000.0000 | 74 | 0100.1010 | 0 |
| 513 | 0010.0000.0001 | 75 | 0100.1011 | 0 |
| 514 | 0010.0000.0010 | 76 | 0100.1100 | 0 |
| 516 | 0010.0000.0100 | 77 | 0100.1101 | 0 |
| 517 | 0010.0000.0101 | 78 | 0100.1110 | 1 |
| 520 | 0010.0000.1000 | 79 | 0100.1111 | 0 |
| 521 | 0010.0000.1001 | 80 | 0101.0000 | 0 |
| 522 | 0010.0000.1010 | 81 | 0101.0001 | 1 |
| 528 | 0010.0001.0000 | 82 | 0101.0010 | 0 |
| 529 | 0010.0001.0001 | 83 | 0101.0011 | 0 |
| 530 | 0010.0001.0010 | 84 | 0101.0100 | 0 |
| 532 | 0010.0001.0100 | 85 | 0101.0101 | 1 |
| 544 | 0010.0010.0000 | 86 | 0101.0110 | 0 |
| 545 | 0010.0010.0001 | 87 | 0101.0111 | 0 |
| 546 | 0010.0010.0010 | 88 | 0101.1000 | 0 |
| 548 | 0010.0010.0100 | 89 | 0101.1001 | 0 |
| 549 | 0010.0010.0101 | 90 | 0101.1010 | 1 |
| 552 | 0010.0010.1000 | 91 | 0101.1011 | 1 |
| 553 | 0010.0010.1001 | 92 | 0101.1100 | 1 |
| 576 | 0010.0100.0000 | 93 | 0101.1101 | 0 |
| 577 | 0010.0100.0001 | 94 | 0101.1110 | 0 |
| 578 | 0010.0100.0010 | 95 | 0101.1111 | 0 |
| 580 | 0010.0100.0100 | 96 | 0110.0000 | 0 |
| 581 | 0010.0100.0101 | 97 | 0110.0001 | 1 |
| 584 | 0010.0100.1000 | 98 | 0110.0010 | 0 |
| 585 | 0010.0100.1001 | 99 | 0110.0011 | 0 |
| 586 | 0010.0100.1010 | 100 | 0110.0100 | 1 |
| 592 | 0010.0101.0000 | 101 | 0110.0101 | 1 |
| 593 | 0010.0101.0001 | 102 | 0110.0110 | 1 |
| 594 | 0010.0101.0010 | 103 | 0110.0111 | 1 |
| 640 | 0010.1000.0000 | 104 | 0110.1000 | 1 |
| 641 | 0010.1000.0001 | 105 | 0110.1001 | 1 |
| 642 | 0010.1000.0010 | 106 | 0110.1010 | 1 |
| 644 | 0010.1000.0100 | 107 | 0110.1011 | 1 |
| 645 | 0010.1000.0101 | 108 | 0110.1100 | 1 |
| 648 | 0010.1000.1000 | 109 | 0110.1101 | 1 |
| 649 | 0010.1000.1001 | 110 | 0110.1110 | 1 |

FIG. 35

| | | | | |
|---|---|---|---|---|
| 650 | 0010.1000.1010 | 111 | 0110.1111 | 1 |
| 656 | 0010.1001.0000 | 112 | 0111.0000 | 1 |
| 657 | 0010.1001.0001 | 113 | 0111.0001 | 1 |
| 658 | 0010.1001.0010 | 114 | 0111.0010 | 1 |
| 660 | 0010.1001.0100 | 115 | 0111.0011 | 1 |
| 1024 | 0100.0000.0000 | 116 | 0111.0100 | 0 |
| 1025 | 0100.0000.0001 | 117 | 0111.0101 | 0 |
| 1026 | 0100.0000.0010 | 118 | 0111.0110 | 0 |
| 1028 | 0100.0000.0100 | 119 | 0111.0111 | 0 |
| 1029 | 0100.0000.0101 | 120 | 0111.1000 | 1 |
| 1032 | 0100.0000.1000 | 121 | 0111.1001 | 0 |
| 1033 | 0100.0000.1001 | 122 | 0111.1010 | 0 |
| 1034 | 0100.0000.1010 | 123 | 0111.1011 | 1 |
| 1040 | 0100.0001.0000 | 124 | 0111.1100 | 0 |
| 1041 | 0100.0001.0001 | 125 | 0111.1101 | 0 |
| 1042 | 0100.0001.0010 | 126 | 0111.1110 | 0 |
| 1044 | 0100.0001.0100 | 127 | 0111.1111 | 1 |
| 1056 | 0100.0010.0000 | 128 | 1000.0000 | 0 |
| 1057 | 0100.0010.0001 | 129 | 1000.0001 | 0 |
| 1058 | 0100.0010.0010 | 130 | 1000.0010 | 0 |
| 1060 | 0100.0010.0100 | 131 | 1000.0011 | 0 |
| 1061 | 0100.0010.0101 | 132 | 1000.0100 | 1 |
| 1064 | 0100.0010.1000 | 133 | 1000.0101 | 1 |
| 1065 | 0100.0010.1001 | 134 | 1000.0110 | 1 |
| 1088 | 0100.0100.0000 | 135 | 1000.0111 | 0 |
| 1089 | 0100.0100.0001 | 136 | 1000.1000 | 0 |
| 1090 | 0100.0100.0010 | 137 | 1000.1001 | 0 |
| 1092 | 0100.0100.0100 | 138 | 1000.1010 | 0 |
| 1093 | 0100.0100.0101 | 139 | 1000.1011 | 1 |
| 1096 | 0100.0100.1000 | 140 | 1000.1100 | 0 |
| 1097 | 0100.0100.1001 | 141 | 1000.1101 | 0 |
| 1098 | 0100.0100.1010 | 142 | 1000.1110 | 1 |
| 1104 | 0100.0101.0000 | 143 | 1000.1111 | 1 |
| 1105 | 0100.0101.0001 | 144 | 1001.0000 | 1 |
| 1106 | 0100.0101.0010 | 145 | 1001.0001 | 1 |
| 1152 | 0100.1000.0000 | 146 | 1001.0010 | 0 |
| 1153 | 0100.1000.0001 | 147 | 1001.0011 | 0 |
| 1154 | 0100.1000.0010 | 148 | 1001.0100 | 0 |
| 1156 | 0100.1000.0100 | 149 | 1001.0101 | 0 |
| 1157 | 0100.1000.0101 | 150 | 1001.0110 | 1 |
| 1160 | 0100.1000.1000 | 151 | 1001.0111 | 0 |
| 1161 | 0100.1000.1001 | 152 | 1001.1000 | 0 |
| 1162 | 0100.1000.1010 | 153 | 1001.1001 | 1 |
| 1168 | 0100.1001.0000 | 154 | 1001.1010 | 0 |
| 1169 | 0100.1001.0001 | 155 | 1001.1011 | 0 |
| 1170 | 0100.1001.0010 | 156 | 1001.1100 | 0 |
| 1172 | 0100.1001.0100 | 157 | 1001.1101 | 1 |
| 1184 | 0100.1010.0000 | 158 | 1001.1110 | 1 |
| 1185 | 0100.1010.0001 | 159 | 1001.1111 | 1 |
| 1186 | 0100.1010.0010 | 160 | 1010.0000 | 1 |
| 1188 | 0100.1010.0100 | 161 | 1010.0001 | 1 |
| 1189 | 0100.1010.0101 | 162 | 1010.0010 | 1 |
| 1280 | 0101.0000.0000 | 163 | 1010.0011 | 1 |
| 1281 | 0101.0000.0001 | 164 | 1010.0100 | 1 |
| 1282 | 0101.0000.0010 | 165 | 1010.0101 | 1 |
| 1284 | 0101.0000.0100 | 166 | 1010.0110 | 1 |
| 1285 | 0101.0000.0101 | 167 | 1010.0111 | 1 |
| 1288 | 0101.0000.1000 | 168 | 1010.1000 | 1 |
| 1289 | 0101.0000.1001 | 169 | 1010.1001 | 1 |

FIG. 36

| | | | | |
|---|---|---|---|---|
| 1290 | 0101.0000.1010 | 170 | 1010.1010 | 1 |
| 1296 | 0101.0001.0000 | 171 | 1010.1011 | 1 |
| 1297 | 0101.0001.0001 | 172 | 1010.1100 | 1 |
| 1298 | 0101.0001.0010 | 173 | 1010.1101 | 1 |
| 1300 | 0101.0001.0100 | 174 | 1010.1110 | 1 |
| 1312 | 0101.0010.0000 | 175 | 1010.1111 | 1 |
| 1313 | 0101.0010.0001 | 176 | 1011.0000 | 1 |
| 1314 | 0101.0010.0010 | 177 | 1011.0001 | 1 |
| 1316 | 0101.0010.0100 | 178 | 1011.0010 | 1 |
| 1317 | 0101.0010.0101 | 179 | 1011.0011 | 1 |
| 1320 | 0101.0010.1000 | 180 | 1011.0100 | 1 |
| 1321 | 0101.0010.1001 | 181 | 1011.0101 | 1 |
| 2048 | 1000.0000.0000 | 182 | 1011.0110 | 0 |
| 2049 | 1000.0000.0001 | 183 | 1011.0111 | 0 |
| 2050 | 1000.0000.0010 | 184 | 1011.1000 | 0 |
| 2052 | 1000.0000.0100 | 185 | 1011.1001 | 0 |
| 2053 | 1000.0000.0101 | 186 | 1011.1010 | 1 |
| 2056 | 1000.0000.1000 | 187 | 1011.1011 | 0 |
| 2057 | 1000.0000.1001 | 188 | 1011.1100 | 0 |
| 2058 | 1000.0000.1010 | 189 | 1011.1101 | 1 |
| 2064 | 1000.0001.0000 | 190 | 1011.1110 | 0 |
| 2065 | 1000.0001.0001 | 191 | 1011.1111 | 0 |
| 2066 | 1000.0001.0010 | 192 | 1100.0000 | 0 |
| 2068 | 1000.0001.0100 | 193 | 1100.0001 | 1 |
| 2080 | 1000.0010.0000 | 194 | 1100.0010 | 0 |
| 2081 | 1000.0010.0001 | 195 | 1100.0011 | 0 |
| 2082 | 1000.0010.0010 | 196 | 1100.0100 | 0 |
| 2084 | 1000.0010.0100 | 197 | 1100.0101 | 0 |
| 2085 | 1000.0010.0101 | 198 | 1100.0110 | 1 |
| 2088 | 1000.0010.1000 | 199 | 1100.0111 | 1 |
| 2089 | 1000.0010.1001 | 200 | 1100.1000 | 1 |
| 2112 | 1000.0100.0000 | 201 | 1100.1001 | 0 |
| 2113 | 1000.0100.0001 | 202 | 1100.1010 | 0 |
| 2114 | 1000.0100.0010 | 203 | 1100.1011 | 0 |
| 2116 | 1000.0100.0100 | 204 | 1100.1100 | 0 |
| 2117 | 1000.0100.0101 | 205 | 1100.1101 | 1 |
| 2120 | 1000.0100.1000 | 206 | 1100.1110 | 0 |
| 2121 | 1000.0100.1001 | 207 | 1100.1111 | 0 |
| 2122 | 1000.0100.1010 | 208 | 1101.0000 | 1 |
| 2128 | 1000.0101.0000 | 209 | 1101.0001 | 1 |
| 2129 | 1000.0101.0001 | 210 | 1101.0010 | 1 |
| 2130 | 1000.0101.0010 | 211 | 1101.0011 | 1 |
| 2176 | 1000.1000.0000 | 212 | 1101.0100 | 0 |
| 2177 | 1000.1000.0001 | 213 | 1101.0101 | 0 |
| 2178 | 1000.1000.0010 | 214 | 1101.0110 | 0 |
| 2180 | 1000.1000.0100 | 215 | 1101.0111 | 0 |
| 2181 | 1000.1000.0101 | 216 | 1101.1000 | 1 |
| 2184 | 1000.1000.1000 | 217 | 1101.1001 | 0 |
| 2185 | 1000.1000.1001 | 218 | 1101.1010 | 0 |
| 2186 | 1000.1000.1010 | 219 | 1101.1011 | 1 |
| 2192 | 1000.1001.0000 | 220 | 1101.1100 | 0 |
| 2193 | 1000.1001.0001 | 221 | 1101.1101 | 0 |
| 2194 | 1000.1001.0010 | 222 | 1101.1110 | 0 |
| 2196 | 1000.1001.0100 | 223 | 1101.1111 | 1 |
| 2208 | 1000.1010.0000 | 224 | 1110.0000 | 1 |
| 2209 | 1000.1010.0001 | 225 | 1110.0001 | 1 |
| 2210 | 1000.1010.0010 | 226 | 1110.0010 | 1 |
| 2212 | 1000.1010.0100 | 227 | 1110.0011 | 1 |
| 2213 | 1000.1010.0101 | 228 | 1110.0100 | 1 |

FIG. 37

| | | | | |
|---|---|---|---|---|
| 2304 | 1001.0000.0000 | 229 | 1110.0101 | 0 |
| 2305 | 1001.0000.0001 | 230 | 1110.0110 | 0 |
| 2306 | 1001.0000.0010 | 231 | 1110.0111 | 0 |
| 2308 | 1001.0000.0100 | 232 | 1110.1000 | 0 |
| 2309 | 1001.0000.0101 | 233 | 1110.1001 | 1 |
| 2312 | 1001.0000.1000 | 234 | 1110.1010 | 0 |
| 2313 | 1001.0000.1001 | 235 | 1110.1011 | 0 |
| 2314 | 1001.0000.1010 | 236 | 1110.1100 | 1 |
| 2320 | 1001.0001.0000 | 237 | 1110.1101 | 0 |
| 2321 | 1001.0001.0001 | 238 | 1110.1110 | 0 |
| 2322 | 1001.0001.0010 | 239 | 1110.1111 | 0 |
| 2324 | 1001.0001.0100 | 240 | 1111.0000 | 1 |
| 2336 | 1001.0010.0000 | 241 | 1111.0001 | 0 |
| 2337 | 1001.0010.0001 | 242 | 1111.0010 | 0 |
| 2338 | 1001.0010.0010 | 243 | 1111.0011 | 0 |
| 2340 | 1001.0010.0100 | 244 | 1111.0100 | 0 |
| 2341 | 1001.0010.0101 | 245 | 1111.0101 | 1 |
| 2344 | 1001.0010.1000 | 246 | 1111.0110 | 1 |
| 2345 | 1001.0010.1001 | 247 | 1111.0111 | 1 |
| 2368 | 1001.0100.0000 | 248 | 1111.1000 | 1 |
| 2369 | 1001.0100.0001 | 249 | 1111.1001 | 1 |
| 2370 | 1001.0100.0010 | 250 | 1111.1010 | 1 |
| 2372 | 1001.0100.0100 | 251 | 1111.1011 | 1 |
| 2373 | 1001.0100.0101 | 252 | 1111.1100 | 1 |
| 2376 | 1001.0100.1000 | 253 | 1111.1101 | 1 |
| 2377 | 1001.0100.1001 | 254 | 1111.1110 | 1 |
| 2378 | 1001.0100.1010 | 255 | 1111.1111 | 1 |

| BEFORE CONVERSION | | AFTER CONVERSION | | RISK |
|---|---|---|---|---|
| 2560 | 1010.0000.0000 | 256 | SPARE BIT | 1 |
| 2561 | 1010.0000.0001 | 257 | SPARE BIT | 1 |
| 2562 | 1010.0000.0010 | 258 | SPARE BIT | 1 |
| 2564 | 1010.0000.0100 | 259 | SPARE BIT | 1 |
| 2565 | 1010.0000.0101 | 260 | SPARE BIT | 1 |
| 2568 | 1010.0000.1000 | 261 | SPARE BIT | 1 |
| 2569 | 1010.0000.1001 | 262 | SPARE BIT | 1 |
| 2570 | 1010.0000.1010 | 263 | SPARE BIT | 1 |
| 2576 | 1010.0001.0000 | 264 | SPARE BIT | 1 |
| 2577 | 1010.0001.0001 | 265 | SPARE BIT | 1 |
| 2578 | 1010.0001.0010 | 266 | SPARE BIT | 1 |
| 2580 | 1010.0001.0100 | 267 | SPARE BIT | 1 |
| 2592 | 1010.0010.0000 | 268 | SPARE BIT | 1 |
| 2593 | 1010.0010.0001 | 269 | SPARE BIT | 1 |
| 2594 | 1010.0010.0010 | 270 | SPARE BIT | 1 |
| 2596 | 1010.0010.0100 | 271 | SPARE BIT | 1 |
| 2597 | 1010.0010.0101 | 272 | SPARE BIT | 1 |
| 2600 | 1010.0010.1000 | 273 | SPARE BIT | 1 |
| 2601 | 1010.0010.1001 | 274 | SPARE BIT | 1 |
| 2624 | 1010.0100.0000 | 275 | SPARE BIT | 1 |
| 2625 | 1010.0100.0001 | 276 | SPARE BIT | 1 |
| 2626 | 1010.0100.0010 | 277 | SPARE BIT | 1 |
| 2628 | 1010.0100.0100 | 278 | SPARE BIT | 1 |
| 2629 | 1010.0100.0101 | 279 | SPARE BIT | 1 |
| 2632 | 1010.0100.1000 | 280 | SPARE BIT | 1 |
| 2633 | 1010.0100.1001 | 281 | SPARE BIT | 1 |
| 2634 | 1010.0100.1010 | 282 | SPARE BIT | 1 |
| 2640 | 1010.0101.0000 | 283 | SPARE BIT | 1 |
| 2641 | 1010.0101.0001 | 284 | SPARE BIT | 1 |
| 2642 | 1010.0101.0010 | 285 | SPARE BIT | 1 |

FIG. 38

| | | | | |
|---|---|---|---|---|
| 21 | 0000.0001.0101 | 286 | SPARE BIT | 2 |
| 42 | 0000.0010.1010 | 287 | SPARE BIT | 2 |
| 84 | 0000.0101.0100 | 288 | SPARE BIT | 2 |
| 85 | 0000.0101.0101 | 289 | SPARE BIT | 2 |
| 149 | 0000.1001.0101 | 290 | SPARE BIT | 2 |
| 168 | 0000.1010.1000 | 291 | SPARE BIT | 2 |
| 169 | 0000.1010.1001 | 292 | SPARE BIT | 2 |
| 170 | 0000.1010.1010 | 293 | SPARE BIT | 2 |
| 277 | 0001.0001.0101 | 294 | SPARE BIT | 2 |
| 298 | 0001.0010.1010 | 295 | SPARE BIT | 2 |
| 336 | 0001.0101.0000 | 296 | SPARE BIT | 2 |
| 337 | 0001.0101.0001 | 297 | SPARE BIT | 2 |
| 338 | 0001.0101.0010 | 298 | SPARE BIT | 2 |
| 340 | 0001.0101.0100 | 299 | SPARE BIT | 2 |
| 341 | 0001.0101.0101 | 300 | SPARE BIT | 2 |
| 533 | 0010.0001.0101 | 301 | SPARE BIT | 2 |
| 554 | 0010.0010.1010 | 302 | SPARE BIT | 2 |
| 596 | 0010.0101.0100 | 303 | SPARE BIT | 2 |
| 597 | 0010.0101.0101 | 304 | SPARE BIT | 2 |
| 661 | 0010.1001.0101 | 305 | SPARE BIT | 2 |
| 672 | 0010.1010.0000 | 306 | SPARE BIT | 2 |
| 673 | 0010.1010.0001 | 307 | SPARE BIT | 2 |
| 674 | 0010.1010.0010 | 308 | SPARE BIT | 2 |
| 676 | 0010.1010.0100 | 309 | SPARE BIT | 2 |
| 677 | 0010.1010.0101 | 310 | SPARE BIT | 2 |
| 680 | 0010.1010.1000 | 311 | SPARE BIT | 2 |
| 681 | 0010.1010.1001 | 312 | SPARE BIT | 2 |
| 682 | 0010.1010.1010 | 313 | SPARE BIT | 2 |
| 1045 | 0100.0001.0101 | 314 | SPARE BIT | 2 |
| 1066 | 0100.0010.1010 | 315 | SPARE BIT | 2 |
| 1108 | 0100.0101.0100 | 316 | SPARE BIT | 2 |
| 1109 | 0100.0101.0101 | 317 | SPARE BIT | 2 |
| 1173 | 0100.1001.0101 | 318 | SPARE BIT | 2 |
| 1192 | 0100.1010.1000 | 319 | SPARE BIT | 2 |
| 1193 | 0100.1010.1001 | 320 | SPARE BIT | 2 |
| 1194 | 0100.1010.1010 | 321 | SPARE BIT | 2 |
| 1301 | 0101.0001.0101 | 322 | SPARE BIT | 2 |
| 1322 | 0101.0010.1010 | 323 | SPARE BIT | 2 |
| 1344 | 0101.0100.0000 | 324 | SPARE BIT | 2 |
| 1345 | 0101.0100.0001 | 325 | SPARE BIT | 2 |
| 1346 | 0101.0100.0010 | 326 | SPARE BIT | 2 |
| 1348 | 0101.0100.0100 | 327 | SPARE BIT | 2 |
| 1349 | 0101.0100.0101 | 328 | SPARE BIT | 2 |
| 1352 | 0101.0100.1000 | 329 | SPARE BIT | 2 |
| 1353 | 0101.0100.1001 | 330 | SPARE BIT | 2 |
| 1354 | 0101.0100.1010 | 331 | SPARE BIT | 2 |
| 1360 | 0101.0101.0000 | 332 | SPARE BIT | 2 |
| 1361 | 0101.0101.0001 | 333 | SPARE BIT | 2 |
| 1362 | 0101.0101.0010 | 334 | SPARE BIT | 2 |
| 1364 | 0101.0101.0100 | 335 | SPARE BIT | 2 |
| 1365 | 0101.0101.0101 | 336 | SPARE BIT | 2 |
| 2069 | 1000.0001.0101 | 337 | SPARE BIT | 2 |
| 2090 | 1000.0010.1010 | 338 | SPARE BIT | 2 |
| 2132 | 1000.0101.0100 | 339 | SPARE BIT | 2 |
| 2133 | 1000.0101.0101 | 340 | SPARE BIT | 2 |
| 2197 | 1000.1001.0101 | 341 | SPARE BIT | 2 |
| 2216 | 1000.1010.1000 | 342 | SPARE BIT | 2 |
| 2217 | 1000.1010.1001 | 343 | SPARE BIT | 2 |
| 2218 | 1000.1010.1010 | 344 | SPARE BIT | 2 |

FIG. 39

| 2325 | 1001.0001.0101 | 345 | SPARE BIT | 2 |
|---|---|---|---|---|
| 2346 | 1001.0010.1010 | 346 | SPARE BIT | 2 |
| 2384 | 1001.0101.0000 | 347 | SPARE BIT | 2 |
| 2385 | 1001.0101.0001 | 348 | SPARE BIT | 2 |
| 2386 | 1001.0101.0010 | 349 | SPARE BIT | 2 |
| 2388 | 1001.0101.0100 | 350 | SPARE BIT | 2 |
| 2389 | 1001.0101.0101 | 351 | SPARE BIT | 2 |
| 2581 | 1010.0001.0101 | 352 | SPARE BIT | 2 |
| 2602 | 1010.0010.1010 | 353 | SPARE BIT | 2 |
| 2644 | 1010.0101.0100 | 354 | SPARE BIT | 2 |
| 2645 | 1010.0101.0101 | 355 | SPARE BIT | 2 |
| 2688 | 1010.1000.0000 | 356 | SPARE BIT | 2 |
| 2689 | 1010.1000.0001 | 357 | SPARE BIT | 2 |
| 2690 | 1010.1000.0010 | 358 | SPARE BIT | 2 |
| 2692 | 1010.1000.0100 | 359 | SPARE BIT | 2 |
| 2693 | 1010.1000.0101 | 360 | SPARE BIT | 2 |
| 2696 | 1010.1000.1000 | 361 | SPARE BIT | 2 |
| 2697 | 1010.1000.1001 | 362 | SPARE BIT | 2 |
| 2698 | 1010.1000.1010 | 363 | SPARE BIT | 2 |
| 2704 | 1010.1001.0000 | 364 | SPARE BIT | 2 |
| 2705 | 1010.1001.0001 | 365 | SPARE BIT | 2 |
| 2706 | 1010.1001.0010 | 366 | SPARE BIT | 2 |
| 2708 | 1010.1001.0100 | 367 | SPARE BIT | 2 |
| 2709 | 1010.1001.0101 | 368 | SPARE BIT | 2 |
| 2720 | 1010.1010.0000 | 369 | SPARE BIT | 2 |
| 2721 | 1010.1010.0001 | 370 | SPARE BIT | 2 |
| 2722 | 1010.1010.0010 | 371 | SPARE BIT | 2 |
| 2724 | 1010.1010.0100 | 372 | SPARE BIT | 2 |
| 2725 | 1010.1010.0101 | 373 | SPARE BIT | 2 |
| 2728 | 1010.1010.1000 | 374 | SPARE BIT | 2 |
| 2729 | 1010.1010.1001 | 375 | SPARE BIT | 2 |
| 2730 | 1010.1010.1010 | 376 | SPARE BIT | 2 |

FIG. 41

| BEFORE CONVERSION | | AFTER CONVERSION | | RISK |
|---|---|---|---|---|
| TRIMMING VALUE (DECIMAL) | TRIMMING PATTERN (BINARY) | TRIMMING SIGNAL | | |
| | | DECIMAL | BINARY | |
| 5 | 0000.0000.0101 | 0 | 0000.0000 | 1 |
| 10 | 0000.0000.1010 | 1 | 0000.0001 | 1 |
| 20 | 0000.0001.0100 | 2 | 0000.0010 | 1 |
| 37 | 0000.0010.0101 | 3 | 0000.0011 | 1 |
| 40 | 0000.0010.1000 | 4 | 0000.0100 | 1 |
| 41 | 0000.0010.1001 | 5 | 0000.0101 | 1 |
| 69 | 0000.0100.0101 | 6 | 0000.0110 | 1 |
| 74 | 0000.0100.1010 | 7 | 0000.0111 | 1 |
| 80 | 0000.0101.0000 | 8 | 0000.1000 | 1 |
| 81 | 0000.0101.0001 | 9 | 0000.1001 | 1 |
| 82 | 0000.0101.0010 | 10 | 0000.1010 | 1 |
| 133 | 0000.1000.0101 | 11 | 0000.1011 | 1 |
| 138 | 0000.1000.1010 | 12 | 0000.1100 | 1 |
| 148 | 0000.1001.0100 | 13 | 0000.1101 | 1 |
| 160 | 0000.1010.0000 | 14 | 0000.1110 | 1 |
| 161 | 0000.1010.0001 | 15 | 0000.1111 | 1 |
| 162 | 0000.1010.0010 | 16 | 0001.0000 | 1 |
| 164 | 0000.1010.0100 | 17 | 0001.0001 | 1 |
| 165 | 0000.1010.0101 | 18 | 0001.0010 | 1 |
| 261 | 0001.0000.0101 | 19 | 0001.0011 | 1 |
| 266 | 0001.0000.1010 | 20 | 0001.0100 | 1 |
| 276 | 0001.0001.0100 | 21 | 0001.0101 | 1 |
| 293 | 0001.0010.0101 | 22 | 0001.0110 | 1 |
| 296 | 0001.0010.1000 | 23 | 0001.0111 | 1 |
| 297 | 0001.0010.1001 | 24 | 0001.1000 | 1 |
| 320 | 0001.0100.0000 | 25 | 0001.1001 | 1 |
| 321 | 0001.0100.0001 | 26 | 0001.1010 | 1 |
| 322 | 0001.0100.0010 | 27 | 0001.1011 | 1 |
| 324 | 0001.0100.0100 | 28 | 0001.1100 | 1 |
| 325 | 0001.0100.0101 | 29 | 0001.1101 | 1 |
| 328 | 0001.0100.1000 | 30 | 0001.1110 | 1 |
| 329 | 0001.0100.1001 | 31 | 0001.1111 | 1 |
| 330 | 0001.0100.1010 | 32 | 0010.0000 | 1 |
| 517 | 0010.0000.0101 | 33 | 0010.0001 | 1 |
| 522 | 0010.0000.1010 | 34 | 0010.0010 | 1 |
| 532 | 0010.0001.0100 | 35 | 0010.0011 | 1 |
| 549 | 0010.0010.0101 | 36 | 0010.0100 | 1 |
| 552 | 0010.0010.1000 | 37 | 0010.0101 | 1 |
| 553 | 0010.0010.1001 | 38 | 0010.0110 | 1 |
| 581 | 0010.0100.0101 | 39 | 0010.0111 | 1 |
| 586 | 0010.0100.1010 | 40 | 0010.1000 | 1 |
| 592 | 0010.0101.0000 | 41 | 0010.1001 | 1 |
| 593 | 0010.0101.0001 | 42 | 0010.1010 | 1 |
| 594 | 0010.0101.0010 | 43 | 0010.1011 | 1 |
| 640 | 0010.1000.0000 | 44 | 0010.1100 | 1 |
| 641 | 0010.1000.0001 | 45 | 0010.1101 | 1 |
| 642 | 0010.1000.0010 | 46 | 0010.1110 | 1 |
| 644 | 0010.1000.0100 | 47 | 0010.1111 | 1 |
| 645 | 0010.1000.0101 | 48 | 0011.0000 | 1 |
| 648 | 0010.1000.1000 | 49 | 0011.0001 | 1 |
| 649 | 0010.1000.1001 | 50 | 0011.0010 | 1 |
| 650 | 0010.1000.1010 | 51 | 0011.0011 | 1 |

FIG. 42

| | | | | |
|---|---|---|---|---|
| 656 | 0010.1001.0000 | 52 | 0011.0100 | 1 |
| 657 | 0010.1001.0001 | 53 | 0011.0101 | 1 |
| 658 | 0010.1001.0010 | 54 | 0011.0110 | 1 |
| 660 | 0010.1001.0100 | 55 | 0011.0111 | 1 |
| 1029 | 0100.0000.0101 | 56 | 0011.1000 | 1 |
| 1034 | 0100.0000.1010 | 57 | 0011.1001 | 1 |
| 1044 | 0100.0001.0100 | 58 | 0011.1010 | 1 |
| 1061 | 0100.0010.0101 | 59 | 0011.1011 | 1 |
| 1064 | 0100.0010.1000 | 60 | 0011.1100 | 1 |
| 1065 | 0100.0010.1001 | 61 | 0011.1101 | 1 |
| 1093 | 0100.0100.0101 | 62 | 0011.1110 | 1 |
| 0 | 0000.0000.0000 | 63 | 0011.1111 | 0 |
| 1 | 0000.0000.0001 | 64 | 0100.0000 | 0 |
| 2 | 0000.0000.0010 | 65 | 0100.0001 | 0 |
| 4 | 0000.0000.0100 | 66 | 0100.0010 | 0 |
| 8 | 0000.0000.1000 | 67 | 0100.0011 | 0 |
| 9 | 0000.0000.1001 | 68 | 0100.0100 | 0 |
| 16 | 0000.0001.0000 | 69 | 0100.0101 | 0 |
| 17 | 0000.0001.0001 | 70 | 0100.0110 | 0 |
| 18 | 0000.0001.0010 | 71 | 0100.0111 | 0 |
| 32 | 0000.0010.0000 | 72 | 0100.1000 | 0 |
| 33 | 0000.0010.0001 | 73 | 0100.1001 | 0 |
| 34 | 0000.0010.0010 | 74 | 0100.1010 | 0 |
| 36 | 0000.0010.0100 | 75 | 0100.1011 | 0 |
| 64 | 0000.0100.0000 | 76 | 0100.1100 | 0 |
| 65 | 0000.0100.0001 | 77 | 0100.1101 | 0 |
| 66 | 0000.0100.0010 | 78 | 0100.1110 | 0 |
| 68 | 0000.0100.0100 | 79 | 0100.1111 | 0 |
| 72 | 0000.0100.1000 | 80 | 0101.0000 | 0 |
| 73 | 0000.0100.1001 | 81 | 0101.0001 | 0 |
| 128 | 0000.1000.0000 | 82 | 0101.0010 | 0 |
| 129 | 0000.1000.0001 | 83 | 0101.0011 | 0 |
| 130 | 0000.1000.0010 | 84 | 0101.0100 | 0 |
| 132 | 0000.1000.0100 | 85 | 0101.0101 | 0 |
| 136 | 0000.1000.1000 | 86 | 0101.0110 | 0 |
| 137 | 0000.1000.1001 | 87 | 0101.0111 | 0 |
| 144 | 0000.1001.0000 | 88 | 0101.1000 | 0 |
| 145 | 0000.1001.0001 | 89 | 0101.1001 | 0 |
| 146 | 0000.1001.0010 | 90 | 0101.1010 | 0 |
| 256 | 0001.0000.0000 | 91 | 0101.1011 | 0 |
| 257 | 0001.0000.0001 | 92 | 0101.1100 | 0 |
| 258 | 0001.0000.0010 | 93 | 0101.1101 | 0 |
| 260 | 0001.0000.0100 | 94 | 0101.1110 | 0 |
| 264 | 0001.0000.1000 | 95 | 0101.1111 | 0 |
| 265 | 0001.0000.1001 | 96 | 0110.0000 | 0 |
| 272 | 0001.0001.0000 | 97 | 0110.0001 | 0 |
| 273 | 0001.0001.0001 | 98 | 0110.0010 | 0 |
| 274 | 0001.0001.0010 | 99 | 0110.0011 | 0 |
| 288 | 0001.0010.0000 | 100 | 0110.0100 | 0 |
| 289 | 0001.0010.0001 | 101 | 0110.0101 | 0 |
| 290 | 0001.0010.0010 | 102 | 0110.0110 | 0 |
| 292 | 0001.0010.0100 | 103 | 0110.0111 | 0 |
| 512 | 0010.0000.0000 | 104 | 0110.1000 | 0 |
| 513 | 0010.0000.0001 | 105 | 0110.1001 | 0 |
| 514 | 0010.0000.0010 | 106 | 0110.1010 | 0 |
| 516 | 0010.0000.0100 | 107 | 0110.1011 | 0 |
| 520 | 0010.0000.1000 | 108 | 0110.1100 | 0 |
| 521 | 0010.0000.1001 | 109 | 0110.1101 | 0 |
| 528 | 0010.0001.0000 | 110 | 0110.1110 | 0 |

FIG. 43

| | | | | |
|---|---|---|---|---|
| 529 | 0010.0001.0001 | 111 | 0110.1111 | 0 |
| 530 | 0010.0001.0010 | 112 | 0111.0000 | 0 |
| 544 | 0010.0010.0000 | 113 | 0111.0001 | 0 |
| 545 | 0010.0010.0001 | 114 | 0111.0010 | 0 |
| 546 | 0010.0010.0010 | 115 | 0111.0011 | 0 |
| 548 | 0010.0010.0100 | 116 | 0111.0100 | 0 |
| 576 | 0010.0100.0000 | 117 | 0111.0101 | 0 |
| 577 | 0010.0100.0001 | 118 | 0111.0110 | 0 |
| 578 | 0010.0100.0010 | 119 | 0111.0111 | 0 |
| 580 | 0010.0100.0100 | 120 | 0111.1000 | 0 |
| 584 | 0010.0100.1000 | 121 | 0111.1001 | 0 |
| 585 | 0010.0100.1001 | 122 | 0111.1010 | 0 |
| 1024 | 0100.0000.0000 | 123 | 0111.1011 | 0 |
| 1025 | 0100.0000.0001 | 124 | 0111.1100 | 0 |
| 1026 | 0100.0000.0010 | 125 | 0111.1101 | 0 |
| 1028 | 0100.0000.0100 | 126 | 0111.1110 | 0 |
| 1032 | 0100.0000.1000 | 127 | 0111.1111 | 0 |
| 1033 | 0100.0000.1001 | 128 | 1000.0000 | 0 |
| 1040 | 0100.0001.0000 | 129 | 1000.0001 | 0 |
| 1041 | 0100.0001.0001 | 130 | 1000.0010 | 0 |
| 1042 | 0100.0001.0010 | 131 | 1000.0011 | 0 |
| 1056 | 0100.0010.0000 | 132 | 1000.0100 | 0 |
| 1057 | 0100.0010.0001 | 133 | 1000.0101 | 0 |
| 1058 | 0100.0010.0010 | 134 | 1000.0110 | 0 |
| 1060 | 0100.0010.0100 | 135 | 1000.0111 | 0 |
| 1088 | 0100.0100.0000 | 136 | 1000.1000 | 0 |
| 1089 | 0100.0100.0001 | 137 | 1000.1001 | 0 |
| 1090 | 0100.0100.0010 | 138 | 1000.1010 | 0 |
| 1092 | 0100.0100.0100 | 139 | 1000.1011 | 0 |
| 1096 | 0100.0100.1000 | 140 | 1000.1100 | 0 |
| 1097 | 0100.0100.1001 | 141 | 1000.1101 | 0 |
| 1152 | 0100.1000.0000 | 142 | 1000.1110 | 0 |
| 1153 | 0100.1000.0001 | 143 | 1000.1111 | 0 |
| 1154 | 0100.1000.0010 | 144 | 1001.0000 | 0 |
| 1156 | 0100.1000.0100 | 145 | 1001.0001 | 0 |
| 1160 | 0100.1000.1000 | 146 | 1001.0010 | 0 |
| 1161 | 0100.1000.1001 | 147 | 1001.0011 | 0 |
| 1168 | 0100.1001.0000 | 148 | 1001.0100 | 0 |
| 1169 | 0100.1001.0001 | 149 | 1001.0101 | 0 |
| 1170 | 0100.1001.0010 | 150 | 1001.0110 | 0 |
| 2048 | 1000.0000.0000 | 151 | 1001.0111 | 0 |
| 2049 | 1000.0000.0001 | 152 | 1001.1000 | 0 |
| 2050 | 1000.0000.0010 | 153 | 1001.1001 | 0 |
| 2052 | 1000.0000.0100 | 154 | 1001.1010 | 0 |
| 2056 | 1000.0000.1000 | 155 | 1001.1011 | 0 |
| 2057 | 1000.0000.1001 | 156 | 1001.1100 | 0 |
| 2064 | 1000.0001.0000 | 157 | 1001.1101 | 0 |
| 2065 | 1000.0001.0001 | 158 | 1001.1110 | 0 |
| 2066 | 1000.0001.0010 | 159 | 1001.1111 | 0 |
| 2080 | 1000.0010.0000 | 160 | 1010.0000 | 0 |
| 2081 | 1000.0010.0001 | 161 | 1010.0001 | 0 |
| 2082 | 1000.0010.0010 | 162 | 1010.0010 | 0 |
| 2084 | 1000.0010.0100 | 163 | 1010.0011 | 0 |
| 2112 | 1000.0100.0000 | 164 | 1010.0100 | 0 |
| 2113 | 1000.0100.0001 | 165 | 1010.0101 | 0 |
| 2114 | 1000.0100.0010 | 166 | 1010.0110 | 0 |
| 2116 | 1000.0100.0100 | 167 | 1010.0111 | 0 |
| 2120 | 1000.0100.1000 | 168 | 1010.1000 | 0 |
| 2121 | 1000.0100.1001 | 169 | 1010.1001 | 0 |

FIG. 44

| | | | | |
|---|---|---|---|---|
| 2176 | 1000.1000.0000 | 170 | 1010.1010 | 0 |
| 2177 | 1000.1000.0001 | 171 | 1010.1011 | 0 |
| 2178 | 1000.1000.0010 | 172 | 1010.1100 | 0 |
| 2180 | 1000.1000.0100 | 173 | 1010.1101 | 0 |
| 2184 | 1000.1000.1000 | 174 | 1010.1110 | 0 |
| 2185 | 1000.1000.1001 | 175 | 1010.1111 | 0 |
| 2192 | 1000.1001.0000 | 176 | 1011.0000 | 0 |
| 2193 | 1000.1001.0001 | 177 | 1011.0001 | 0 |
| 2194 | 1000.1001.0010 | 178 | 1011.0010 | 0 |
| 2304 | 1001.0000.0000 | 179 | 1011.0011 | 0 |
| 2305 | 1001.0000.0001 | 180 | 1011.0100 | 0 |
| 2306 | 1001.0000.0010 | 181 | 1011.0101 | 0 |
| 2308 | 1001.0000.0100 | 182 | 1011.0110 | 0 |
| 2312 | 1001.0000.1000 | 183 | 1011.0111 | 0 |
| 2313 | 1001.0000.1001 | 184 | 1011.1000 | 0 |
| 2320 | 1001.0001.0000 | 185 | 1011.1001 | 0 |
| 2321 | 1001.0001.0001 | 186 | 1011.1010 | 0 |
| 2322 | 1001.0001.0010 | 187 | 1011.1011 | 0 |
| 2336 | 1001.0010.0000 | 188 | 1011.1100 | 0 |
| 2337 | 1001.0010.0001 | 189 | 1011.1101 | 0 |
| 2338 | 1001.0010.0010 | 190 | 1011.1110 | 0 |
| 2340 | 1001.0010.0100 | 191 | 1011.1111 | 0 |
| 1098 | 0100.0100.1010 | 192 | 1100.0000 | 1 |
| 1104 | 0100.0101.0000 | 193 | 1100.0001 | 1 |
| 1105 | 0100.0101.0001 | 194 | 1100.0010 | 1 |
| 1106 | 0100.0101.0010 | 195 | 1100.0011 | 1 |
| 1157 | 0100.1000.0101 | 196 | 1100.0100 | 1 |
| 1162 | 0100.1000.1010 | 197 | 1100.0101 | 1 |
| 1172 | 0100.1001.0100 | 198 | 1100.0110 | 1 |
| 1184 | 0100.1010.0000 | 199 | 1100.0111 | 1 |
| 1185 | 0100.1010.0001 | 200 | 1100.1000 | 1 |
| 1186 | 0100.1010.0010 | 201 | 1100.1001 | 1 |
| 1188 | 0100.1010.0100 | 202 | 1100.1010 | 1 |
| 1189 | 0100.1010.0101 | 203 | 1100.1011 | 1 |
| 1280 | 0101.0000.0000 | 204 | 1100.1100 | 1 |
| 1281 | 0101.0000.0001 | 205 | 1100.1101 | 1 |
| 1282 | 0101.0000.0010 | 206 | 1100.1110 | 1 |
| 1284 | 0101.0000.0100 | 207 | 1100.1111 | 1 |
| 1285 | 0101.0000.0101 | 208 | 1101.0000 | 1 |
| 1288 | 0101.0000.1000 | 209 | 1101.0001 | 1 |
| 1289 | 0101.0000.1001 | 210 | 1101.0010 | 1 |
| 1290 | 0101.0000.1010 | 211 | 1101.0011 | 1 |
| 1296 | 0101.0001.0000 | 212 | 1101.0100 | 1 |
| 1297 | 0101.0001.0001 | 213 | 1101.0101 | 1 |
| 1298 | 0101.0001.0010 | 214 | 1101.0110 | 1 |
| 1300 | 0101.0001.0100 | 215 | 1101.0111 | 1 |
| 1312 | 0101.0010.0000 | 216 | 1101.1000 | 1 |
| 1313 | 0101.0010.0001 | 217 | 1101.1001 | 1 |
| 1314 | 0101.0010.0010 | 218 | 1101.1010 | 1 |
| 1316 | 0101.0010.0100 | 219 | 1101.1011 | 1 |
| 1317 | 0101.0010.0101 | 220 | 1101.1100 | 1 |
| 1320 | 0101.0010.1000 | 221 | 1101.1101 | 1 |
| 1321 | 0101.0010.1001 | 222 | 1101.1110 | 1 |
| 2053 | 1000.0000.0101 | 223 | 1101.1111 | 1 |
| 2058 | 1000.0000.1010 | 224 | 1110.0000 | 1 |
| 2068 | 1000.0001.0100 | 225 | 1110.0001 | 1 |
| 2085 | 1000.0010.0101 | 226 | 1110.0010 | 1 |
| 2088 | 1000.0010.1000 | 227 | 1110.0011 | 1 |
| 2089 | 1000.0010.1001 | 228 | 1110.0100 | 1 |

FIG. 45

| | | | | |
|---|---|---|---|---|
| 2117 | 1000.0100.0101 | 229 | 1110.0101 | 1 |
| 2122 | 1000.0100.1010 | 230 | 1110.0110 | 1 |
| 2128 | 1000.0101.0000 | 231 | 1110.0111 | 1 |
| 2129 | 1000.0101.0001 | 232 | 1110.1000 | 1 |
| 2130 | 1000.0101.0010 | 233 | 1110.1001 | 1 |
| 2181 | 1000.1000.0101 | 234 | 1110.1010 | 1 |
| 2186 | 1000.1000.1010 | 235 | 1110.1011 | 1 |
| 2196 | 1000.1001.0100 | 236 | 1110.1100 | 1 |
| 2208 | 1000.1010.0000 | 237 | 1110.1101 | 1 |
| 2209 | 1000.1010.0001 | 238 | 1110.1110 | 1 |
| 2210 | 1000.1010.0010 | 239 | 1110.1111 | 1 |
| 2212 | 1000.1010.0100 | 240 | 1111.0000 | 1 |
| 2213 | 1000.1010.0101 | 241 | 1111.0001 | 1 |
| 2309 | 1001.0000.0101 | 242 | 1111.0010 | 1 |
| 2314 | 1001.0000.1010 | 243 | 1111.0011 | 1 |
| 2324 | 1001.0001.0100 | 244 | 1111.0100 | 1 |
| 2341 | 1001.0010.0101 | 245 | 1111.0101 | 1 |
| 2344 | 1001.0010.1000 | 246 | 1111.0110 | 1 |
| 2345 | 1001.0010.1001 | 247 | 1111.0111 | 1 |
| 2368 | 1001.0100.0000 | 248 | 1111.1000 | 1 |
| 2369 | 1001.0100.0001 | 249 | 1111.1001 | 1 |
| 2370 | 1001.0100.0010 | 250 | 1111.1010 | 1 |
| 2372 | 1001.0100.0100 | 251 | 1111.1011 | 1 |
| 2373 | 1001.0100.0101 | 252 | 1111.1100 | 1 |
| 2376 | 1001.0100.1000 | 253 | 1111.1101 | 1 |
| 2377 | 1001.0100.1001 | 254 | 1111.1110 | 1 |
| 2378 | 1001.0100.1010 | 255 | 1111.1111 | 1 |

| BEFORE CONVERSION | | AFTER CONVERSION | | RISK |
|---|---|---|---|---|
| 2560 | 1010.0000.0000 | 256 | SPARE BIT | 1 |
| 2561 | 1010.0000.0001 | 257 | SPARE BIT | 1 |
| 2562 | 1010.0000.0010 | 258 | SPARE BIT | 1 |
| 2564 | 1010.0000.0100 | 259 | SPARE BIT | 1 |
| 2565 | 1010.0000.0101 | 260 | SPARE BIT | 1 |
| 2568 | 1010.0000.1000 | 261 | SPARE BIT | 1 |
| 2569 | 1010.0000.1001 | 262 | SPARE BIT | 1 |
| 2570 | 1010.0000.1010 | 263 | SPARE BIT | 1 |
| 2576 | 1010.0001.0000 | 264 | SPARE BIT | 1 |
| 2577 | 1010.0001.0001 | 265 | SPARE BIT | 1 |
| 2578 | 1010.0001.0010 | 266 | SPARE BIT | 1 |
| 2580 | 1010.0001.0100 | 267 | SPARE BIT | 1 |
| 2592 | 1010.0010.0000 | 268 | SPARE BIT | 1 |
| 2593 | 1010.0010.0001 | 269 | SPARE BIT | 1 |
| 2594 | 1010.0010.0010 | 270 | SPARE BIT | 1 |
| 2596 | 1010.0010.0100 | 271 | SPARE BIT | 1 |
| 2597 | 1010.0010.0101 | 272 | SPARE BIT | 1 |
| 2600 | 1010.0010.1000 | 273 | SPARE BIT | 1 |
| 2601 | 1010.0010.1001 | 274 | SPARE BIT | 1 |
| 2624 | 1010.0100.0000 | 275 | SPARE BIT | 1 |
| 2625 | 1010.0100.0001 | 276 | SPARE BIT | 1 |
| 2626 | 1010.0100.0010 | 277 | SPARE BIT | 1 |
| 2628 | 1010.0100.0100 | 278 | SPARE BIT | 1 |
| 2629 | 1010.0100.0101 | 279 | SPARE BIT | 1 |
| 2632 | 1010.0100.1000 | 280 | SPARE BIT | 1 |
| 2633 | 1010.0100.1001 | 281 | SPARE BIT | 1 |
| 2634 | 1010.0100.1010 | 282 | SPARE BIT | 1 |
| 2640 | 1010.0101.0000 | 283 | SPARE BIT | 1 |
| 2641 | 1010.0101.0001 | 284 | SPARE BIT | 1 |
| 2642 | 1010.0101.0010 | 285 | SPARE BIT | 1 |

FIG. 46

| | | | | |
|---|---|---|---|---|
| 21 | 0000.0001.0101 | 286 | SPARE BIT | 2 |
| 42 | 0000.0010.1010 | 287 | SPARE BIT | 2 |
| 84 | 0000.0101.0100 | 288 | SPARE BIT | 2 |
| 85 | 0000.0101.0101 | 289 | SPARE BIT | 2 |
| 149 | 0000.1001.0101 | 290 | SPARE BIT | 2 |
| 168 | 0000.1010.1000 | 291 | SPARE BIT | 2 |
| 169 | 0000.1010.1001 | 292 | SPARE BIT | 2 |
| 170 | 0000.1010.1010 | 293 | SPARE BIT | 2 |
| 277 | 0001.0001.0101 | 294 | SPARE BIT | 2 |
| 298 | 0001.0010.1010 | 295 | SPARE BIT | 2 |
| 336 | 0001.0101.0000 | 296 | SPARE BIT | 2 |
| 337 | 0001.0101.0001 | 297 | SPARE BIT | 2 |
| 338 | 0001.0101.0010 | 298 | SPARE BIT | 2 |
| 340 | 0001.0101.0100 | 299 | SPARE BIT | 2 |
| 341 | 0001.0101.0101 | 300 | SPARE BIT | 2 |
| 533 | 0010.0001.0101 | 301 | SPARE BIT | 2 |
| 554 | 0010.0010.1010 | 302 | SPARE BIT | 2 |
| 596 | 0010.0101.0100 | 303 | SPARE BIT | 2 |
| 597 | 0010.0101.0101 | 304 | SPARE BIT | 2 |
| 661 | 0010.1001.0101 | 305 | SPARE BIT | 2 |
| 672 | 0010.1010.0000 | 306 | SPARE BIT | 2 |
| 673 | 0010.1010.0001 | 307 | SPARE BIT | 2 |
| 674 | 0010.1010.0010 | 308 | SPARE BIT | 2 |
| 676 | 0010.1010.0100 | 309 | SPARE BIT | 2 |
| 677 | 0010.1010.0101 | 310 | SPARE BIT | 2 |
| 680 | 0010.1010.1000 | 311 | SPARE BIT | 2 |
| 681 | 0010.1010.1001 | 312 | SPARE BIT | 2 |
| 682 | 0010.1010.1010 | 313 | SPARE BIT | 2 |
| 1045 | 0100.0001.0101 | 314 | SPARE BIT | 2 |
| 1066 | 0100.0010.1010 | 315 | SPARE BIT | 2 |
| 1108 | 0100.0101.0100 | 316 | SPARE BIT | 2 |
| 1109 | 0100.0101.0101 | 317 | SPARE BIT | 2 |
| 1173 | 0100.1001.0101 | 318 | SPARE BIT | 2 |
| 1192 | 0100.1010.1000 | 319 | SPARE BIT | 2 |
| 1193 | 0100.1010.1001 | 320 | SPARE BIT | 2 |
| 1194 | 0100.1010.1010 | 321 | SPARE BIT | 2 |
| 1301 | 0101.0001.0101 | 322 | SPARE BIT | 2 |
| 1322 | 0101.0010.1010 | 323 | SPARE BIT | 2 |
| 1344 | 0101.0100.0000 | 324 | SPARE BIT | 2 |
| 1345 | 0101.0100.0001 | 325 | SPARE BIT | 2 |
| 1346 | 0101.0100.0010 | 326 | SPARE BIT | 2 |
| 1348 | 0101.0100.0100 | 327 | SPARE BIT | 2 |
| 1349 | 0101.0100.0101 | 328 | SPARE BIT | 2 |
| 1352 | 0101.0100.1000 | 329 | SPARE BIT | 2 |
| 1353 | 0101.0100.1001 | 330 | SPARE BIT | 2 |
| 1354 | 0101.0100.1010 | 331 | SPARE BIT | 2 |
| 1360 | 0101.0101.0000 | 332 | SPARE BIT | 2 |
| 1361 | 0101.0101.0001 | 333 | SPARE BIT | 2 |
| 1362 | 0101.0101.0010 | 334 | SPARE BIT | 2 |
| 1364 | 0101.0101.0100 | 335 | SPARE BIT | 2 |
| 1365 | 0101.0101.0101 | 336 | SPARE BIT | 2 |
| 2069 | 1000.0001.0101 | 337 | SPARE BIT | 2 |
| 2090 | 1000.0010.1010 | 338 | SPARE BIT | 2 |
| 2132 | 1000.0101.0100 | 339 | SPARE BIT | 2 |
| 2133 | 1000.0101.0101 | 340 | SPARE BIT | 2 |
| 2197 | 1000.1001.0101 | 341 | SPARE BIT | 2 |
| 2216 | 1000.1010.1000 | 342 | SPARE BIT | 2 |
| 2217 | 1000.1010.1001 | 343 | SPARE BIT | 2 |
| 2218 | 1000.1010.1010 | 344 | SPARE BIT | 2 |

FIG. 47

| 2325 | 1001.0001.0101 | 345 | SPARE BIT | 2 |
|------|----------------|-----|-----------|---|
| 2346 | 1001.0010.1010 | 346 | SPARE BIT | 2 |
| 2384 | 1001.0101.0000 | 347 | SPARE BIT | 2 |
| 2385 | 1001.0101.0001 | 348 | SPARE BIT | 2 |
| 2386 | 1001.0101.0010 | 349 | SPARE BIT | 2 |
| 2388 | 1001.0101.0100 | 350 | SPARE BIT | 2 |
| 2389 | 1001.0101.0101 | 351 | SPARE BIT | 2 |
| 2581 | 1010.0001.0101 | 352 | SPARE BIT | 2 |
| 2602 | 1010.0010.1010 | 353 | SPARE BIT | 2 |
| 2644 | 1010.0101.0100 | 354 | SPARE BIT | 2 |
| 2645 | 1010.0101.0101 | 355 | SPARE BIT | 2 |
| 2688 | 1010.1000.0000 | 356 | SPARE BIT | 2 |
| 2689 | 1010.1000.0001 | 357 | SPARE BIT | 2 |
| 2690 | 1010.1000.0010 | 358 | SPARE BIT | 2 |
| 2692 | 1010.1000.0100 | 359 | SPARE BIT | 2 |
| 2693 | 1010.1000.0101 | 360 | SPARE BIT | 2 |
| 2696 | 1010.1000.1000 | 361 | SPARE BIT | 2 |
| 2697 | 1010.1000.1001 | 362 | SPARE BIT | 2 |
| 2698 | 1010.1000.1010 | 363 | SPARE BIT | 2 |
| 2704 | 1010.1001.0000 | 364 | SPARE BIT | 2 |
| 2705 | 1010.1001.0001 | 365 | SPARE BIT | 2 |
| 2706 | 1010.1001.0010 | 366 | SPARE BIT | 2 |
| 2708 | 1010.1001.0100 | 367 | SPARE BIT | 2 |
| 2709 | 1010.1001.0101 | 368 | SPARE BIT | 2 |
| 2720 | 1010.1010.0000 | 369 | SPARE BIT | 2 |
| 2721 | 1010.1010.0001 | 370 | SPARE BIT | 2 |
| 2722 | 1010.1010.0010 | 371 | SPARE BIT | 2 |
| 2724 | 1010.1010.0100 | 372 | SPARE BIT | 2 |
| 2725 | 1010.1010.0101 | 373 | SPARE BIT | 2 |
| 2728 | 1010.1010.1000 | 374 | SPARE BIT | 2 |
| 2729 | 1010.1010.1001 | 375 | SPARE BIT | 2 |
| 2730 | 1010.1010.1010 | 376 | SPARE BIT | 2 |

FIG. 48

| BEFORE CONVERSION | | AFTER CONVERSION | | RISK |
|---|---|---|---|---|
| TRIMMING VALUE (DECIMAL) | TRIMMING PATTERN (BINARY) | TRIMMING SIGNAL | | |
| | | DECIMAL | BINARY | |
| 21 | 000.0001.0101 | 11 | 0000.1011 | 2 |
| 42 | 000.0010.1010 | 12 | 0000.1100 | 2 |
| 84 | 000.0101.0100 | 13 | 0000.1101 | 2 |
| 85 | 000.0101.0101 | 14 | 0000.1110 | 2 |
| 149 | 000.1001.0101 | 15 | 0000.1111 | 2 |
| 168 | 000.1010.1000 | 16 | 0001.0000 | 2 |
| 169 | 000.1010.1001 | 17 | 0001.0001 | 2 |
| 170 | 000.1010.1010 | 18 | 0001.0010 | 2 |
| 277 | 001.0001.0101 | 19 | 0001.0011 | 2 |
| 298 | 001.0010.1010 | 20 | 0001.0100 | 2 |
| 336 | 001.0101.0000 | 21 | 0001.0101 | 2 |
| 337 | 001.0101.0001 | 22 | 0001.0110 | 2 |
| 338 | 001.0101.0010 | 23 | 0001.0111 | 2 |
| 340 | 001.0101.0100 | 24 | 0001.1000 | 2 |
| 341 | 001.0101.0101 | 25 | 0001.1001 | 2 |
| 533 | 010.0001.0101 | 26 | 0001.1010 | 2 |
| 554 | 010.0010.1010 | 27 | 0001.1011 | 2 |
| 596 | 010.0101.0100 | 28 | 0001.1100 | 2 |
| 597 | 010.0101.0101 | 29 | 0001.1101 | 2 |
| 661 | 010.1001.0101 | 30 | 0001.1110 | 2 |
| 672 | 010.1010.0000 | 31 | 0001.1111 | 2 |
| 673 | 010.1010.0001 | 32 | 0010.0000 | 2 |
| 674 | 010.1010.0010 | 33 | 0010.0001 | 2 |
| 676 | 010.1010.0100 | 34 | 0010.0010 | 2 |
| 677 | 010.1010.0101 | 35 | 0010.0011 | 2 |
| 680 | 010.1010.1000 | 36 | 0010.0100 | 2 |
| 5 | 000.0000.0101 | 37 | 0010.0101 | 1 |
| 10 | 000.0000.1010 | 38 | 0010.0110 | 1 |
| 20 | 000.0001.0100 | 39 | 0010.0111 | 1 |
| 37 | 000.0010.0101 | 40 | 0010.1000 | 1 |
| 40 | 000.0010.1000 | 41 | 0010.1001 | 1 |
| 41 | 000.0010.1001 | 42 | 0010.1010 | 1 |
| 69 | 000.0100.0101 | 43 | 0010.1011 | 1 |
| 74 | 000.0100.1010 | 44 | 0010.1100 | 1 |
| 80 | 000.0101.0000 | 45 | 0010.1101 | 1 |
| 81 | 000.0101.0001 | 46 | 0010.1110 | 1 |
| 82 | 000.0101.0010 | 47 | 0010.1111 | 1 |
| 133 | 000.1000.0101 | 48 | 0011.0000 | 1 |
| 138 | 000.1000.1010 | 49 | 0011.0001 | 1 |
| 148 | 000.1001.0100 | 50 | 0011.0010 | 1 |
| 160 | 000.1010.0000 | 51 | 0011.0011 | 1 |
| 161 | 000.1010.0001 | 52 | 0011.0100 | 1 |
| 162 | 000.1010.0010 | 53 | 0011.0101 | 1 |
| 164 | 000.1010.0100 | 54 | 0011.0110 | 1 |
| 165 | 000.1010.0101 | 55 | 0011.0111 | 1 |
| 261 | 001.0000.0101 | 56 | 0011.1000 | 1 |
| 266 | 001.0000.1010 | 57 | 0011.1001 | 1 |
| 276 | 001.0001.0100 | 58 | 0011.1010 | 1 |
| 293 | 001.0010.0101 | 59 | 0011.1011 | 1 |
| 296 | 001.0010.1000 | 60 | 0011.1100 | 1 |
| 297 | 001.0010.1001 | 61 | 0011.1101 | 1 |
| 320 | 001.0100.0000 | 62 | 0011.1110 | 1 |
| 321 | 001.0100.0001 | 63 | 0011.1111 | 1 |
| 322 | 001.0100.0010 | 64 | 0100.0000 | 1 |
| 324 | 001.0100.0100 | 65 | 0100.0001 | 1 |
| 325 | 001.0100.0101 | 66 | 0100.0010 | 1 |

FIG. 49

| | | | | |
|---|---|---|---|---|
| 328 | 001.0100.1000 | 67 | 0100.0011 | 1 |
| 329 | 001.0100.1001 | 68 | 0100.0100 | 1 |
| 330 | 001.0100.1010 | 69 | 0100.0101 | 1 |
| 517 | 010.0000.0101 | 70 | 0100.0110 | 1 |
| 522 | 010.0000.1010 | 71 | 0100.0111 | 1 |
| 532 | 010.0001.0100 | 72 | 0100.1000 | 1 |
| 549 | 010.0010.0101 | 73 | 0100.1001 | 1 |
| 552 | 010.0010.1000 | 74 | 0100.1010 | 1 |
| 553 | 010.0010.1001 | 75 | 0100.1011 | 1 |
| 581 | 010.0100.0101 | 76 | 0100.1100 | 1 |
| 586 | 010.0100.1010 | 77 | 0100.1101 | 1 |
| 592 | 010.0101.0000 | 78 | 0100.1110 | 1 |
| 593 | 010.0101.0001 | 79 | 0100.1111 | 1 |
| 594 | 010.0101.0010 | 80 | 0101.0000 | 1 |
| 640 | 010.1000.0000 | 81 | 0101.0001 | 1 |
| 641 | 010.1000.0001 | 82 | 0101.0010 | 1 |
| 642 | 010.1000.0010 | 83 | 0101.0011 | 1 |
| 0 | 000.0000.0000 | 84 | 0101.0100 | 0 |
| 1 | 000.0000.0001 | 85 | 0101.0101 | 0 |
| 2 | 000.0000.0010 | 86 | 0101.0110 | 0 |
| 4 | 000.0000.0100 | 87 | 0101.0111 | 0 |
| 8 | 000.0000.1000 | 88 | 0101.1000 | 0 |
| 9 | 000.0000.1001 | 89 | 0101.1001 | 0 |
| 16 | 000.0001.0000 | 90 | 0101.1010 | 0 |
| 17 | 000.0001.0001 | 91 | 0101.1011 | 0 |
| 18 | 000.0001.0010 | 92 | 0101.1100 | 0 |
| 32 | 000.0010.0000 | 93 | 0101.1101 | 0 |
| 33 | 000.0010.0001 | 94 | 0101.1110 | 0 |
| 34 | 000.0010.0010 | 95 | 0101.1111 | 0 |
| 36 | 000.0010.0100 | 96 | 0110.0000 | 0 |
| 64 | 000.0100.0000 | 97 | 0110.0001 | 0 |
| 65 | 000.0100.0001 | 98 | 0110.0010 | 0 |
| 66 | 000.0100.0010 | 99 | 0110.0011 | 0 |
| 68 | 000.0100.0100 | 100 | 0110.0100 | 0 |
| 72 | 000.0100.1000 | 101 | 0110.0101 | 0 |
| 73 | 000.0100.1001 | 102 | 0110.0110 | 0 |
| 128 | 000.1000.0000 | 103 | 0110.0111 | 0 |
| 129 | 000.1000.0001 | 104 | 0110.1000 | 0 |
| 130 | 000.1000.0010 | 105 | 0110.1001 | 0 |
| 132 | 000.1000.0100 | 106 | 0110.1010 | 0 |
| 136 | 000.1000.1000 | 107 | 0110.1011 | 0 |
| 137 | 000.1000.1001 | 108 | 0110.1100 | 0 |
| 144 | 000.1001.0000 | 109 | 0110.1101 | 0 |
| 145 | 000.1001.0001 | 110 | 0110.1110 | 0 |
| 146 | 000.1001.0010 | 111 | 0110.1111 | 0 |
| 256 | 001.0000.0000 | 112 | 0111.0000 | 0 |
| 257 | 001.0000.0001 | 113 | 0111.0001 | 0 |
| 258 | 001.0000.0010 | 114 | 0111.0010 | 0 |
| 260 | 001.0000.0100 | 115 | 0111.0011 | 0 |
| 264 | 001.0000.1000 | 116 | 0111.0100 | 0 |
| 265 | 001.0000.1001 | 117 | 0111.0101 | 0 |
| 272 | 001.0001.0000 | 118 | 0111.0110 | 0 |
| 273 | 001.0001.0001 | 119 | 0111.0111 | 0 |
| 274 | 001.0001.0010 | 120 | 0111.1000 | 0 |
| 288 | 001.0010.0000 | 121 | 0111.1001 | 0 |
| 289 | 001.0010.0001 | 122 | 0111.1010 | 0 |
| 290 | 001.0010.0010 | 123 | 0111.1011 | 0 |
| 292 | 001.0010.0100 | 124 | 0111.1100 | 0 |
| 512 | 010.0000.0000 | 125 | 0111.1101 | 0 |

FIG. 50

| | | | | |
|---|---|---|---|---|
| 513 | 010.0000.0001 | 126 | 0111.1110 | 0 |
| 514 | 010.0000.0010 | 127 | 0111.1111 | 0 |
| 516 | 010.0000.0100 | 128 | 1000.0000 | 0 |
| 520 | 010.0000.1000 | 129 | 1000.0001 | 0 |
| 521 | 010.0000.1001 | 130 | 1000.0010 | 0 |
| 528 | 010.0001.0000 | 131 | 1000.0011 | 0 |
| 529 | 010.0001.0001 | 132 | 1000.0100 | 0 |
| 530 | 010.0001.0010 | 133 | 1000.0101 | 0 |
| 544 | 010.0010.0000 | 134 | 1000.0110 | 0 |
| 545 | 010.0010.0001 | 135 | 1000.0111 | 0 |
| 546 | 010.0010.0010 | 136 | 1000.1000 | 0 |
| 548 | 010.0010.0100 | 137 | 1000.1001 | 0 |
| 576 | 010.0100.0000 | 138 | 1000.1010 | 0 |
| 577 | 010.0100.0001 | 139 | 1000.1011 | 0 |
| 578 | 010.0100.0010 | 140 | 1000.1100 | 0 |
| 580 | 010.0100.0100 | 141 | 1000.1101 | 0 |
| 584 | 010.0100.1000 | 142 | 1000.1110 | 0 |
| 585 | 010.0100.1001 | 143 | 1000.1111 | 0 |
| 1024 | 100.0000.0000 | 144 | 1001.0000 | 0 |
| 1025 | 100.0000.0001 | 145 | 1001.0001 | 0 |
| 1026 | 100.0000.0010 | 146 | 1001.0010 | 0 |
| 1028 | 100.0000.0100 | 147 | 1001.0011 | 0 |
| 1032 | 100.0000.1000 | 148 | 1001.0100 | 0 |
| 1033 | 100.0000.1001 | 149 | 1001.0101 | 0 |
| 1040 | 100.0001.0000 | 150 | 1001.0110 | 0 |
| 1041 | 100.0001.0001 | 151 | 1001.0111 | 0 |
| 1042 | 100.0001.0010 | 152 | 1001.1000 | 0 |
| 1056 | 100.0010.0000 | 153 | 1001.1001 | 0 |
| 1057 | 100.0010.0001 | 154 | 1001.1010 | 0 |
| 1058 | 100.0010.0010 | 155 | 1001.1011 | 0 |
| 1060 | 100.0010.0100 | 156 | 1001.1100 | 0 |
| 1088 | 100.0100.0000 | 157 | 1001.1101 | 0 |
| 1089 | 100.0100.0001 | 158 | 1001.1110 | 0 |
| 1090 | 100.0100.0010 | 159 | 1001.1111 | 0 |
| 1092 | 100.0100.0100 | 160 | 1010.0000 | 0 |
| 1096 | 100.0100.1000 | 161 | 1010.0001 | 0 |
| 1097 | 100.0100.1001 | 162 | 1010.0010 | 0 |
| 1152 | 100.1000.0000 | 163 | 1010.0011 | 0 |
| 1153 | 100.1000.0001 | 164 | 1010.0100 | 0 |
| 1154 | 100.1000.0010 | 165 | 1010.0101 | 0 |
| 1156 | 100.1000.0100 | 166 | 1010.0110 | 0 |
| 1160 | 100.1000.1000 | 167 | 1010.0111 | 0 |
| 1161 | 100.1000.1001 | 168 | 1010.1000 | 0 |
| 1168 | 100.1001.0000 | 169 | 1010.1001 | 0 |
| 1169 | 100.1001.0001 | 170 | 1010.1010 | 0 |
| 1170 | 100.1001.0010 | 171 | 1010.1011 | 0 |
| 644 | 010.1000.0100 | 172 | 1010.1100 | 1 |
| 645 | 010.1000.0101 | 173 | 1010.1101 | 1 |
| 648 | 010.1000.1000 | 174 | 1010.1110 | 1 |
| 649 | 010.1000.1001 | 175 | 1010.1111 | 1 |
| 650 | 010.1000.1010 | 176 | 1011.0000 | 1 |
| 656 | 010.1001.0000 | 177 | 1011.0001 | 1 |
| 657 | 010.1001.0001 | 178 | 1011.0010 | 1 |
| 658 | 010.1001.0010 | 179 | 1011.0011 | 1 |
| 660 | 010.1001.0100 | 180 | 1011.0100 | 1 |
| 1029 | 100.0000.0101 | 181 | 1011.0101 | 1 |
| 1034 | 100.0000.1010 | 182 | 1011.0110 | 1 |
| 1044 | 100.0001.0100 | 183 | 1011.0111 | 1 |
| 1061 | 100.0010.0101 | 184 | 1011.1000 | 1 |

FIG. 51

| | | | | |
|---|---|---|---|---|
| 1064 | 100.0010.1000 | 185 | 1011.1001 | 1 |
| 1065 | 100.0010.1001 | 186 | 1011.1010 | 1 |
| 1093 | 100.0100.0101 | 187 | 1011.1011 | 1 |
| 1098 | 100.0100.1010 | 188 | 1011.1100 | 1 |
| 1104 | 100.0101.0000 | 189 | 1011.1101 | 1 |
| 1105 | 100.0101.0001 | 190 | 1011.1110 | 1 |
| 1106 | 100.0101.0010 | 191 | 1011.1111 | 1 |
| 1157 | 100.1000.0101 | 192 | 1100.0000 | 1 |
| 1162 | 100.1000.1010 | 193 | 1100.0001 | 1 |
| 1172 | 100.1001.0100 | 194 | 1100.0010 | 1 |
| 1184 | 100.1010.0000 | 195 | 1100.0011 | 1 |
| 1185 | 100.1010.0001 | 196 | 1100.0100 | 1 |
| 1186 | 100.1010.0010 | 197 | 1100.0101 | 1 |
| 1188 | 100.1010.0100 | 198 | 1100.0110 | 1 |
| 1189 | 100.1010.0101 | 199 | 1100.0111 | 1 |
| 1280 | 101.0000.0000 | 200 | 1100.1000 | 1 |
| 1281 | 101.0000.0001 | 201 | 1100.1001 | 1 |
| 1282 | 101.0000.0010 | 202 | 1100.1010 | 1 |
| 1284 | 101.0000.0100 | 203 | 1100.1011 | 1 |
| 1285 | 101.0000.0101 | 204 | 1100.1100 | 1 |
| 1288 | 101.0000.1000 | 205 | 1100.1101 | 1 |
| 1289 | 101.0000.1001 | 206 | 1100.1110 | 1 |
| 1290 | 101.0000.1010 | 207 | 1100.1111 | 1 |
| 1296 | 101.0001.0000 | 208 | 1101.0000 | 1 |
| 1297 | 101.0001.0001 | 209 | 1101.0001 | 1 |
| 1298 | 101.0001.0010 | 210 | 1101.0010 | 1 |
| 1300 | 101.0001.0100 | 211 | 1101.0011 | 1 |
| 1312 | 101.0010.0000 | 212 | 1101.0100 | 1 |
| 1313 | 101.0010.0001 | 213 | 1101.0101 | 1 |
| 1314 | 101.0010.0010 | 214 | 1101.0110 | 1 |
| 1316 | 101.0010.0100 | 215 | 1101.0111 | 1 |
| 1317 | 101.0010.0101 | 216 | 1101.1000 | 1 |
| 1320 | 101.0010.1000 | 217 | 1101.1001 | 1 |
| 1321 | 101.0010.1001 | 218 | 1101.1010 | 1 |
| 681 | 010.1010.1001 | 219 | 1101.1011 | 2 |
| 682 | 010.1010.1010 | 220 | 1101.1100 | 2 |
| 1045 | 100.0001.0101 | 221 | 1101.1101 | 2 |
| 1066 | 100.0010.1010 | 222 | 1101.1110 | 2 |
| 1108 | 100.0101.0100 | 223 | 1101.1111 | 2 |
| 1109 | 100.0101.0101 | 224 | 1110.0000 | 2 |
| 1173 | 100.1001.0101 | 225 | 1110.0001 | 2 |
| 1192 | 100.1010.1000 | 226 | 1110.0010 | 2 |
| 1193 | 100.1010.1001 | 227 | 1110.0011 | 2 |
| 1194 | 100.1010.1010 | 228 | 1110.0100 | 2 |
| 1301 | 101.0001.0101 | 229 | 1110.0101 | 2 |
| 1322 | 101.0010.1010 | 230 | 1110.0110 | 2 |
| 1344 | 101.0100.0000 | 231 | 1110.0111 | 2 |
| 1345 | 101.0100.0001 | 232 | 1110.1000 | 2 |
| 1346 | 101.0100.0010 | 233 | 1110.1001 | 2 |
| 1348 | 101.0100.0100 | 234 | 1110.1010 | 2 |
| 1349 | 101.0100.0101 | 235 | 1110.1011 | 2 |
| 1352 | 101.0100.1000 | 236 | 1110.1100 | 2 |
| 1353 | 101.0100.1001 | 237 | 1110.1101 | 2 |
| 1354 | 101.0100.1010 | 238 | 1110.1110 | 2 |
| 1360 | 101.0101.0000 | 239 | 1110.1111 | 2 |
| 1361 | 101.0101.0001 | 240 | 1111.0000 | 2 |
| 1362 | 101.0101.0010 | 241 | 1111.0001 | 2 |
| 1364 | 101.0101.0100 | 242 | 1111.0010 | 2 |
| 1365 | 101.0101.0101 | 243 | 1111.0011 | 2 |

FIG. 52

| BEFORE CONVERSION | | AFTER CONVERSION | | |
|---|---|---|---|---|
| TRIMMING VALUE (DECIMAL) | TRIMMING PATTERN (BINARY) | TRIMMING SIGNAL | | |
| | | DECIMAL | BINARY | OTHERS |
| 0 | 000000 | 1 | 0001 | |
| 1 | 000001 | 2 | 0010 | |
| 2 | 000010 | 3 | 0011 | |
| 3 | 000011 | – | – | UNUSABLE |
| 4 | 000100 | 4 | 0100 | |
| 5 | 000101 | – | – | UNUSABLE |
| 6 | 000110 | – | – | UNUSABLE |
| 7 | 000111 | – | – | UNUSABLE |
| 8 | 001000 | 5 | 0101 | |
| 9 | 001001 | 6 | 0110 | |
| 10 | 001010 | – | – | UNUSABLE |
| 11 | 001011 | – | – | UNUSABLE |
| 12 | 001100 | – | – | UNUSABLE |
| 13 | 001101 | – | – | UNUSABLE |
| 14 | 001110 | – | – | UNUSABLE |
| 15 | 001111 | – | – | UNUSABLE |
| 16 | 010000 | 7 | 0111 | |
| 17 | 010001 | 8 | 1000 | |
| 18 | 010010 | 9 | 1001 | |
| 19 | 010011 | – | – | UNUSABLE |
| 20 | 010100 | – | – | UNUSABLE |
| 21 | 010101 | – | – | UNUSABLE |
| 22 | 010110 | – | – | UNUSABLE |
| 23 | 010111 | – | – | UNUSABLE |
| 24 | 011000 | – | – | UNUSABLE |
| 25 | 011001 | – | – | UNUSABLE |
| 26 | 011010 | – | – | UNUSABLE |
| 27 | 011011 | – | – | UNUSABLE |
| 28 | 011100 | – | – | UNUSABLE |
| 29 | 011101 | – | – | UNUSABLE |
| 30 | 011110 | – | – | UNUSABLE |
| 31 | 011111 | – | – | UNUSABLE |
| 32 | 100000 | 10 | 1010 | |
| 33 | 100001 | 11 | 1011 | |
| 34 | 100010 | 12 | 1100 | |
| 35 | 100011 | – | – | UNUSABLE |
| 36 | 100100 | 13 | 1101 | |
| 37 | 100101 | – | – | UNUSABLE |
| 38 | 100110 | – | – | UNUSABLE |
| 39 | 100111 | – | – | UNUSABLE |
| 40 | 101000 | – | – | UNUSABLE |
| 41 | 101001 | – | – | UNUSABLE |
| 42 | 101010 | – | – | UNUSABLE |

·TRIMMING VALUE 43 AND LATER ARE UNUSABLE AND THEREFORE OMITTED

·EXAMPLE OF MODIFICATION OF FIG. 13 AND SHIFTING OUTPUT CENTRAL VALUE IN ACCORDANCE WITH NORMAL DISTRIBUTION

FIG. 53

| CONVERTED OUTPUT PATTERN | | R1 | R2 | R3 | R4 | TOTAL RESISTANCE VALUE | |
|---|---|---|---|---|---|---|---|
| | | | | | | EXAMPLE OF USE OF LOWER RISK (FROM CONVERTED OUTPUT OF FIG. 10) | EXAMPLE OF SHIFTING OUTPUT CENTRAL VALUE IN ACCORDANCE WITH NORMAL DISTRIBUTION (FROM CONVERTED OUTPUT OF FIG. 13') |
| 0 | 0000 | OFF | OFF | OFF | OFF | R0+R1+R2+R3+R4 | --- |
| 1 | 0001 | OFF | OFF | OFF | ON | R0+R1+R2+R3 | R0+R1+R2+R3 |
| 2 | 0010 | OFF | OFF | ON | OFF | R0+R1+R2+R4 | R0+R1+R2+R4 |
| 3 | 0011 | OFF | OFF | ON | ON | R0+R1+R2 | R0+R1+R2 |
| 4 | 0100 | OFF | ON | OFF | OFF | R0+R1+R3+R4 | R0+R1+R3+R4 |
| 5 | 0101 | OFF | ON | OFF | ON | R0+R1+R3 | R0+R1+R3 |
| 6 | 0110 | OFF | ON | ON | OFF | R0+R1+R4 | R0+R1+R4 |
| 7 | 0111 | OFF | ON | ON | ON | R0+R1 | R0+R1 |
| 8 | 1000 | ON | OFF | OFF | OFF | R0+R2+R3+R4 | R0+R2+R3+R4 |
| 9 | 1001 | ON | OFF | OFF | ON | R0+R2+R3 | R0+R2+R3 |
| 10 | 1010 | ON | OFF | ON | OFF | R0+R2+R4 | R0+R2+R4 |
| 11 | 1011 | ON | OFF | ON | ON | R0+R2 | R0+R2 |
| 12 | 1100 | ON | ON | OFF | OFF | R0+R3+R4 | R0+R3+R4 |
| 13 | 1101 | ON | ON | OFF | ON | R0+R3 | R0+R3 |
| 14 | 1110 | ON | ON | ON | OFF | R0+R4 | --- |
| 15 | 1111 | ON | ON | ON | ON | R0 | --- |

FIG. 54

| VARIATION | R0 | R1 | R2 | R3 | R4 | | RESISTANCE COMBINATION | RESISTANCE VALUE BETWEEN a-b (VARIATION IN RESISTANCE: -7.5%) |
|---|---|---|---|---|---|---|---|---|
| 0.925 | 86.025 | 7.4 | 3.7 | 1.85 | 0.925 | | | |
| | 0 | 0000 | OFF | OFF | OFF | OFF | R0+R1+R2+R3+R4 | 99.9 |
| | 1 | 0001 | OFF | OFF | OFF | ON | R0+R1+R2+R3 | 98.975 |
| | 2 | 0010 | OFF | OFF | ON | OFF | R0+R1+R2+R4 | 98.05 |
| | 3 | 0011 | OFF | OFF | ON | ON | R0+R1+R2 | 97.125 |
| | 4 | 0100 | OFF | ON | OFF | OFF | R0+R1+R3+R4 | 96.2 |
| | 5 | 0101 | OFF | ON | OFF | ON | R0+R1+R3 | 95.275 |
| | 6 | 0110 | OFF | ON | ON | OFF | R0+R1+R4 | 94.35 |
| | 7 | 0111 | OFF | ON | ON | ON | R0+R1 | 93.425 |
| | 8 | 1000 | ON | OFF | OFF | OFF | R0+R2+R3+R4 | 92.5 |
| | 9 | 1001 | ON | OFF | OFF | ON | R0+R2+R3 | 91.575 |
| | 10 | 1010 | ON | OFF | ON | OFF | R0+R2+R4 | 90.65 |
| | 11 | 1011 | ON | OFF | ON | ON | R0+R2 | 89.725 |
| | 12 | 1100 | ON | ON | OFF | OFF | R0+R3+R4 | 88.8 |
| | 13 | 1101 | ON | ON | OFF | ON | R0+R3 | 87.875 |
| | 14 | 1110 | ON | ON | ON | OFF | R0+R4 | 86.95 |
| | 15 | 1111 | ON | ON | ON | ON | R0 | 86.025 |

| VARIATION | R0 | R1 | R2 | R3 | R4 | | RESISTANCE COMBINATION | RESISTANCE VALUE BETWEEN a-b (VARIATION IN RESISTANCE: +7.5%) |
|---|---|---|---|---|---|---|---|---|
| 1.075 | 99.975 | 8.6 | 4.3 | 2.15 | 1.075 | | | |
| | 0 | 0000 | OFF | OFF | OFF | OFF | R0+R1+R2+R3+R4 | 116.1 |
| | 1 | 0001 | OFF | OFF | OFF | ON | R0+R1+R2+R3 | 115.025 |
| | 2 | 0010 | OFF | OFF | ON | OFF | R0+R1+R2+R4 | 113.95 |
| | 3 | 0011 | OFF | OFF | ON | ON | R0+R1+R2 | 112.875 |
| | 4 | 0100 | OFF | ON | OFF | OFF | R0+R1+R3+R4 | 111.8 |
| | 5 | 0101 | OFF | ON | OFF | ON | R0+R1+R3 | 110.725 |
| | 6 | 0110 | OFF | ON | ON | OFF | R0+R1+R4 | 109.65 |
| | 7 | 0111 | OFF | ON | ON | ON | R0+R1 | 108.575 |
| | 8 | 1000 | ON | OFF | OFF | OFF | R0+R2+R3+R4 | 107.5 |
| | 9 | 1001 | ON | OFF | OFF | ON | R0+R2+R3 | 106.425 |
| | 10 | 1010 | ON | OFF | ON | OFF | R0+R2+R4 | 105.35 |
| | 11 | 1011 | ON | OFF | ON | ON | R0+R2 | 104.275 |
| | 12 | 1100 | ON | ON | OFF | OFF | R0+R3+R4 | 103.2 |
| | 13 | 1101 | ON | ON | OFF | ON | R0+R3 | 102.125 |
| | 14 | 1110 | ON | ON | ON | OFF | R0+R4 | 101.05 |
| | 15 | 1111 | ON | ON | ON | ON | R0 | 99.975 |

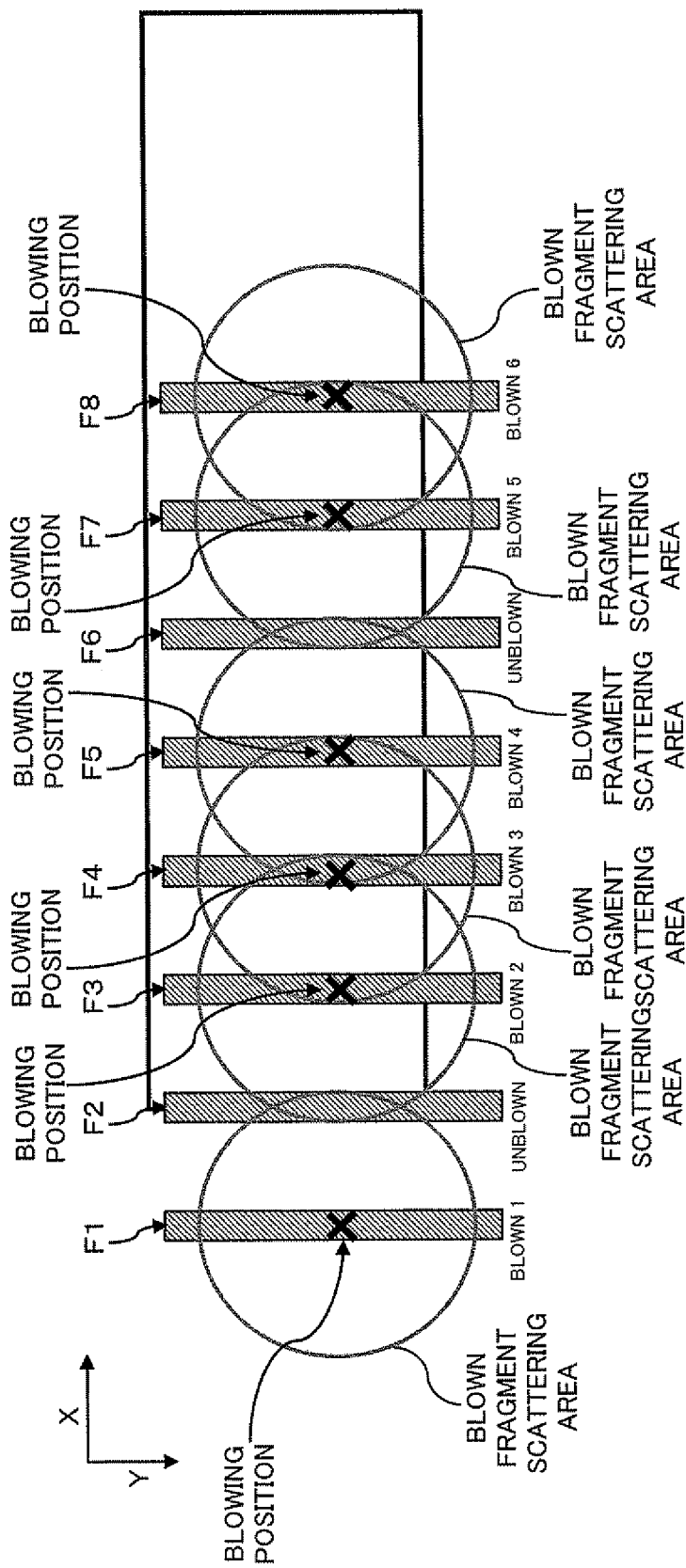

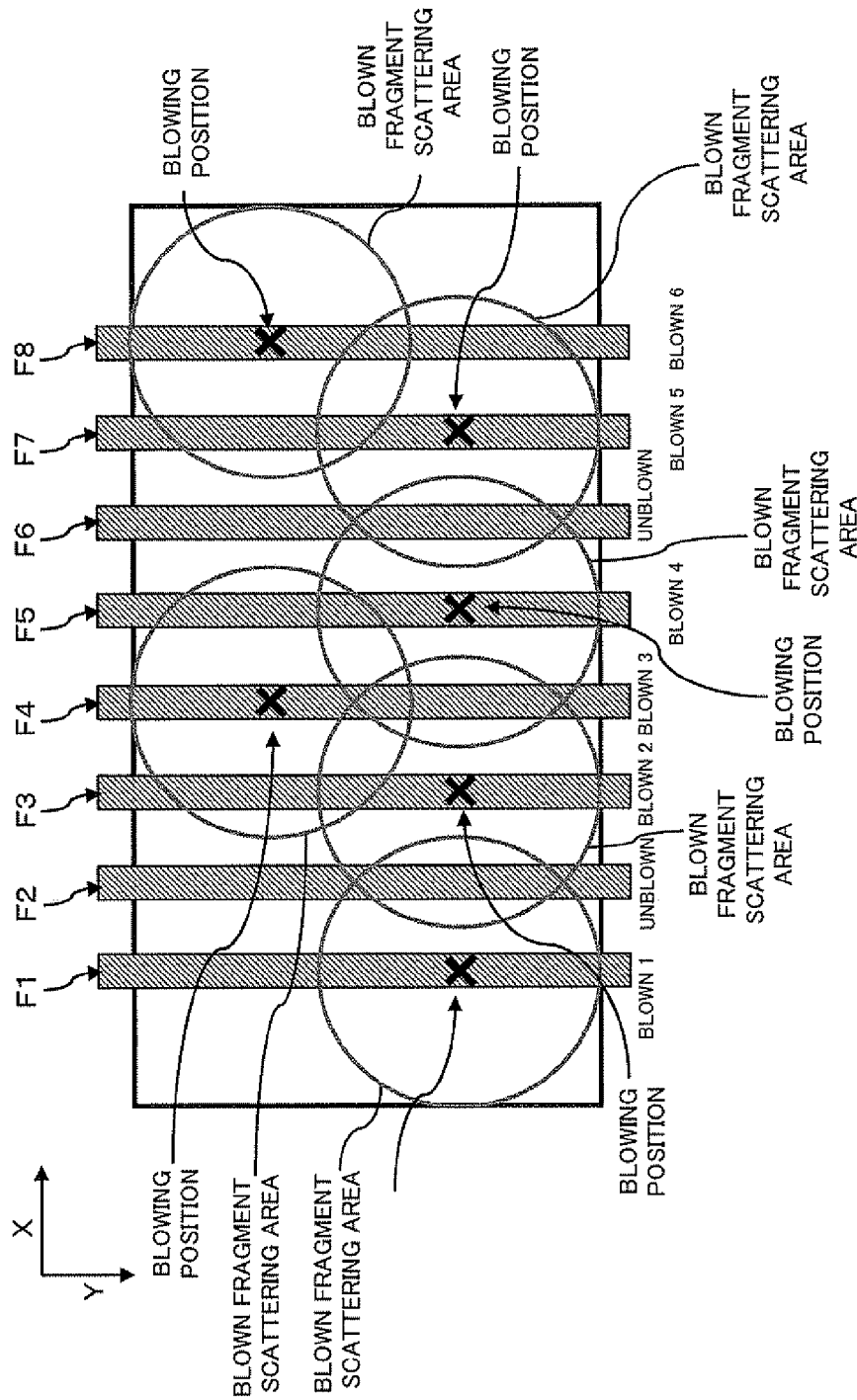

INTEGRATED CIRCUIT, AND APPARATUS AND METHOD FOR PRODUCTION THEREOF

BACKGROUND OF THE INVENTION (1) Field of the Invention

The present invention relates to an integrated circuit with a trimming circuit in which one or more blown object fuses arbitrary determined among a number of fuses arranged in alignment are blown, and an apparatus and a method for producing the integrated circuit.

(2) Description of Related Art

In accordance with micromachining in process, a demand arises for reduction in chip area of an integrated circuit. For an integrated circuit with a trimming circuit in which one or more blown object fuses arbitrary determined among a number of fuses arranged in alignment are blown, reduction in area of such a trimming circuit is also desired.

However, when a fuse in such a trimming circuit is blown, blown fragments scatter from the blown fuse in some cases. There is possibility that a blown fragment reestablishes a short circuit on another blown fuse if the fuses are arranged at shorter intervals than the scattering distance of blown fragments.

FIG. 55 shows an example of arrangement of fuse blowing positions of fuses in a trimming circuit of a conventional integrated circuit with a relationship between a fuse blowing position and a blown fragment scattering area caused from the blowing of the fuse. In the example shown in FIG. 55, the distance between two adjacent fuses is smaller than a blown fragment scattering distance. The trimming circuit in FIG. 55 includes eight fuses (F1-F8) are arranged in parallel with one another at the same intervals and assumes that fuses F1, F3-F5, F7, and F8 are to be blown.

Since the distance between two adjacent fuses is smaller than a blown fragment scattering distance in FIG. 55, in sequentially blowing the blown fuses in order from fuse F1 to fuse F8, blown fragments generated by blowing fuse F4 may reach fuses F3 and F5 and may reestablish short circuits on the blown position of blown fuses F3 and F5. In the same manner, blown fragments generated by blowing fuses F5 and F8 may reach fuses F4 and F7 respectively and may reestablish short circuits on the blown position of these blown fuses F4 and F7 respectively.

FIG. 56 shows another example of arrangement of fuse blowing positions of fuses in a trimming circuit of a conventional integrated circuit with a relationship between a fuse blowing position and a blown fragment scattering area caused from the blowing of the fuse. In this example shown in FIG. 56, the blowing positions of contiguous fuses are different in a direction (the Y direction) orthogonal to the arrangement direction (the X direction) of the fuses. In also FIG. 56, eight fuses (F1-F8) are arranged in parallel with one another at the same intervals and fuses F1, F3-F5, F7, and F8 are to be blown.

In conventional laser trimming which blows a fuse with a leaser, the circuit size in the X direction has been reduced by varying (offsetting) the blowing position of contiguous fuses in the Y direction to widen the distance between the blowing position between the contiguous fuses.

For example, Patent Reference 1 listed below alternates a first blowing position in the Y direction orthogonal to the fuse arrangement direction X with a second blowing position different in the orthogonal direction Y so that the intervals for fuses is narrowed to reduce the size occupied by the arrangement of the fuses.

Further, below Patent Reference 2 discloses that in blowing two or more fuse electrodes connected to one another in the X direction and arranged in the Y direction by laser beams emitted from the Z direction, two contiguous fuse electrodes are blown at different position in the Y direction to avoid to reestablish short circuit on the continuous fuses. In other words, such blowing manner prevents scattering fragments generated by blowing a fuse electrode from reestablishing short circuits on contiguous fuse electrodes.

Patent Reference 3 discloses that, in a structure in which one or more fuses each having the width b are arranged in substantially parallel with one another at intervals a and each blown object fuse is blown by irradiating by laser beams which forms an irradiation area with radius d and which has a permissive error h for the irradiation position, interval a is determined such that interval a, width b, radius d, permissive error h establishes a specific relationship in order to reduce the intervals of fuses and consequently reduces the arrangement area occupied by the fuses.

In another blowing method of electric trimming in which flow of electricity through a fuse generate a heat to blow the fuse, since it is difficult to control the blowing position in the orthogonal direction (the Y direction) to the direction (the X direction), fuses are arranged at wide intervals such that the distance between contiguous fuses comes to be larger than the scattering distance of blown fuse fragments. Namely, the following relationship is established:

Scattering distance $\leq$ X-direction fuse interval

FIG. 57 is a flow diagram showing a succession of procedural steps of virtually blowing method (steps A10-A60) performed on a trimming circuit of a conventional integrated circuit.

In the conventional virtually blowing method, upon completion of setting a counter value (in a binary code) in fuses that are to be blown and that is same in quantity as the bits of the binary counter value (step A10), the fuses representing the counter value are virtually blown (step A20) and a control object section is measured (step A30). A determination is then made as to whether the counter value terminates (step A40). If the result of the determination is negative (NO route in step A40), the counter value is updated (step A50) and then the procedure returns to step A20. The counter value is updated by, for example, Regular falsi method or Bisection method.

Conversely, if the judgment result is positive (Yes route in step A40), the fuses are actually blown with the usable trimming value corresponding to the counter value (step A60).

[Patent Reference 1] Japanese Patent Application Laid-Open (KOKAI) No. HEI 6-120349

[Patent Reference 2] Japanese Patent Application Laid-Open (KOKAI) No. 2001-274251

[Patent Reference 3] Japanese Patent Application Laid-Open (KOKAI) No. 2001-57388

Although the progress in the process technique realizes makes process restriction to narrow the distance between fuses, fuses should be arranged such that direct distance between blowing positions of contiguous fuses is wider than scattering distance blown fragments generated by blowing a fuse so that the blown fuse fragments caused by blowing a fuse does not reestablish a short circuit on another blown fuse adjacent to the first fuse because two contiguous fuses may be determined to be blown object fuses, resulting in reestablishment of a short circuit. That cannot make the fuse interval narrow enough to reduce the area occupied by the trimming circuit.

FIG. 58 illustrates an example of arrangement of fuses in a trimming circuit of a conventional integrated circuit, and specifically shows the relationship between a blowing position of a fuse and the blown fragment scattering area caused from blowing the fuse. In an example of FIG. 58, the distance between every two contiguous fuses are set to be larger than the blown fragment scattering distance. In also FIG. 58, eight fuses (F1-F8) are arranged in parallel with one another at the same intervals and fuses F1, F3-F5, F7, and F8 are to be blown.

In a general trimming circuit, one or more blown object fuses are determined in terms of, for example, the chip properties, and therefore every fuse in the trimming circuit can be a blown object fuse. For this reason, a trimming circuit in a conventional integrated circuit sets the direct direction between the blowing positions of every two contiguous fuses to be larger than the blown fuse fragment scattering distance. Such a direct distance is realized by widening the distance between two blowing points in the fuse arrangement direction (the X direction) as shown in FIG. 58, or by widening the distance between two blowing points both in the fuse arrangement direction (the X direction) and in the orthogonal direction (the Y direction) to the arrangement direction. Consequently, the trimming circuit requires a large occupation area.

The manner in which the blowing positions of contiguous fuses are varied (offset) in a direction (the Y direction) orthogonal to the arrangement direction (the X direction) of the fuses surely shown in FIG. 56 can narrow the fuse interval in the X direction but needs to stretch the blowing positions in the Y direction, so that the fuse circuit results in an increased occupation area. In particular, the larger bits (the larger number of bits to be set) the larger occupation area caused from stretching in the Y direction.

Even in addition of offset in the Y direction, since scattering distance restricts the distance between blowing positions, the distance between contiguous fuses cannot be set narrower than about the half the scattering distance.

In addition, it is difficult for electric trimming to adjust blowing positions of fuses as explained above, the fuse interval in the X direction cannot be set narrower than the blown fragment scattering distance even if desires to.

With the foregoing problems in view, the object of the present invention to reduce the occupation area of the trimming circuit by efficiently arranging blowing positions on fuses.

SUMMARY OF THE INVENTION

To attain the above object, as a first generic feature, there is provided an integrated circuit comprising: a trimming circuit including a plurality of fuses arranged in alignment among which one or more blown object fuses are blown according to a trimming value; a trimming signal creating section, disposed downstream of the trimming circuit, creating a trimming signal corresponding to the trimming value on the basis of a signal output from the trimming circuit, every two of the blown object fuses being arranged so as to be interposed by at least one un-blown fuse in the trimming circuit.

As a preferable feature, a trimming pattern may be generated by expressing the trimming value in a binary code; if the trimming pattern has a prohibition pattern, the trimming pattern may be regarded as an avoidance trimming pattern; if the trimming pattern does not include the prohibition pattern, the trimming pattern may be selected as a usable pattern; and when each of binary bits in the usable trimming pattern is associated with each of the plurality of fuses, one or more fuses associated with bit "1" in the usable trimming pattern may be set to be the blown object fuses.

As another preferable feature, one or more of the prohibition patterns may be prepared; one or more weights may be assigned one to each of the prohibition patterns; and the trimming pattern with the first prohibition pattern may be selected as the avoidance trimming pattern on the basis of the weight assigned to the first prohibition pattern included in the trimming pattern, so that the blown object fuses in the trimming circuit are determined.

As an additional feature, the trimming signal creating section may comprise a decoder decoding the signal output from the trimming signal and creating, as the result of the decoding, a signal corresponding to the usable trimming pattern. As a further preferable feature, the trimming signal creating section may further comprise an encoder encoding the signal created corresponding to the usable trimming pattern by the decoder and creating, as the result of the encoding, the trimming signal. As a still further preferable feature, the trimming signal creating section may be a logic circuit.

As a still further preferable feature, the trimming signal creating section may comprise a partial converting circuit creating the trimming signal based on a part of the signal output from the trimming circuit, and the partial conversion circuit may convert one or more lower bits representing a redundant pattern in the signal output from the trimming circuit.

As a still further preferable feature, the one or more blown object fuses may be blown at positions in a direction orthogonal to a direction different from one another in which the plurality of fuses are arranged. As a still further preferable feature, the trimming signal creating section may further comprise, at an input side or an output side, a virtually blowing signal terminal.

As a second generic feature, there is provided a production apparatus for producing an integrated circuit including a trimming circuit with a plurality of fuses arranged in alignment, the apparatus comprising: a determining section for determining one or more blown object fuses that are to be blown from the plurality of fuses in terms of a trimming value; and a blowing section for blowing the blown object fuses determined by the determining section, the determining section determining the blown object fuses such that every two of the blown object fuses are interposed by at least one un-blown fuse.

As a preferable feature, a trimming pattern may be generated by expressing the trimming value in a binary code; and the determining section may determine the trimming pattern, if having a prohibition pattern, to be an avoidance trimming pattern, may select the trimming pattern, if not including the prohibition pattern, as a usable pattern; and when each of binary bits in the usable trimming pattern is associated with one of the plurality of fuses, may set one or more fuses associated with bit "1" in the usable trimming pattern to be the blown object fuses.

As another preferable feature, one or more of the prohibition patterns may be prepared; one or more weights may be assigned one to each of the prohibition patterns; and the determining section may select the trimming pattern with the first prohibition pattern as the avoidance trimming pattern on the basis of the weight assigned to the first prohibition pattern included in the trimming pattern, so that the blown object fuses are determined.

As an additional feature, the blowing section may blow the blown object fuses at positions different from one another in a direction orthogonal to a direction in which the plurality of fuses are arranged.

As a third generic feature, there is provided a production method for producing an integrated circuit including a trimming circuit with a plurality of fuses arranged in alignment, comprising the steps of: determining one or more blown object fuses to be blown from the plurality of fuses in terms of a trimming value; and blowing the blown object fuses determined in the step of determining, the blown object fuses are determined such that every two of the blown object fuses are interposed by at least one un-blown fuse in the step of determining.

As a preferable feature, a trimming pattern may be generated by expressing the trimming value in a binary code; and the step of determining may comprise the sub-steps of: determining the trimming pattern, if having a prohibition pattern, to be an avoidance trimming pattern, selecting the trimming pattern, if not including the prohibition pattern, as a usable pattern; and when each of binary bits in the usable trimming pattern associated with each of the plurality of fuses, setting one or more fuses associated with bit "1" in the usable trimming pattern to be the blown object fuses in the step of determining.

As another preferable feature, one or more of the prohibition patterns may be prepared; one or more weights may be assigned one to each of the prohibition patterns; and the step of determining may select the trimming pattern with the first prohibition pattern as the avoidance trimming pattern on the basis of the weight assigned to the first prohibition pattern included in the trimming pattern, so that the blown object fuses are determined.

As an additional preferable feature, the step of blowing may blow the blown object fuses at positions different from one another in a direction orthogonal to a direction in which the plurality of fuses are arranged.

Each feature of the present invention guarantees at least one of the following effects and advantages:

(1) The fuse interval is narrowed to reduce the area occupied by the trimming circuit;

(2) Reliability can be improved by minimizing the influence of blown fragments scattering caused by blowing a fuse;

(3) The trimming signal creating section in the form of a logic circuit can make the circuit size of the trimming signal creating section small to thereby reduce the area occupied by the trimming signal creating circuit;

(4) Since a number of prohibition patterns are weighed and avoidance trimming patterns are determined in terms of the weights assigned to prohibition patterns included in trimming patterns, occasional selection and modification of weights can arbitrarily set the reliability and the yield of the integrated circuit;

(5) A pattern without a prohibition pattern, which is, however, not currently used as a trimming pattern, can be used as a spare bit for various applications, and that provides a great convenience;

(6) The presence of a virtually blowing signal terminal can realize a state in which a fuse is virtually blown;

(7) The lower bits that form a repetitious patterns, in signals output from the trimming circuit are converted by a partial conversion circuit to reduce the circuit size of the trimming signal creating circuit, and that reduces the area occupied by the trimming signal creating circuit; and (8) Blowing two or more blown object fuses at positions different from one another in a direction orthogonal to the arrangement direction of the fuses reduce the fuse pitch in the arrangement direction, so that the area occupied by the trimming circuit can be reduced.

BRIEF DESCRIPTION OF THE DRAWINGS

FIG. 3 is a table showing a trimming value expressed in a decimal code and a binary code;

FIG. 4 is a table showing the relationship between an original trimming value and a usable trimming value in the integrated circuit of FIG.

FIG. 5 is a table showing the relationship between an original trimming value and usable trimming value in the integrated circuit of FIG. 1;

FIG. 10 is a table showing the relationship between a trimming value and a trimming signal in the integrated circuit of the third embodiment;

FIG. 11 is a table showing the relationship between a trimming value and a trimming signal in the integrated circuit of the third embodiment;

FIG. 12 is a table showing the relationship between a trimming value and a trimming signal in the integrated circuit of a first modification of the first to third embodiments;

FIG. 13 is a table showing the relationship between a trimming value and a trimming signal in the integrated circuit of a third modification of the first to third embodiments;

FIG. 14 is a table showing the relationship between a trimming value and a trimming signal in the integrated circuit of a fourth modification of the first to third embodiments;

FIG. 18 is a table showing a counter value, a usable trimming value and a usable trimming pattern in association with one another;

FIG. 20 is a table illustrating a relationship between a trimming value and a trimming signal of the integrated circuit having a different number of fuses according to the first to third embodiments and the modifications;

FIG. 21 is a table illustrating a relationship between a trimming value and a trimming signal of the integrated circuit having a different number of fuses according to the first to third embodiments and the modifications;

FIG. 22 is a table illustrating a relationship between a trimming value and a trimming signal of the integrated circuit having a different number of fuses according to the first to third embodiments and the modifications;

FIG. 23 is a table illustrating a relationship between a trimming value and a trimming signal of the integrated circuit having a different number of fuses according to the first to third embodiments and the modifications;

FIG. 24 is a table illustrating a relationship between a trimming value and a trimming signal of the integrated circuit having a different number of fuses according to the first to third embodiments and the modifications;

FIG. 25 is a table illustrating a relationship between a trimming value and a trimming signal of the integrated circuit having a different number of fuses according to the first to third embodiments and the modifications;

FIG. 26 is a table illustrating a relationship between a trimming value and a trimming signal of the integrated circuit having a different number of fuses according to the first to third embodiments and the modifications;

FIG. 27 is a table illustrating a relationship between a trimming value and a trimming signal of the integrated circuit having a different number of fuses according to the first to third embodiments and the modifications;

FIG. 28 is a table illustrating a relationship between a trimming value and a trimming signal of the integrated circuit having a different number of fuses according to the first to third embodiments and the modifications;

FIG. 29 is a table illustrating a relationship between a trimming value and a trimming signal of the integrated circuit having a different number of fuses according to the first to third embodiments and the modifications;

FIG. 30 is a table illustrating a relationship between a trimming value and a trimming signal of the integrated circuit having a different number of fuses according to the first to third embodiments and the modifications;

FIG. 31 is a table illustrating a relationship between a trimming value and a trimming signal of the integrated circuit having a different number of fuses according to the first to third embodiments and the modifications;

FIG. 33 is a table illustrating a relationship between a trimming value and a trimming signal of the integrated circuit of the first to third embodiments and the modifications;

FIG. 34 is a table illustrating a relationship between a trimming value and a trimming signal of an integrated circuit according to the first to third embodiments and the modifications;

FIG. 35 is a table illustrating a relationship between a trimming value and a trimming signal of an integrated circuit according to the first to third embodiments and the modifications;

FIG. 36 is a table illustrating a relationship between a trimming value and a trimming signal of an integrated circuit according to the first to third embodiments and the modifications;

FIG. 37 is a table illustrating a relationship between a trimming value and a trimming signal of an integrated circuit according to the first to third embodiments and the modifications;

FIG. 38 is a table illustrating a relationship between a trimming value and a trimming signal of an integrated circuit according to the first to third embodiments and the modifications;

FIG. 39 is a table illustrating a relationship between a trimming value and a trimming signal of an integrated circuit according to the first to third embodiments and the modifications;

FIG. 41 is a table showing the relationship between a trimming value and a trimming signal in an integrated circuit of an embodiment of the present invention;

FIG. 42 is a table showing the relationship between a trimming value and a trimming signal in an integrated circuit of an embodiment of the present invention;

FIG. 43 is a table showing the relationship between a trimming value and a trimming signal in an integrated circuit of an embodiment of the present invention;

FIG. 44 is a table showing the relationship between a trimming value and a trimming signal in an integrated circuit of an embodiment of the present invention;

FIG. 45 is a table showing the relationship between a trimming value and a trimming signal in an integrated circuit of an embodiment of the present invention;

FIG. 46 is a table showing the relationship between a trimming value and a trimming signal in an integrated circuit of an embodiment of the present invention;

FIG. 47 is a table showing the relationship between a trimming value and a trimming signal in an integrated circuit of an embodiment of the present invention;

FIG. 48 is a table showing the relationship between a trimming value and a trimming signal in an integrated circuit of an embodiment of the present invention;

FIG. 49 is a table showing the relationship between a trimming value and a trimming signal in an integrated circuit of an embodiment of the present invention;

FIG. 50 is a table showing the relationship between a trimming value and a trimming signal in an integrated circuit of an embodiment of the present invention;

FIG. 51 is a table showing the relationship between a trimming value and a trimming signal in an integrated circuit of an embodiment of the present invention;

FIG. 52 is a table showing the relationship between a trimming value and a trimming signal in the integrated circuit of the fourth modification of the first to third embodiments;

FIG. 53 is a table showing a converted output pattern (a trimming value) of a resistance fine-adjustment circuit of FIG. 40, resistance values of resistances R1-R4, and a total resistance value in association with one another;

FIG. 54 is a table showing a variation in the resistance value between points a and b in the resistance fine-adjustment circuit of FIG. 40;

FIG. 55 is a diagram illustrating an example of arrangement of blowing positions of fuses in a trimming circuit of a conventional integrated circuit;

FIG. 56 is a diagram illustrating another example of arrangement of blowing positions of fuses in a trimming circuit of a conventional integrated circuit;

DESCRIPTION OF THE PRESENT EMBODIMENTS

Hereinafter, embodiments of the present invention will now be described with reference to accompanying drawings.

(A) First Embodiment

Figure 1:
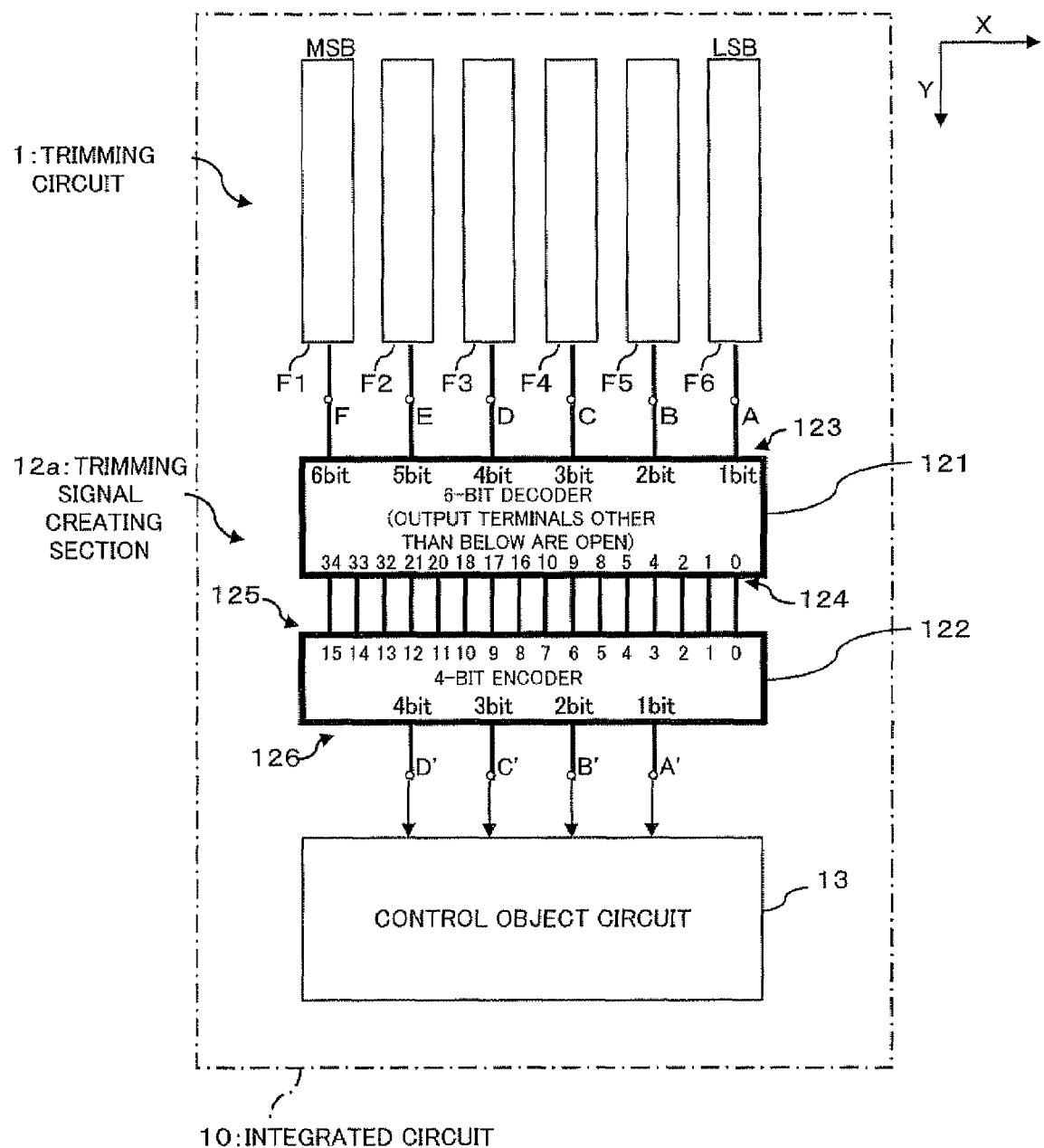
FIG. 1 is a diagram schematically illustrating the configuration of an integrated circuit according to a first embodiment of the present invention.
Figure 2:
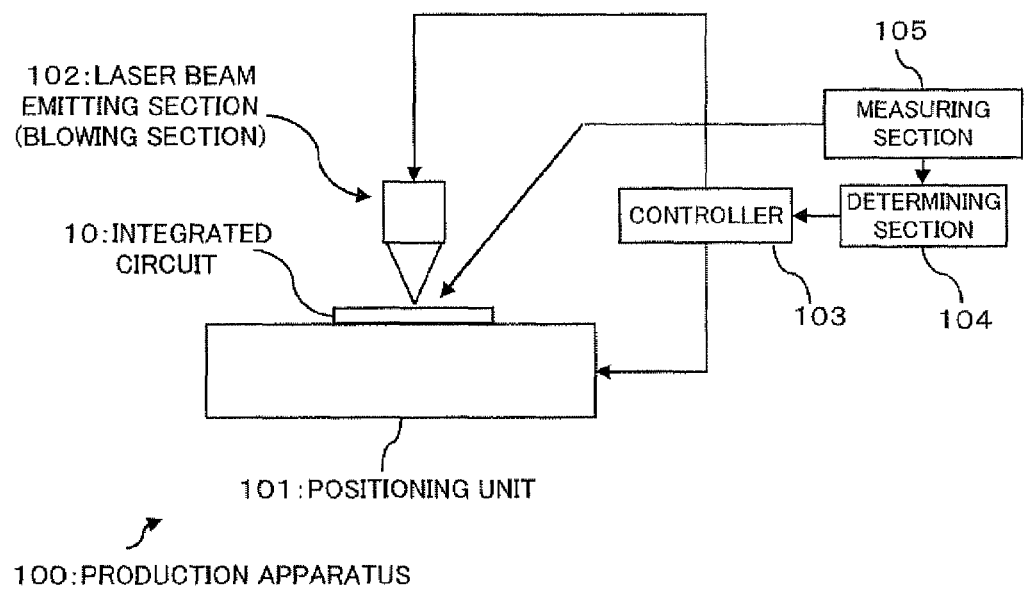
FIG. 2 is a diagram schematically illustrating the configuration of a production apparatus according to an embodiment.

FIG. 1 is a diagram schematically illustrating the configuration of an integrated circuit according to a first embodiment of the present invention; and FIG. 2 is a diagram schematically illustrating the configuration of a production apparatus according to an embodiment.

Integrated circuit 10 of the first embodiment includes, as shown in FIG. 1, trimming circuit 11, trimming signal creating section 12a, and control object circuit 13. By blowing at least one of a number of fuses (six fuses F1-F6 in the example shown in FIG. 1) arranged in parallel to one another at regular intervals (a fuse pitch, a fuse interval) in trimming circuit 11, integrated circuit 10 can switch functions of control object circuit (trimming object circuit) 13, adjust the apparatus properties (e.g., correction of process variation or determination of the initial setting, and the like).

Production apparatus 100 produces integrated circuit 10 shown in FIG. 1 and includes positioning unit 101, laser beam emitting section (blowing section) 102, controller 103, measuring section 105, and determining section 104 as shown in FIG. 2.

Measuring unit 105 measures a value of control object circuit 13, and determining unit 104 determines one or more fuses that are to be blown based on the result of the measurement by measuring unit 105.

Determining unit 104 determines one or more blown object fuses among fuses F1-F6 included in trimming circuit 11 in accordance with a trimming value such that every two of the blown object fuses are arranged so as to be interposed by at least one un-blown fuse A trimming value is determined in terms of, for example, the properties caused from a process variation of control object circuit 13 and from other factors, and can be determined in any publicly known method. Hereinafter, a trimming value that is to be set for control object circuit 13 is sometimes called an original trimming value. In the present embodiment, an original trimming value is set to be an integer (in a decimal code). Hereinafter, a bit string (consisting of "0" and/or "1") expressing a trimming value in a binary code is sometimes called a trimming pattern.

In the example shown in FIG. 1, a four-bit signal consisting of "0(L)" and/or "1(H)" is input, as a trimming pattern (in a binary code), into control object circuit 13 through four signal lines A', B' C', and D'.

FIG. 3 is a table showing a trimming value in a decimal code and in a binary code and showing trimming values and trimming pattern in association with one another.

Determining unit 104 associates each of fuses F1-F6 in trimming circuit 11 with each bit of a trimming pattern (six digits, six bits) shown in FIG. 3 and determines a fuse associated with bit "1" of the trimming pattern to be a blown object fuse. A trimming pattern and a usable trimming pattern (to be described below) in the first embodiment assumes to take the form of 6-bit values associated with the number of fuses F1-F6. Among six fuses F1-F6, fuse F6 and fuse F1 are associated with the LSB (Least Significant Bit) and the MSB (Most Significant Bit), respectively.

Determining unit 104 determines a trimming pattern including a particular prohibition pattern consisting of "0" and/or "1" to be an avoidance trimming patter that is unusable, and also selects a trimming pattern which is other than such an avoidance trimming pattern and which includes no prohibition pattern as a usable trimming pattern.

Determining unit 104 associates one of the bits constituting a usable trimming pattern with each fuse and thereby determines one or more blown object fuses. That arranges every two blown object fuses to be interposed by at least one un-blown fuse.

Any bit string can be determined to be a prohibition pattern, which can be two or more successive bits "1" exemplified by "11". In the example shown in FIG. 3 assuming "11" to be a prohibition pattern, a trimming pattern with the prohibition pattern is attached by information "YES" representing the possession of the prohibition pattern.

Specifically, in the example shown in FIG. 3, decimal value "3" (trimming pattern 000011), decimal value "6" (trimming pattern 000110), decimal value "7" (trimming pattern 000111), decimal value "11" (trimming pattern 001011), decimal value "12" (trimming pattern 001100), decimal value "13" (trimming pattern 001101), decimal value "14" (trimming pattern 001110), and decimal value "15" (trimming pattern 001111) are trimming patterns (avoidance trimming patterns) with the above prohibition pattern. Determining unit 104 uses the trimming patterns except these avoidance trimming patterns as usable trimming patterns.

For convenience sake, FIG. 3 omits trimming values with original trimming value 43 or more.

Then determining unit 104 associates each of fuses F1-F6 with one of the bits in a usable trimming pattern and determines a fuse associated with bit "1" in the usable trimming pattern to be a blown object fuse.

For example, in the determination of usable trimming patterns, determining unit 104 can select trimming patterns without a prohibition pattern, that is, patterns other than the avoidance trimming patterns as usable trimming patterns from the trimming pattern list shown in FIG. 3.

In addition, in the selection of usable trimming patterns, determining unit 104 selects trimming patterns without a prohibition pattern, that is, patterns other than the avoidance trimming patterns as usable trimming patterns sequentially in the ascending or descending order. In other words, determining unit 104 excludes a trimming pattern with a prohibition pattern and bring the next trimming pattern forward (by shifting), so that a blown object fuse is determined.

In the example shown in FIG. 3, trimming pattern 00011 (trimming value 3 (in a decimal code) includes the prohibition pattern and is regarded as an avoidance trimming pattern. Determining unit 104 substitutes this trimming pattern 00011 with trimming pattern 000100, which serves as a usable trimming pattern representing decimal value 4 that comes first after decimal value 3.

Since usable trimming pattern 000100 (decimal value 4) is used for trimming value 3 as described above, trimming pattern 000101 (decimal value 5), which is the usable trimming pattern that comes first after 000100 (decimal value 4), is selected as the next usable trimming pattern.

Hereinafter, the first embodiment is described assuming that determining unit 104 selects usable trimming patterns in the ascending order. However, the present invention should by no means limited to selection in the ascending order, but the usable trimming patterns may be selected in the descending order.

Determining unit 104 does not use a trimming pattern with the prohibition pattern, which makes contiguous fuses to be blown and brings forwards the next trimming pattern. In integrated circuit 10 of the present invention compensates the resultant lack of trimming patterns caused from this exclusion and carrying forward by increasing the number of bits (i.e., the number of fuses).

FIG. 4 is a table showing the relationship between an original trimming value and usable trimming pattern in the integrated circuit 10 as the first embodiment, and specifically shows usable trimming patterns to be used one to be applied to each of the original trimming values in the above method.

As shown in FIG. 4, a conversion table may be previously prepared in which usable trimming patterns obtained by excluding avoidance trimming patterns are associated with each one of desired trimming values, and determining unit 104 may select a usable trimming pattern corresponding to a desired trimming value with reference to the conversion table. Otherwise, a conversion function may be previously prepared which is used to convert a desired trimming value into a usable trimming pattern and a usable trimming value corresponding to a desired trimming value may be obtained with the conversion function.

As described above, in determination of one or more blown object fuses, determining unit 104 uses only trimming patterns without the prohibition pattern by excluding each trimming pattern with the prohibition pattern and bringing the next trimming pattern forward. With this manner, if a four-bit trimming value is to set in control object circuit 13 for example, the number (six in the first embodiment) of fuses provided in trimming circuit 11 should correspond to four bits or more (6 bits in the first embodiment).

Positioning unit 101 can horizontally move integrated circuit 10 to any position while mounting and fixing the integrated circuit 10 on and to the upper surface of the unit or the like. The movement of integrated circuit 10 on positioning unit 101 can be controlled by controller 103.

Laser beam emitting section (blowing section) 102 emits laser beams under control of controller 103 to irradiate one or more blown object fuses in trimming circuit 11 selected among fuses F1-F6 by determining unit 104 with the emitted laser beams, so that the blown object fuses are blown. Laser beam emitting section 102 comprises an on/off-switchable leaser light source and a condensing lens, which are, however, not shown in the drawings.

controller 103 controls laser beam emitting section 102 such that one or more blown object fuses determined in trimming circuit 11 determined from fuses F1-F6 by determining unit 104 are irradiated with laser beams emitted from laser beam emitting section 102 and are thereby blown. Specifically, controller 103 controls the emission timing of laser beams from laser beam emitting section 102 and the position of positioning unit 101 such that the laser beams emitted from laser beam emitting section 102 is condensed at the blowing position predetermined for each blown object fuse.

In addition to determination of a blown object fuse by determining unit 104 and blowing a blown object fuse by laser beam emitting section 102 and positioning unit 101, production apparatus 100 may incorporate a circuit realizing the function as trimming signal creating section 12a (see FIG. 1) to be detailed later and control object circuit 13 (see FIG. 1) into integrated circuit 10.

Incorporation of a circuit realizing the function as trimming signal creating section 12a and control object circuit 13 into integrated circuit 10 can be realized by any publicly known method, so description is omitted here.

The CPU (Central Processing Unit) in a computer executes a blown object fuse determination program and/or a control program to function as determining unit 104 and/or controller 103.

Here, a computer is a concept of a combination of hardware and an OS (Operating System) and means hardware which operates under control of the OS. Otherwise, if an application program operates hardware independently of an OS, the hardware itself corresponds to the computer. Hardware includes at least a microprocessor such as a CPU and means to read a computer program recorded in a recording medium. In the first embodiment, production apparatus 100 (including a semiconductor tester) serves to function as a computer.

One or more programs realizing the functions of determining unit 104 and controller 103 may be provided in the form of being recorded in a computer-readable recording medium, such as a flexible disk, a CD (e.g., CD-ROM, CD-R, CD-RW), a DVD (e.g., DVD-ROM, DVD-RAM, DVD-R, DVD+R, DVD-RW, DVD+RW), a magnetic disk, an optical disk, or a magneto-optical disk.

Further, the computer reads the programs from the recording medium and sends the read programs to an internal or external memory to store for use. Further alternatively, the programs may be recorded in a memory device (a recording medium), such as a magnetic disk, an optical disk or a magneto-optical disk, and is provided to the computer from the memory device through a communication path.

In order to realize the functions as determining section 104 and controller 103, a microprocessor (the CPU) in the computer executes the programs stored in an internal memory (in the illustrated example, a RAM or a ROM for the computer). At that time, the execution may be carried out by computer reading the programs stored in a recording medium.

The recording medium used in the first embodiment may be various computer-readable recording media such as an IC card, a ROM cartridge, a magnetic tape, a punch card, an internal storage unit (RAM or ROM) for a computer, an external storage unit, or a printing matter on which codes, such as bar codes, are printed, in addition to a flexible disk, a CD, a DVD, a magnetic disk, an optical disk and a magnet-optical disk above listed.

In integrated circuit 10 of the first embodiment, trimming circuit 11 has a number (six in the example of FIG. 1; i.e., six bits) of fuses F1-F6 arranged in parallel with one another in the X direction at regular fuse pitches among which every two blown object fuses are interposed by at least one un-blown fuse.

Figure 15:
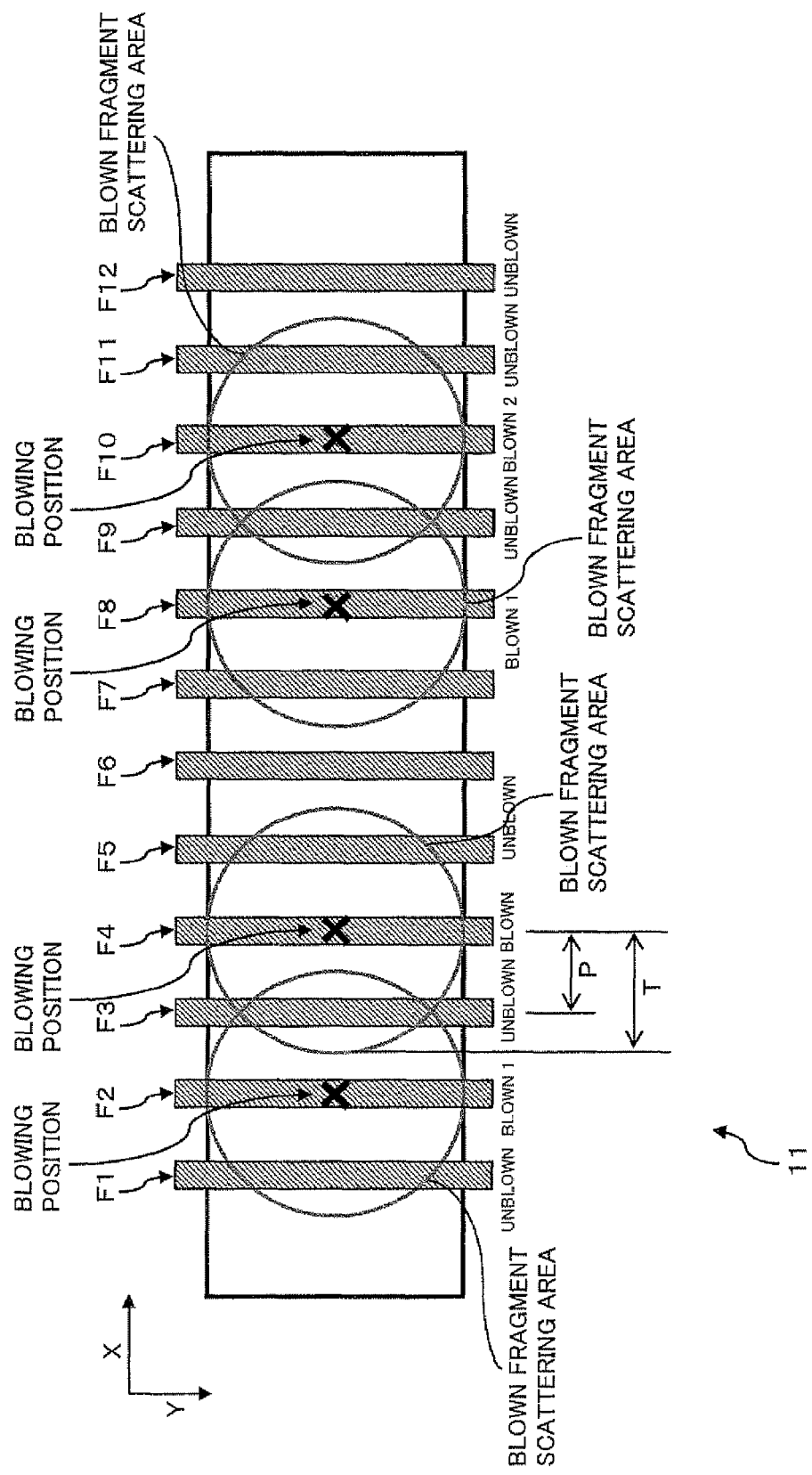
FIG. 15 is a diagram illustrating an example of arrangement of blowing positions of fuses in the integrated circuit of the first to third embodiments and the modifications.

In the trimming circuit 11 of integrated circuit 10 of the first embodiment, the following relationship is established between the fuse pitch (P) and the scattering distance (T) of blown fuse fragments (see FIG. 15).

$$(2 \times P) < T$$

Further, in trimming circuit 11, each of the fuses F1-F6 is associated with each one of the bits representing a trimming value in a binary code (a trimming pattern) and a fuse associated with bit "1" in the trimming pattern is set to be a blown object fuse. Additionally, a trimming pattern including a particular prohibition pattern is regarded as an avoidance trimming pattern, while a trimming pattern being different from the above trimming pattern (i.e., the avoidance trimming pattern) and not including the prohibition pattern is selected as a usable trimming pattern. One or more blown object fuses are determined as a result of association with the usable trimming pattern with the fuses in trimming circuit 11. That arranges every two of blown object fuses, if any, to be interposed by at least one un-blown fuse.

Trimming signal creating section 12a disposed downstream of trimming circuit 11 creates a trimming signal corresponding to a trimming value (an original trimming value) based on a signal output from trimming circuit 11 in which one or more blown object fuses have been blown, and includes decoder 121 (a 6-bit decoder in the example shown in FIG. 1) and encoder 122 (a 4-bit encoder in FIG. 1) as shown in FIG. 1.

Trimming signal creating section 12a carries out a conversion process in which a value representing a usable trimming pattern obtained by excluding one or more avoidance trimming pattern and set in trimming circuit 11 is converted into a trimming signal representing a trimming value (an original trimming value) which should be set in control object circuit 13.

In the example shown in FIG. 1, a 6-bit signal consisting of "0(L)" and/or "1(H)" and serving as a usable trimming pattern is input into trimming signal creating section 12a via six signal lines A, B, C, D, E, and F. In detail, fuses F1 and F2 are connected to decoder 121 of trimming signal creating section 12a respectively by signal lines F and E. Similarly, fuses F3, F1, F4, F5, and F6 are connected to decoder 121 of trimming signal creating section 12a by signal lines D, F, C, B, and A, respectively.

In the example shown in FIG. 1, trimming signal creating section 12a outputs a four-bit signal, as a trimming signal (output signal) consisting of "0(L)" and/or "1(H)", through four signal lines A', B', C', and D'. The trimming signal is input into control object circuit 13. Further, among the four signal lines A', B', C', and D', the example of FIG. 1 associates signal line A' and signal line D' with the LSB and the MSB, respectively.

Decoder 121 receives and decodes an output signal from trimming circuit 11, and outputs, as a result of the decoding, a signal corresponding to a usable trimming pattern. Decoder 121 comprises a number of input terminals 123 which are capable of receiving an output signal output from fuses F1-F6 of trimming circuit 11, a decoding section (not shown) which decodes the output signal input into decoder 121 in the input terminals, and a number of output terminals 126 from which a signal corresponding to a result of the decoding is output.

In the example shown in FIG. 1, decoder 121 takes the form of a six-bit decoder which is able to receive an output signal (six bits) from fuses F1-F6, decodes a 6-bit signal input from fuses F1-F6 of trimming circuit 11, and output "1(H)" from a particular output terminal 126 corresponding to the result of the decoding.

In the example shown in FIG. 1, among a number of output terminals 124 in decoder 121, 16 output terminals 124 correspond to each one of values 0, 1, 2, 4, 5, 8, 9, 10, 16, 17, 18, 20, 21, 32, 33, and 34 (in a decimal code, hereinafter, a decimal value corresponding to a usable trimming pattern is sometimes called a usable trimming value) corresponding to usable trimming patterns.

Further, in FIG. 1, among a number of output terminals 124 of decoder 121, output terminals other than output terminals 124 corresponding to usable trimming values 0, 1, 2, 4, 5, 8, 9, 10, 16, 17, 18, 20, 21, 32, 33, and 34 representing usable trimming patterns are open.

Encoder 122 receives and encodes a signal output from decoder 121 and outputs a signal (a trimming signal) consisting of a specified number of bits (four bits in this embodiment) corresponding to an original trimming value. Encoder 122 comprises a number of input terminals 125 which are capable of receiving a signal output from output terminals of decoder 121, an encoding section which encodes the signal input via input terminal 125 (into a binary code), and a number of output terminals 126 from each of which "0(L)" or "H (1)" is output. The number of bits of a signal output from encoder 122 is identical with the number of bit of a trimming signal (in a binary code) that is to be input into control object circuit 13.

Input terminals 125 of encoder 122 correspond to a trimming value (an original trimming value) that is to be set in control object circuit 13, and in the example of FIG. 1, 16 of input terminals 125 each correspond to any one of integer numbers 0-15 (i.e., the original trimming values).

Non-open output terminals 124 corresponding to 0, 1, 2, 4, 5, 8, 9, 10, 16, 17, 18, 20, 21, 32, 33, and 34 in decoder 121 are each connected to any one of input terminals 125 corresponding to 0-15 in encoder 122. A usable trimming value (in a decimal code) corresponding to one of output terminals 124 of decoder 121 and an original trimming value (in a decimal code) corresponding to one of input terminals 125 of encoder 122 are identical to those having a relationship (see FIG. 4) between the original trimming value (in a decimal code) and the usable trimming value (in a decimal code) established by determining unit 104.

Namely, in the example shown in FIG. 1, output terminal 124 in decoder 121 corresponding to output signal "0" is connected to input terminal 125 in encoder 122 corresponding to input signal "0". In the same manner, output terminal 124 in decoder 121 corresponding to output signal "1" is connected to input terminal 125 in encoder 122 corresponding to input signal "1"; output terminal 124 in decoder 121 corresponding to output signal "2" is connected to input terminal 125 in encoder 122 corresponding to input signal "2"; output terminal 124 in decoder 121 corresponding to output signal "4" is connected to input terminal 125 in encoder 122 corresponding to input signal "3"; output terminal 124 in decoder 121 corresponding to output signal "5" is connected to input terminal 125 in encoder 122 corresponding to input signal "4"; . . . (ellipsis) . . . ; and output terminal 124 in decoder 121 corresponding to output signal "34" is connected to input terminal 125 in encoder 122 corresponding to input signal "15".

Encode 122 encodes a value (an original trimming value) associated with input terminal through which a signal is input, and outputs a 4-bit output signal (corresponding to an original trimming value; a trimming signal) associated with the result of the encoding from output terminals 126.

As described above, in determination of one or more blown object fuses by determining unit 104, a trimming value with a possibility of reestablishment of a short circuit in a blown-fragment scattering area is substituted by the next trimming pattern so that output values (trimming output values) from trimming circuit 11 are non-linear binary output. Trimming signal creating section 12a carries out a linear conversion to make the trimming output values into linear binary codes.

FIG. 5 shows a relationship between a trimming value and a trimming signal in integrated circuit 10 of the first embodiment of the present invention. Specifically, a trimming signal (four bits) output from trimming signal creating section 12a (encoder 122) is shown in association with the trimming signal in a decimal code and corresponding original trimming values (six bits in a binary code, and the decimal value).

For the convenience sake, trimming values 43 or more are omitted in FIG. 5. Further, the example of FIG. 5 selects trimming patterns without the prohibition pattern "11" in the ascending order (i.e., in order from lower trimming values).

An output signal from encoder 122 is input as a trimming signal into control object circuit 13 through signal values A', B', C', and D'.

When a trimming value (an original trimming value) "7 (binary value 0111) is to be set in trimming circuit 11 of integrated circuit 10 having the above-described configuration, determining unit 104 in production apparatus 100 obtains usable trimming pattern 001010 (decimal value 10) without the prohibition pattern with reference to a conversion table shown in, for example, FIG. 4, associates the usable trimming pattern with fuses F1-F6 in trimming circuit 11, and decides fuses F3 and F5 corresponding to bit "1" of the usable trimming pattern to be blown object fuses.

Controller 103 controls laser beam emitting section 102 and positioning unit 101 to disconnect blown object fuses F3 and F5 determined by determining unit 104.

In this manner, every two of blown object fuses in trimming circuit 11 are arranged so as to be interposed by at least one un-blown fuses, so that the fragment generated by blowing fuse F3 does not reach the blowing position of fuse F5 and similarly the fragment generated by blowing fuse F5 does not reach the blowing position of fuse F3. Consequently, no short circuit are reestablished on fuses F3 and F5.

Integrated circuit 10 in which one or more blown object fuses have been blown, a signal is input into the second and fourth bits in decoder 121 through signal lines F, E, D, C, B, and A, the decoding section perform a decoding process based on the signal input, and a signal is output from output terminal 124 corresponding to the decoding result "10".

The signal output from output terminal 124 corresponding to the decoding result "10" is input into input terminal 125 corresponding to input signal "7" in encoder 122, in which the encoding section obtains binary code "0111" corresponding to input signal "7" (encoding).

Then, output terminals 126 of encoder 122 output bits "0", "1", and "1" respectively via signal lines D', C', B', and A', and a trimming signal consisting of "0", "1", "1", and "1" is input into control object circuit 13.

As described above, in integrated circuit 10 of the first embodiment, partly since every two blown object fuses are arranged so as to be interposed by at least one un-blown fuse and partly since contiguous fuses are not blown, it is possible to avoid reestablishing a short circuit of a blown fuse due to scattering fragments caused by blowing contiguous fuses. The area required for trimming circuit 11 can be therefore reduced by reducing the fuse pitch (fuse interval), and that makes it possible to reduce the fuse pitch in accordance with finer design of process.

It is further possible to minimize the influence caused by scattering fragment generated by blowing fuses F1-F6, which leads to the improvement in reliability.

In addition, trimming patterns (e.g., corresponding to decimal values 36, 37, 40, 41, and 42 in FIG. 5) formed by combinations of output bits among fuses F1-F6, which are not used as trimming patterns and which do not include the prohibition pattern, can be regarded as spare bits used for various purposes and are therefore convenient.

(B) Second Embodiment

Figure 6:
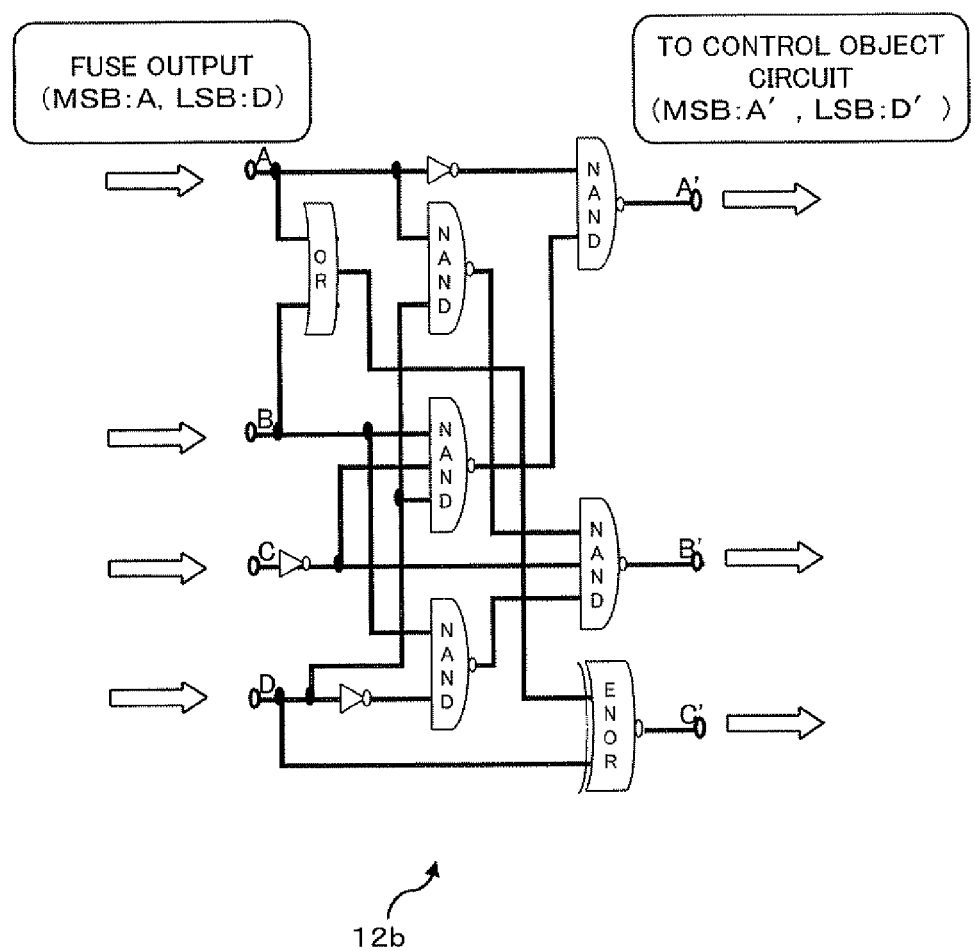
FIG. 6 is a diagram showing an example of the configuration of a trimming signal creating section according to a second embodiment of the present invention.

FIG. 6 is a diagram showing an example of the configuration of trimming signal creating section 12b of integrated circuit 10 according to the second embodiment of the present invention. In the example shown in FIG. 6, trimming signal creating section 12b converts a 4-bit input signal received through signal lines A, B, C, and D into a 3-bit signal that is to be output through signal lines A', B', and C'.

In this example, among signal lines A, B, C, and D, signal line D corresponds to the Last Significant Bit (LSB) and signal line A correspond to the Most Significant Bit (MSB).

Further, among signal lines A', B', and C', signal line C' corresponds to the Last Significant Bit (LSB) and signal line A' correspond to the Most Significant Bit (MSB).

Integrated circuit 10 according to the second embodiment includes trimming signal creating section 12b of FIG. 6 as a substitute for trimming signal creating section 12a of integrated circuit 10 shown in FIG. 1, and the remaining part is identical to that of integrated circuit 10 of the first embodiment.

Trimming signal creating section 12b takes the form of a logic circuit (a fuse output direct conversion circuit) serving to function as the trimming signal creating section 12a shown in FIG. 1.

Integrated circuit 10 of the second embodiment guarantees the same effects as the first embodiment, and additionally direct serial-serial conversion without temporary parallel conversion in the second embodiment can make the circuit smaller in size and can consequently make the area occupied by the circuit smaller as compared to trimming signal creating section 12a using a serial-parallel conversion circuit.

For example, the example shown in FIG. 6 can realize a conversion circuit with an occupied area for 25 cells on an inverter basis, which can reduce the size of the occupied area.

(C) Third Embodiment

Figure 7:
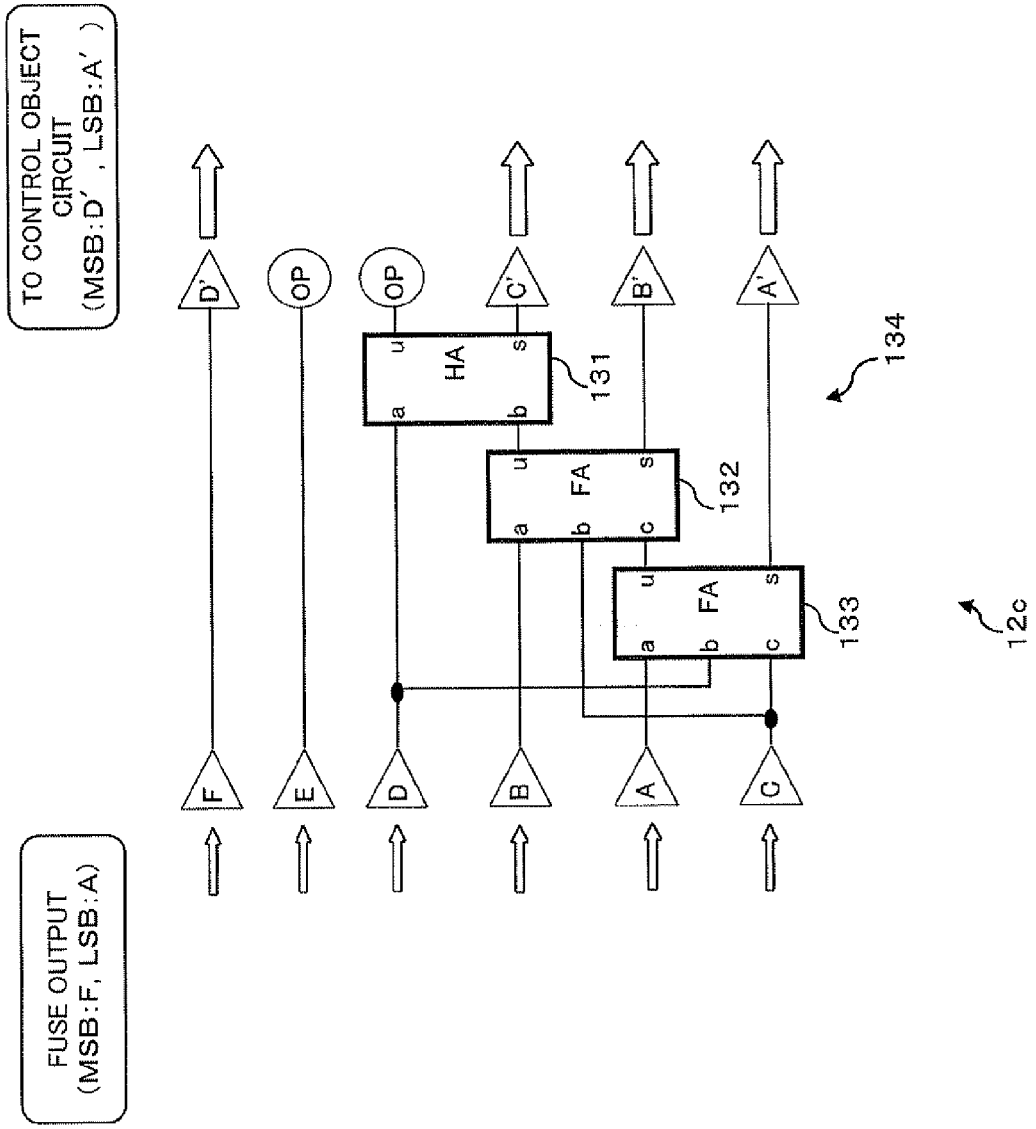
FIG. 7 is a diagram showing an example of the configuration of a trimming signal creating section according to a third embodiment of the present invention.
Figure 8:
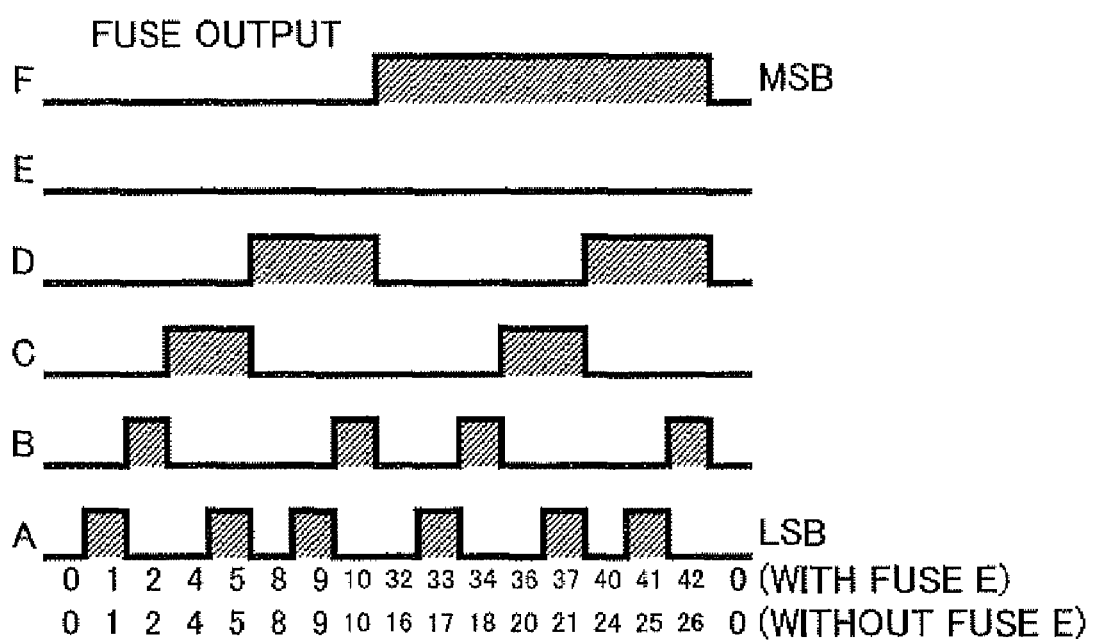
FIG. 8 is a table showing a fuse output from the trimming signal creating section of FIG. 7 in association with a trimming value (in a decimal code)
Figure 9:
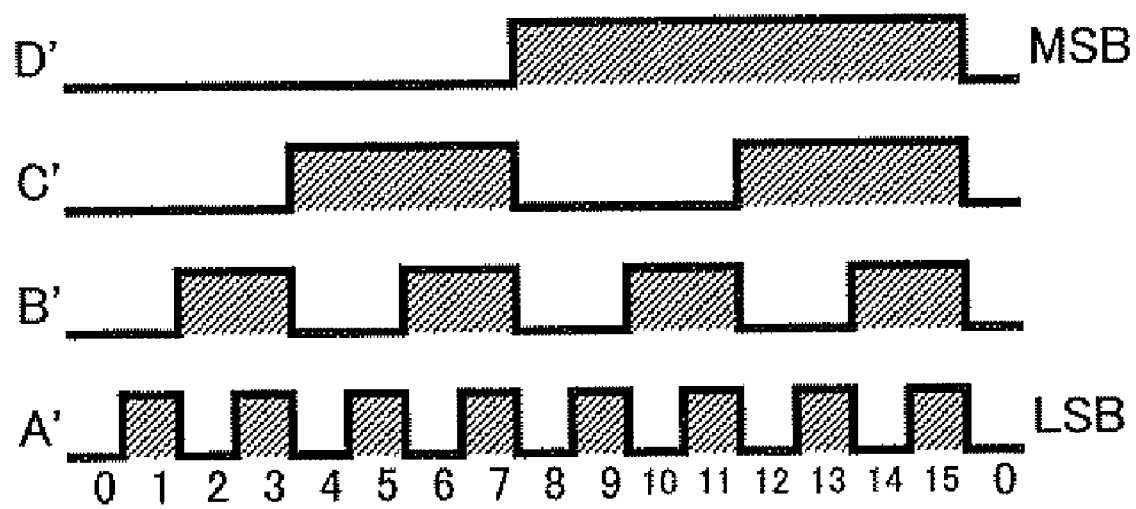
FIG. 9 is a table showing a fuse output from the trimming signal creating section of FIG. 7 in association with a trimming value (in a decimal code)

FIG. 7 is a diagram showing an example of the configuration of trimming signal creating section 12c of integrated circuit 10 according to the third embodiment of the present invention. FIG. 8 is a table showing a fuse output of trimming signal creating section 12c of FIG. 7 in association with a trimming value (in a decimal code). FIG. 9 is a table showing an output signal from trimming signal creating section 12c of FIG. 7 in association with original trimming values (in a decimal code).

Integrated circuit 10 of the third embodiment includes trimming signal creating section 12c as a substitute for trimming signal creating section 12a of integrated circuit 10 shown in FIG. 1 and the remaining part is identical to that of integrated circuit 10 of the first embodiment.

In the example shown in FIGS. 7-9, trimming signal creating section 12c converts a 6-bit input signal received through signal lines A, B, C, D, E, and F into a 4-bit signal that is to be output through signal lines A', B', C', and D'.

In this example, among signal lines A, B, C, D, E, and F, signal line A corresponds to the Last Significant Bit (LSB) and signal line F correspond to the Most Significant Bit (MSB). Further, among signal lines A', B', C', and D', signal line A' corresponds to the Last Significant Bit (LSB) and signal line D' correspond to the Most Significant Bit (MSB).

In example shown in FIG. 7, the fuse output of signal line E is open and the layout of fuse E (signal line E) can be omitted. Signal line F is connected to signal line D'.

Further, in the example shown in FIG. 8, values (in a decimal code) generated from an input signal received through signal lines A, B, C, D, E, and F if fuse E is used are listed in the same columns as corresponding values (in a decimal code) generated from an input signal received through signal lines A, B, C, D, E, and F if the fuse corresponding to signal line E is not used.

As shown in FIG. 8, for example, when fuse output signals to be input into trimming signal creating section 12c successively increases and are expressed in a binary code, the signals have repetitious patterns at the lower 4 bits (i.e., received through signal lines A, B, C, and D).

For example, if signal line E is not used, the lower four bits (input through A, B, C, and D) when signals corresponding to decimal values 0, 1, 2, 4, 5, 8, 9, and 10 are to be output as input signals via signal lines A, B, C, D, and F have the same pattern as the lower four bits of signals corresponding to decimal value 16, 17, 18, 20, 21, 24, 25, and 26 are to be output.

Specifically, decimal value 0 and decimal value 16 input the same signal into trimming signal creating section 12c through signal lines A, B, C, and D; and decimal value 1 and decimal value 17 input the same signal (a repetitious signal) into trimming signal creating section 12c through signal lines A, B, C, and D.

In the same manner, as shown in FIG. 9, when fuse output signals to be output from trimming signal creating section 12c successively increase and are expressed in a binary code, the signals have repetitious patterns at the lower 3 bits (i.e., output through signal lines A', B', and C').

For example, when trimming signal creating section 12c outputs signals corresponding to decimal values 0-10 through signal lines A', B', C', and D', the lower 3 bits (output through signal lines A', B', and C') of signals corresponding to decimal values 0-7 forms the same patterns as the lower 3 bits of signals corresponding to decimal numbers 8-15, respectively.

For example, decimal value 0 and decimal value 7 output the same signal (a repetitious signal) through signal lines A', B', and C'; and decimal value 1 and decimal value 8 output the same signal through signal lines A', B', and C'.

In the example shown in FIG. 8, there is no need for a signal through signal line E to always enter trimming signal creating section 12c (the conversion circuit), and fuse connected to signal line E is dispensable if the distance between fuses connected to signal lines D and F is larger than the fuse blown fragment scattering distance.

If a part of an output signal forms a repetitious pattern in trimming signal creating section 12c of integrated circuit 10 of the third embodiment, the lower bits of the signal that form a repetitious pattern is converted by a subroutine circuit (a partial conversion circuit) as shown in FIG. 7.

In the example as shown in FIG. 7, a repetitious part on the LSB side (input through signal lines A, B, C, and D) are converted by a subroutine circuit 134 in the form of a combination of half adder 131 and full adders 132 and 133. Namely, a signal through signal lines A, B, C, and D is input into subroutine circuit 134.

An output from subroutine circuit 134 serves as a trimming signal and is output through signal lines A', B', and C'.

Integrated circuit 10 of the third embodiment guarantees the same effects as the above first embodiment and can reduce the circuit size of trimming signal creating section 12c to reduce the area occupied by trimming signal creating section 12c.

FIGS. 10 and 11 are tables showing a relationship between a trimming value and a trimming signal in integrated circuit 10 according to the third embodiment. In the example shown in FIG. 10, trimming patterns with the prohibition pattern "11" are excluded and the bits on the LSB side are converted into a subroutine. The example FIG. 11 does not use fuse E.

In FIG. 11, the bit corresponding to fuse E is represented by "x". FIG. 10 omits trimming values corresponding to original trimming values 43 or more for convenience sake.

In examples shown in FIGS. 10 and 11, a 6-bit input signal is converted into a 4-bits signal which is then output. An output signal (four bits) from trimming signal creating section 12c (encoder 122) is shown in association with the decimal value of the output signal and original trimming values.

(D) First Modification

In the foregoing embodiments, a bit string "11" of two successive bits "1" in a trimming pattern is regarded as a prohibition pattern, and a trimming pattern with the prohibition pattern "11" is regarded as an avoidance trimming pattern. This modification provides two or more prohibition patterns, to which weights are assigned, and determining unit 104 of production apparatus 100 selects a usable pattern on the basis of the assigned weights.

FIG. 12 is a table showing a relationship between a trimming value and a trimming signal in integrated circuit 10 according to the modification. A trimming signal (four bits) output from trimming signal creating sections 12a, 12b, or 12c is associated with a decimal value corresponding to the trimming signal and the original trimming values (a 6-bit binary value and a decimal value).

FIG. 12 omits trimming values 43 or more for convenience.

The example shown in FIG. 12 determines "10101" and "101" to be prohibition patterns in addition to the above-described prohibition pattern "11", and assigns different risks (weights) 1-3 to the prohibition patterns. In detail, risk "3" is assigned to prohibition pattern "11"; risk "2" is assigned to prohibition pattern "10101"; and risk "1" is assigned to prohibition pattern "101".

Hereinafter, a trimming pattern with the prohibition pattern of risk "1" is sometimes called a trimming patter with risk "1"; similarly a trimming pattern with the prohibition pattern of risk "2" is sometimes called a trimming patter with risk "2"; and a trimming pattern with the prohibition pattern of risk "3" is sometimes called a trimming patter with risk "3". In addition, a trimming pattern with none of prohibition pattern "11", "10101", or "101" is sometimes called a trimming pattern with risk "0".

These risks are predetermined by the designer or the like. Determining unit 104 sets a trimming pattern with any of these prohibition patterns to be an avoidance trimming pattern, and selects trimming patterns with risk 2 or lower from the top (e.g., in the ascending order).

In the example shown in FIG. 12, trimming patterns binary codes of which include prohibition patterns with risk "2" or more, that is, with either prohibition patterns "11" or "10101" are regarded as avoidance trimming patterns.

Integrated circuit 10 according to the first modification to the first through the third embodiments of the present invention can guarantee the same effects as the above first embodiment. In addition, the reliability and the yield of integrated circuit 10 can be arbitrarily set by preparing two or more prohibition patterns each of which is weighted and by arbitrarily varying the risks used in selection for usable trimming pattern in determining unit 104 of production apparatus 100, and consequently this modification is highly convenient.

For example, risks can be determined in accordance with various conditions, such as the yield of integrated circuit 10 and fuse pitch. A higher risk is generally a cause for a yield.

Determination of the risks should by no means be limited to the above manner and can be variously modified. Alternatively, risks are set proportionally or square proportionally with the distance between two blowing position, or set in accordance with the number of continuous "1".

(E) Second Modification

Integrated circuit 10 according to a second modification preferentially selects trimming patterns with lower risks as usable trimming patterns. For example, a higher priority is given to trimming patterns with risk "0" than trimming pattern with risk "1" in the use as usable trimming patterns, and after all the trimming patterns with risk "0" has been extracted and used, trimming pattern with risk "1" are used.

The above first modification sequentially selects trimming values with a predetermined risk and risks lower than that among all the trimming patterns in the ascending order (or the descending order). For example, if trimming circuit 11 has a large number of fuses (bits), a trimming pattern with a large value (or a small value) and even with the lowest risk may not be used.

Integrated circuit 10 of the second modification to the first to third embodiment can guarantee the same effects as the first embodiment. In addition, since preferential use of trimming pattern with the lowest risk efficiently uses such trimming pattern with the lowest risk, it is possible to surely prevent a blown fuse from reestablishing a short circuit.

(F) Third Modification

FIG. 13 is a table showing a relationship between a trimming value and a trimming signal in integrated circuit 10 according to the third modification of the present invention. In this table, a trimming signal (five bits) output from trimming signal creating section 12a, 12b, or 12c is associated with the value expressing the trimming signal in a decimal code and original trimming value (a 6-bit binary value, and a decimal value).

FIG. 13 also omits trimming values 43 or more with risk "3" and higher for convenience.

Integrated circuit 10 of the third modification further comprises a signal line E' on the MSB side in addition to signal lines A', B', C', and D' for four bits shown in FIG. 1, and trimming signal creating sections 12a, 12b, and 12c provide a five-bit signals to control object circuit 13 through these signal lines A', B', C', D', and E'

Integrated circuit 10 of the third modification can guarantee the same effects as the above first embodiment. In addition, since trimming signal creating sections 12a, 12b, and 12c output signals consisting of five bits or more (i.e., multi-value signals), it is possible to provide control object circuit 13 with more information. In addition, trimming circuit 11 with five fuses is more useful than that with four fuses.

(G) Fourth Modification

FIG. 14 is a table showing a relationship between a trimming value and a trimming signal in integrated circuit 10 according to the fourth modification of the present invention. FIG. 14 is an example of sequential selection for trimming pattern with risk "0" (lower risk) from the top (in the ascending order).

In this table shown in FIG. 14, a trimming signal (5 bits) output from trimming signal creating sections 12a, 12b, or 12c is associated with a decimal value expressing the trimming signal in a decimal code and original trimming values (6-bit binary value, and a decimal value).

FIG. 14 also omits original trimming values 43 or more for convenience.

Similarly to the above third modification, integrated circuit 10 of the fourth modification further comprises a signal line E' on the MSB side in addition to signal lines A', B', C', and D' for four bits shown in FIG. 1, and trimming signal creating sections 12a, 12b, and 12c provide 5-bit signals to control object circuit 13 through these signal lines A', B', C', D', and E'.

To minimize the influence of scattering blown fragments generated by blowing fuses F1-F6 and improve the reliability, integrated circuit 10 of the fourth modification regards all the trimming patterns with risk 1 or more as avoidance trimming patterns. In addition, trimming signal creating sections 12a, 12b, and 12c output signals consisting of five bits or more (i.e., multi-value signals) as shown in FIG. 14.

Integrated circuit 10 of the fourth modification can guarantee the same effects as the above first embodiment. In addition, trimming signal creating sections 12a, 12b, and 12c minimize the influence of scattering blown fragments generated by blowing fuses F1-F6 and improve the reliability. It is further possible to improve the yield of integrated circuit 10 and to provide more information to control object circuit 13.

In the example shown in FIG. 14, trimming signal creating sections 12a, 12b, and 12c output 13 trimming signals representing trimming values 0-12 (in a decimal code). With this configuration, addition of one or more fuses to trimming circuit 11 can secure a requisite number of trimming signals if more trimming signals are required.

(H) Others

FIG. 15 is a diagram illustrating an example of arrangement of blowing positions of fuses in the integrated circuit 10 of the first to third embodiments and the modifications, and specifically showing a relationship between a blowing position of a fuse and a blown fragment scattering area caused by blowing the fuse.

As shown in FIG. 15, every two blown object fuses are interposed by at least one un-blown fuse in integrated circuit 10 according to the foregoing embodiments and modifications, and consequently both of two contiguous fuses are not blown. Adjacent fuses can be arranged within a blown fragment scattering area of a fuse and that can reduce the area occupied by trimming circuit 11.

In FIG. 15, trimming circuit 11 includes 12 fuses F1-F12 and assumes to set decimal value 1300 in a decimal code.

The present invention should by no means limited to the foregoing embodiments, and various changes and modifications can be suggested without departing from the spirit of the present invention.

For example, trimming signal creating sections 12a, 12b, and 12c of the foregoing embodiments and modifications may include a virtually blowing signal terminal on the input or output side of the section.

Figure 16:
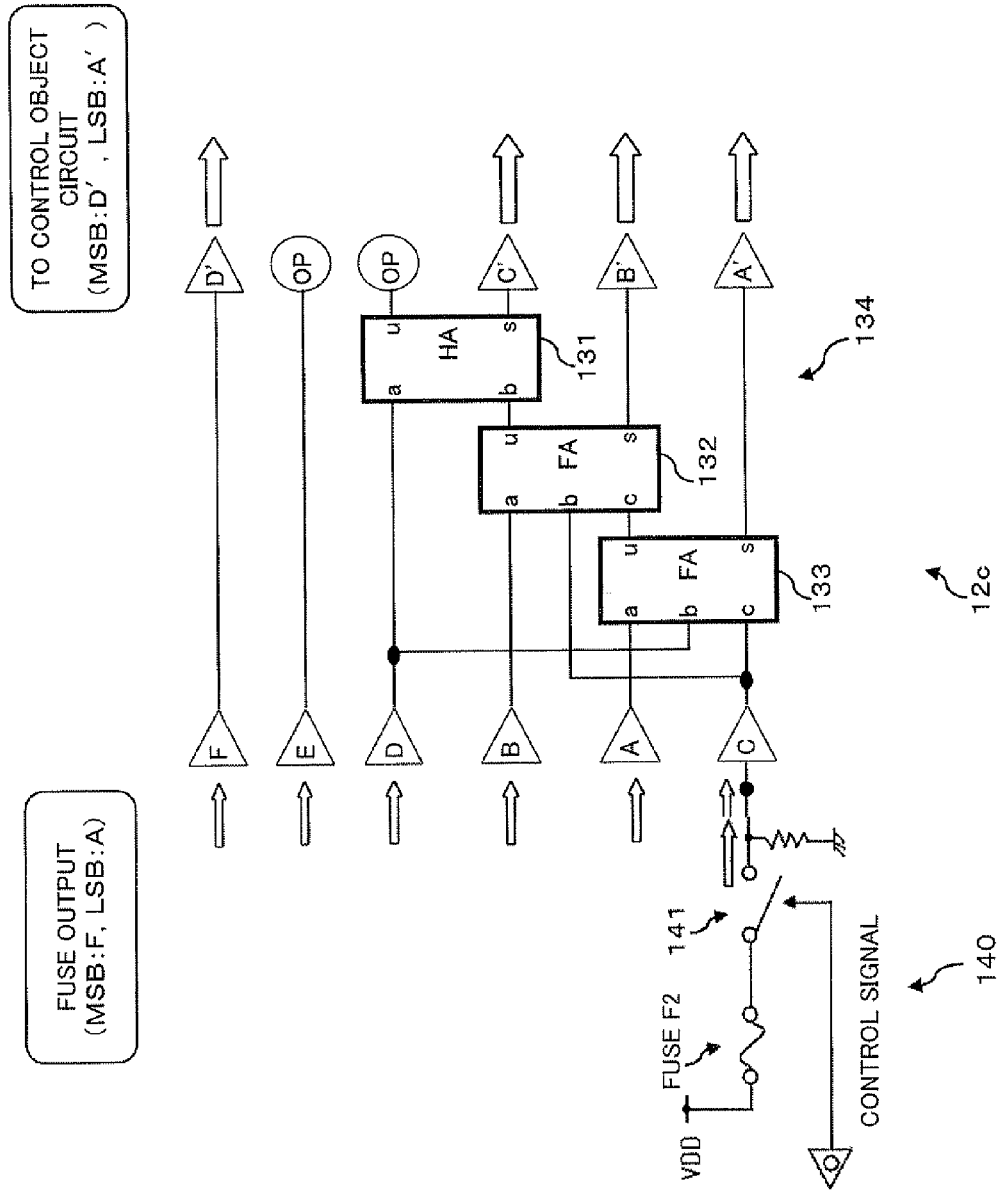
FIG. 16 is a diagram illustrating an example of the trimming signal creating section equipped with a virtually blowing signal terminal in the integrated circuit of the third embodiment.

FIG. 16 is a diagram illustrating an example of the trimming signal creating section 12c equipped with a virtually blowing signal terminal in integrated circuit 10 of the third embodiment.

In the example of FIG. 16, trimming signal creating section 12c shown in FIG. 7 has a virtually blowing signal terminal 140 connected to signal line C at the upstream point of trimming signal creating section 12c.

Virtually blowing signal terminal 140 virtually creates a state in which fuse F2 is blown. As shown in FIG. 16, virtually blowing signal terminal 140 takes the form of blowing switch 141 connected in series to the upstream or downstream side of fuse F2, an open/close control signal is supplied to blowing switch 141 so that blowing switch 141 opens or closes to virtually realize a state in which the fuse is blown.

In the example of FIG. 16, virtually blowing signal terminal 140 is attached to signal line C, but the present invention should by no means limited to this. Alternatively, virtually blowing signal terminal 140 may also be attached to another fuse.

Figure 17:
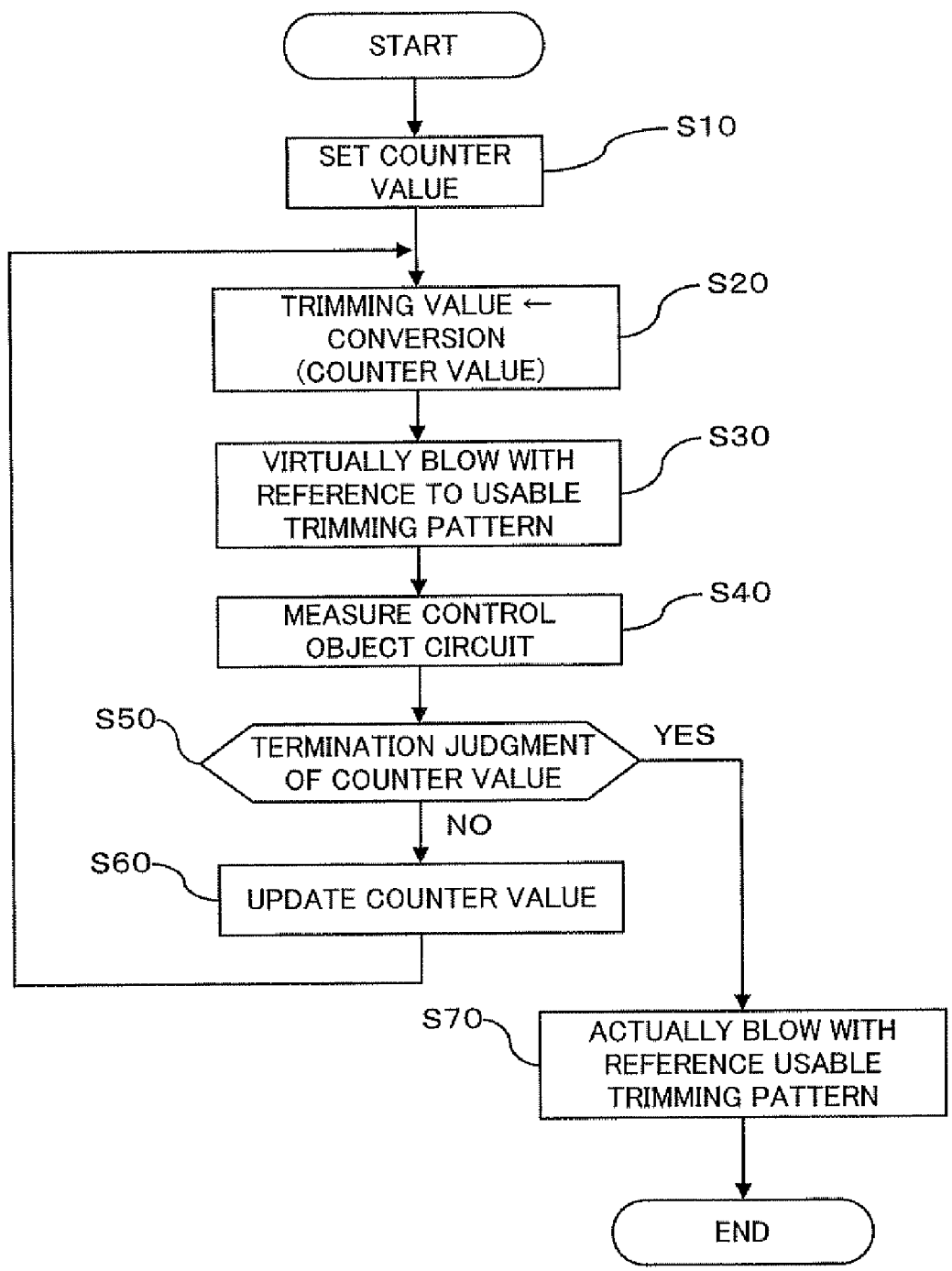
FIG. 17 is a flow diagram showing a succession of procedural steps of virtually blowing method performed by a production apparatus of an embodiment of the present invention.

A method of virtual blowing a fuse in a production apparatus according to a first embodiment will now be described with reference to FIG. 17 (steps S10-S70) and FIG. 18. FIG. 18 shows an association of a counter value (an original trimming value) with a usable trimming value (in a decimal code) and a usable trimming pattern (in a binary code), and assumes that trimming signal creating section 12*c* has the circuit configuration of FIG. 16.

Upon completion of setting a counter value corresponding to a blown object fuse (step S10), a usable trimming pattern (a usable trimming value) corresponding to the counter value is obtained with reference to a conversion table for counter values shown in FIG. 18, and the usable trimming pattern is set in trimming circuit 11 (fuses) (step S20).

Then the fuses are virtually blown fuses representing the trimming pattern (step S30). Then control object circuit is measured (step S40) and a judgment is made as to whether the counter value terminates (step S50).

If the result of the judgment is negative (No route in step S50), the counter value is updated (step S60) and the procedure then returns to step S20. The counter value is updated by, for example, Regular falsi method or Bisection method.

Conversely, if the judgment result is positive (Yes route in step S50), the fuses are actually blown which fuses represent the usable trimming value corresponding to the counter value (step S70).

Figure 57:
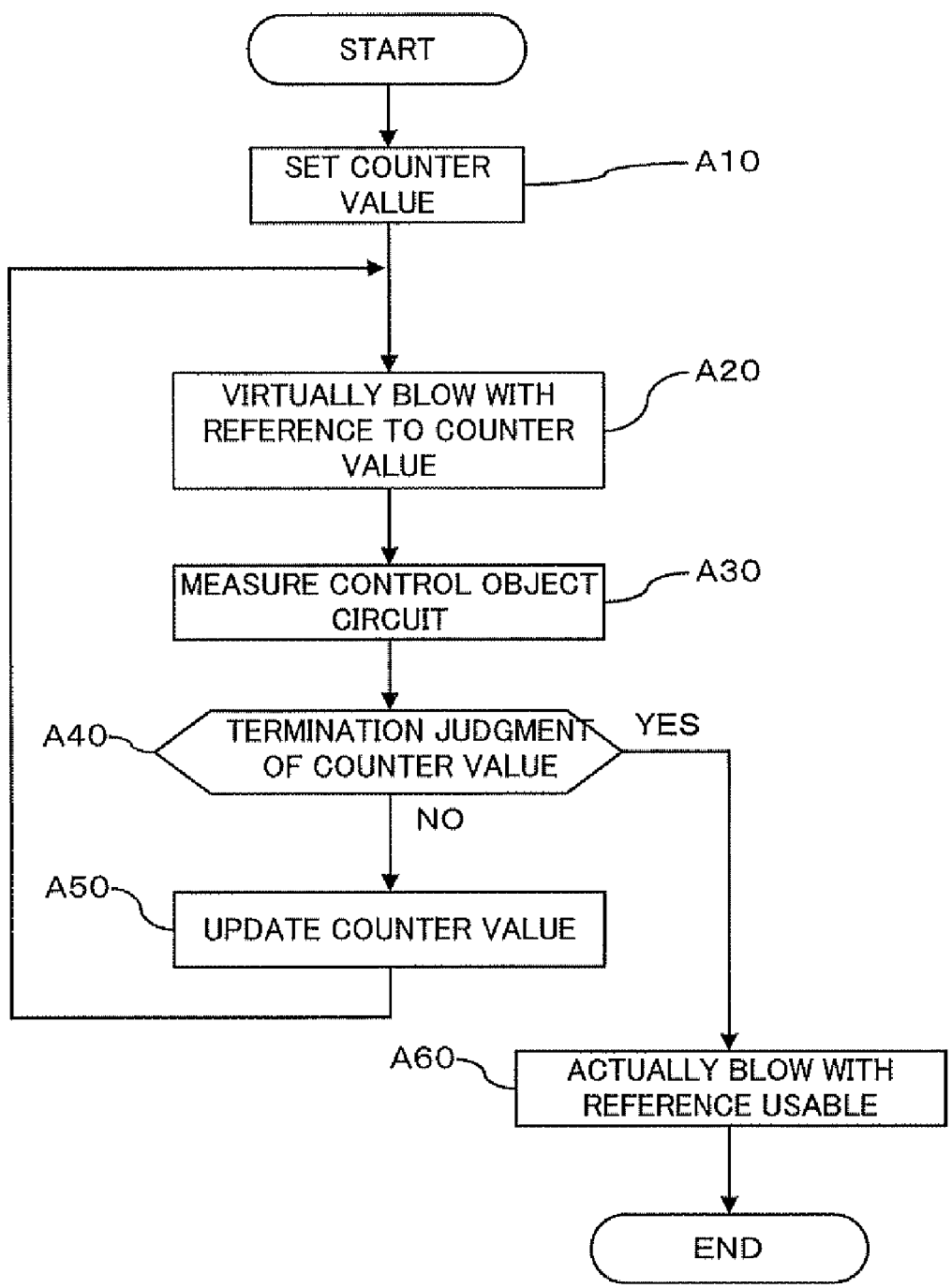
FIG. 57 is a flow diagram showing a succession of procedural steps of virtually blowing method performed on a trimming circuit of a conventional integrated circuit.
Figure 58:
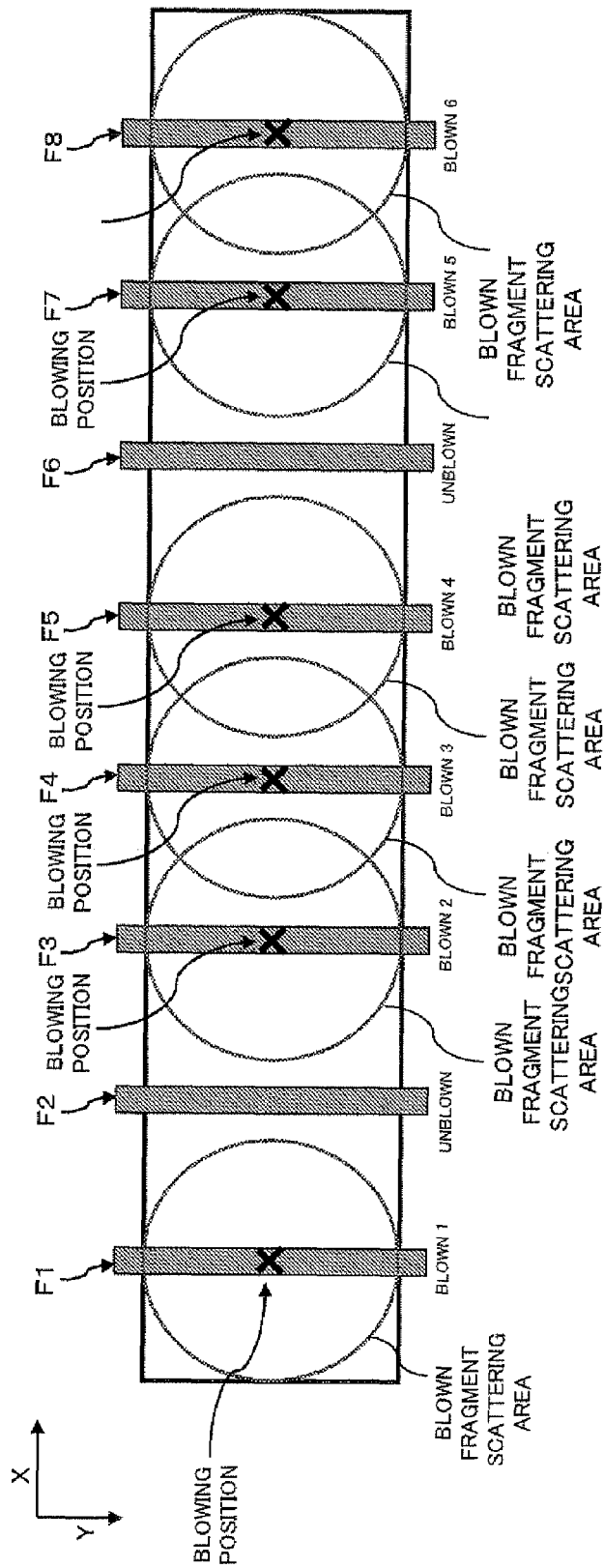
FIG. 58 is a diagram illustrating an example of arrangement of fuses in a trimming circuit of a conventional integrated circuit.

If the variation in a trimming value can be expressed by a mathematic formula (see FIG. 10 and others), the usable trimming value may be set to be the counter value and a succession of procedural steps shown in flow diagram shown in FIG. 57 may be applied.

Further, in the foregoing embodiments and modifications, among a number of fuses F1-F6 in trimming circuit 11, two contiguous blown object fuses F1-F6 are blown at the same position in a direction (the longitudinal direction in FIG. 1, Y direction) orthogonal to the direction (the lateral direction in FIG. 1, X direction) in which fuses F1-F6 are arranged. But the blown positions are not limited to those, and blown object fuses may be blown at different positions in Y direction.

Figure 19:
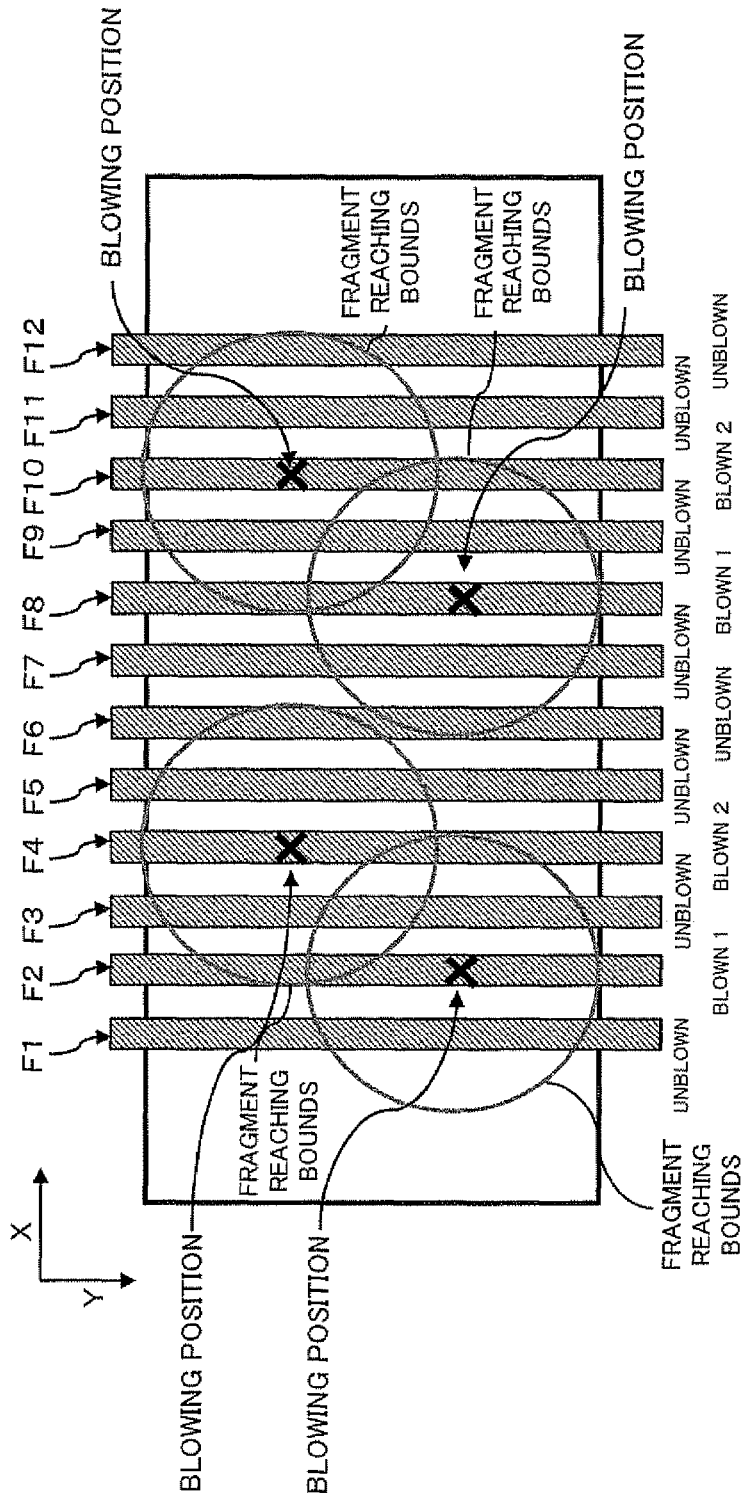
FIG. 19 is a diagram illustrating another example of the arrangement of blowing positions in the integrated circuit of the first to third embodiments and the modifications.

FIG. 19 is a diagram showing an alternative arrangement of blowing positions in trimming circuit 11 of integrated circuit 10 of the foregoing embodiments and modifications, and specifically illustrates a relationship between a fuse blowing position and a fuse-blown fragment scattering area caused by the blowing when two contiguous blown object fuses are blown at different positions in Y direction.

The example FIG. 19 also assumes that trimming circuit 11 has 12 fuses F1-F12 and that decimal value 1300 is set.

In example FIG. 19, fuses F2, F4, F8, and F10 are to be blown: fuses F2 and F8 are blown at the same position in Y direction; and fuses F4 and F10 are blown at the same position in the Y direction which position is however different from that of fuses F2 and F8.

Such displacement of fuse blowing positions in Y direction makes it possible to further reduce the fuse pitch in X direction and to reduce the area occupied by trimming circuit 11.

The displacement of fuse blowing positions is realized by, for example, controller 103.

In the foregoing embodiments, determining unit 104 regards a trimming pattern including a particular pattern (i.e., the prohibition pattern) as an avoidance trimming pattern, and concurrently select a trimming pattern which is different from avoidance trimming patterns and which does not include the prohibition pattern as usable trimming pattern. As a consequence, determining unit 104 determines one or more blown object fuses in accordance with usable trimming patterns, in other words, by modifying trimming patterns. But, the present invention should by no means be limited to the above determination of a blown object fuse. Alternatively, determining unit 104 compares the fuse pitch of fuses F1-F6 arranged in trimming circuit 11 with a blown fragment scattering distance caused from blowing fuse F1-F6 to judge whether or not the fuse pitch is within the blown fragment scattering distance, and if the fuse pitch is larger than blown fragment scattering distance, that is, if the fuse pitch is outside the blown fragment scattering distance, does not modify the trimming pattern in the above manner, so that a trimming pattern with the prohibition pattern may be used in determination of one or more blown object fuses.

The scattering distance can be calculated in various publicly known methods. For example, an actual scattering distance is determined beforehand by blowing each technology with a TEG (thermoelectric generator) and the scattering distance is set in terms of a relationship between a distance and a possibility of blowing fragment scatters to the distance.

If the fuse pitch is enough smaller than the blown fragment scattering distance, it is preferable that every two blown object fuses are arranged so as to be interposed by at least n un-blown fuses (where, n is an integer of 2 or more) and that the fuse pitch is decreased.

Every two of the blown object fuses interposed by at least n un-blown fuses are realized by one or more prohibition patterns and risks, for example.

Further, in the above first embodiment, trimming circuit 11 includes six fuses F1-F6 (six bits) and concurrently trimming signal creating section 12 outputs a 4-bit signal to control object circuit 13. The present invention is however not limited to the manner in the first embodiment. The number of fuses in trimming circuit 11 and the bit number of an output signal from trimming signal creating section 12 can vary.

FIGS. 20-31 are tables showing a relationship between a trimming value and a trimming signal in an integrated circuit with a different number of fuses according to the foregoing embodiments and modifications. In an example shown in FIGS. 20-26, trimming circuit 11 includes 12 fuses (12 bits), and trimming signal creating section 12*a*, 12*b*, or 12*c* outputs an 8-bit trimming signal (12-bit fuse-input, 8-bit output). In an example shown in FIGS. 27-30, trimming circuit 11 includes 11 fuses (11 bits), trimming signal creating section 12*a*, 12*b*, or 12*c* outputs an 8-bit trimming signal (12-bit fuse-input, 8-bit output). In an example shown in FIG. 31, trimming circuit 11 includes 7 fuses (7 bits), trimming signal creating section 12*a*, 12*b*, or 12*c* outputs a 5-bit trimming signal.

FIGS. 20-30 show only trimming values with risk "2" or less defined as above. FIG. 20 shows trimming value 0-52 after conversion; FIG. 21 shows trimming value 53-111 after conversion; FIG. 22 shows trimming value 112-170 after conversion; FIG. 23 shows trimming value 171-229 after conversion; FIG. 24 shows trimming value 230-286 after conversion; FIG. 25 shows trimming value 287-345 after conversion; and FIG. 26 shows trimming value 346-376 after conversion.

Further, FIG. 27 shows trimming value 0-55 after conversion; FIG. 28 shows trimming value 56-114 after conversion; FIG. 29 shows trimming value 115-173 after conversion; and FIG. 30 shows trimming value 174-232 after conversion.

In an example shown in FIGS. 20-26, trimming pattern representing trimming values 2114-2730 are spare bits. In another example shown in FIG. 31, trimming pattern representing trimming values 84 and 85 are spare bits. These spare bits can be applied to various usage.

A prohibition pattern is not limited to those of the foregoing embodiments and modifications and can therefore be set to any pattern. In addition, two or more prohibition patterns may be concurrently used in selection of trimming patterns.

In the foregoing embodiments and modifications, a setting of a prohibition pattern can set the fuse pitch to be less than half the blown-fragment scattering distance.

Further, in the foregoing embodiments and modifications, laser beam emitting section 102 blows one or more blown object fuses determined by determining unit 104 with laser (i.e., laser trimming). However, the blowing manner is not limited to the above, and may be alternatively carried out by electric trimming (melting-blow) other than laser trimming to blow a blown object fuse.

In setting a 4-bit trimming value in control object circuit 13 in the above first embodiment, trimming circuit 11 includes six fuses F1-F6 (six bits) by adding another two fuses (two bits) to the original four fuses (four bits). The number of additional fuses is however not limited to two, and may alternatively be one, three or more.

The number of fuses included in trimming circuit 11 can be determined in accordance with the combination of bits "1" and "0", and the bit number of the prohibition patterns, and setting of the risk. If there is a need for more trimming signals, the requisite number of trimming signals can be obtained by adding one or more fuses in trimming circuit 11.

Further, trimming signal creating section 12*a* of the above first embodiment includes encoder 122, which inputs an encoding result (an encoding output) serving as a trimming signal into control object circuit 13. The output manner of a trimming signal is not limited to the above. Alternatively, if control object circuit 13 requires no encoding output, only signals corresponding to required trimming values may be selectively provided to control object circuit 13 directly from decoder 121.

Figure 32:
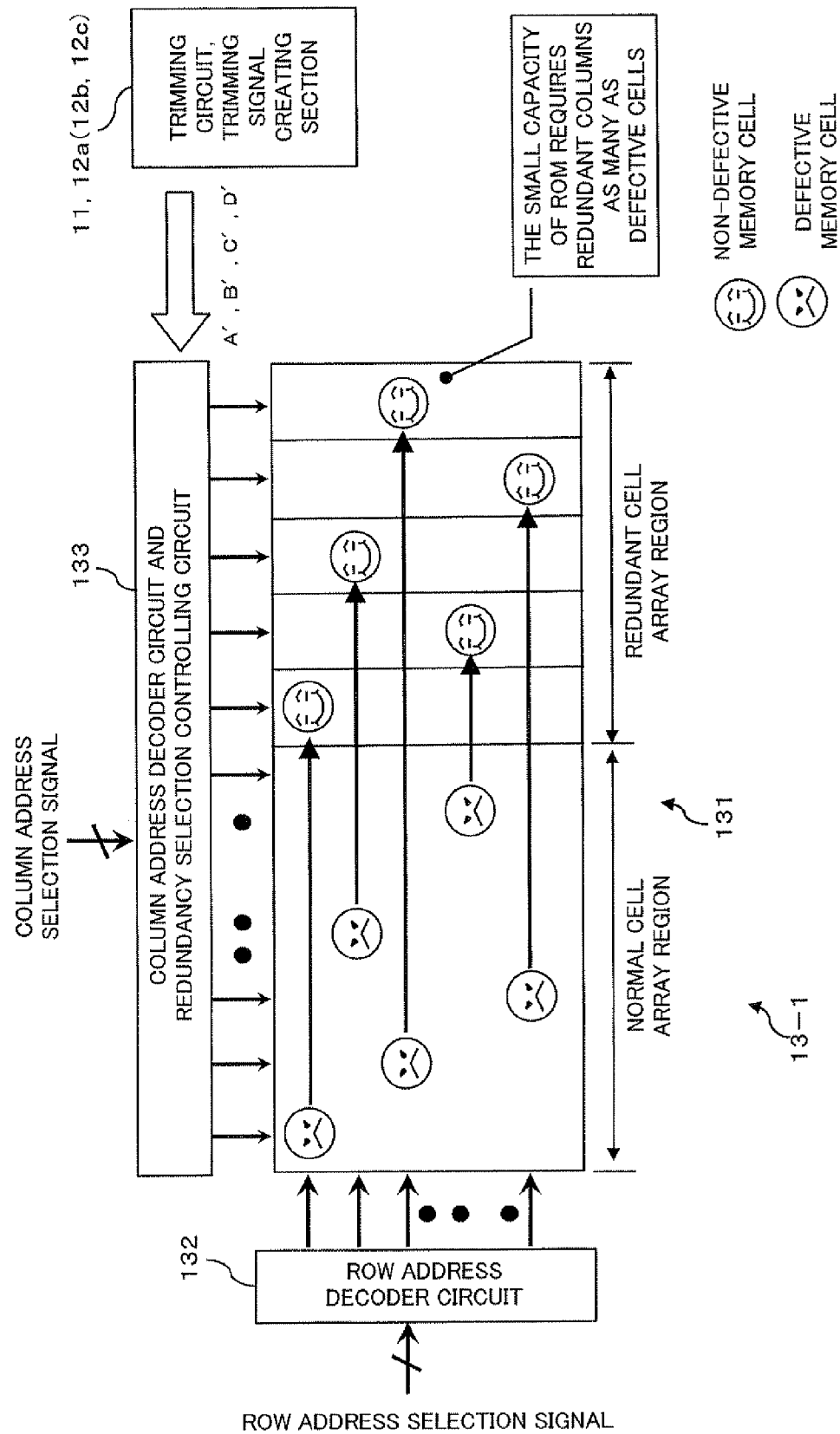
FIG. 32 is a diagram illustrating an example of the configuration of a control object circuit to be controlled in the first to third embodiments and the modifications.
Figure 40:
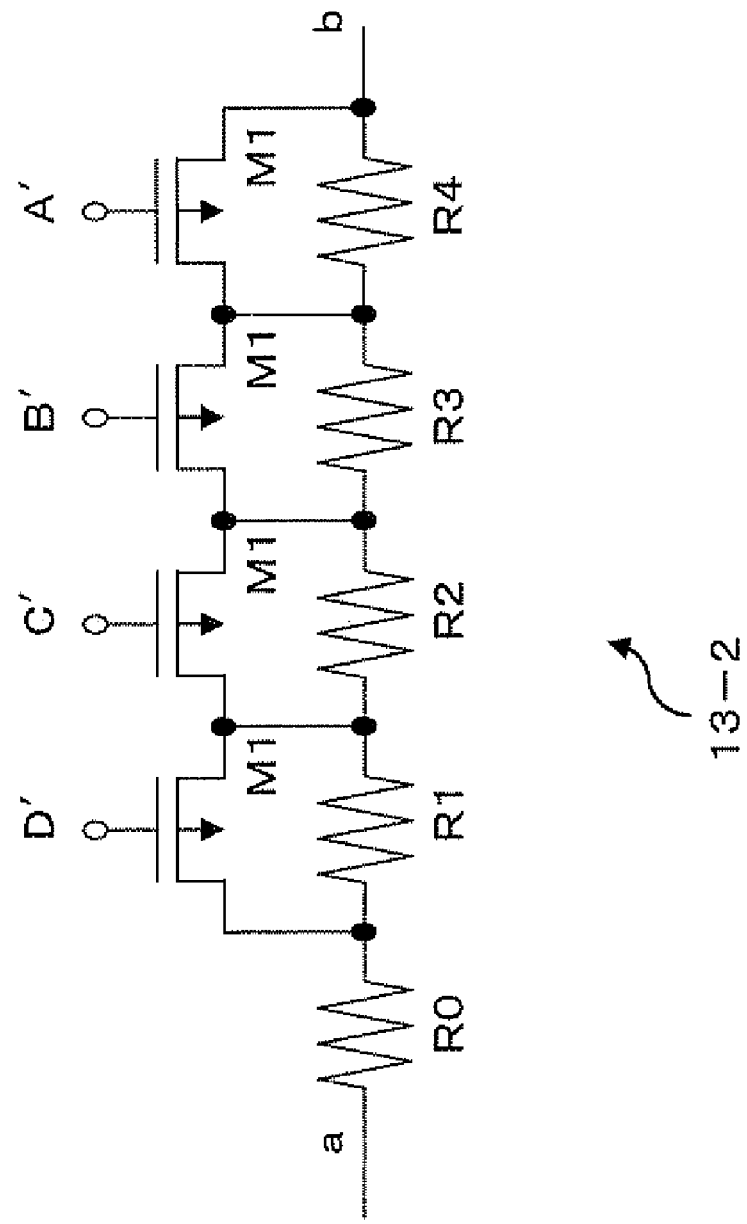
FIG. 40 is a diagram illustrating an example of the configuration of a control object circuit in the integrated circuit according to the first to third embodiments and the modification.

FIGS. 32 and 40 show examples of the configuration of the control object circuit in the integrated circuit of the foregoing embodiments.

FIG. 32 shows an example of memory circuit 13-1 in the form of a redundant circuit, and FIG. 40 shows an example of resistance fine-adjustment circuit 13-2.

Memory circuit 13-1 comprises, as shown in FIG. 32, cell array region 131, row address decoder circuit 132, and selection control circuit 133.

Cell array region 131 retains data and is divided into a normal cell array region and a redundant cell array region. The small capacity of the ROM makes the capacity of the redundant cell array region as small as a redundant column for defective cells to be relieved.

Row address decoder circuit 132 decodes a row address selection signal input from an external unit.

Selection control circuit 133 decodes a column address selection signal input from an external unit and selects redundancy. Specifically, on the basis of defective cell information stored in trimming circuit 11, selection control circuit 133 controls selection for a non-defective cell in the redundant (cell array) region, excluding defective memory cells in the normal (cell array) region. In other words, selection control circuit 133 performs control based on a trimming signal output from trimming signal creating section 12*a* (12*b*, 12*c*) through trimming lines A', B', C', and D' such that a non-defective memory cell in the redundant region is selected.

If signal values of a redundant circuit shown in FIG. 32 to control object circuit 13 does not have a normal distribution, it is suitable that trimming values with lower risk are sequentially selected (see FIGS. 33-39) as performed in the second modification of the above first embodiment.

FIGS. 33-39 are tables showing a relationship between a trimming value and a trimming signal in the integrated circuit of the foregoing embodiments and modifications and in this example, trimming signals with a lower risk is sequentially selected. In the example shown in FIGS. 33-39, trimming circuit 11 includes 12 fuses (12 bits) and trimming signal creating section 12*a*, 12*b*, or 12*c* outputs an 8-bit trimming signal (12-bit fuse input, 8-bit output).

FIGS. 33-39 show only trimming values with risk "2" or less defined as above. FIG. 33 shows trimming value 0-51 after conversion; FIG. 34 shows trimming value 52-110 after conversion; FIG. 35 shows trimming value 111-169 after conversion; FIG. 36 shows trimming value 170-228 after conversion; FIG. 37 shows trimming value 229-285 after conversion; FIG. 38 shows trimming value 286-344 after conversion; and FIG. 39 shows trimming value 345-376 after conversion. The trimming values 256-376 obtained as the result of conversion are used as spare bits.

Resistance fine-adjustment circuit 13-2 comprises, as shown in FIG. 40, resistances R0, R1, R2, R3, and R4 connected in series, and analog switches (NMOS; N-channel Metal-Oxide Semiconductor) M1, M2, M3, and M4. Analog switch M1 is connected to resistance R1 in parallel; analog switch M2 is connected to resistance R2 in parallel; analog switch M3 is connected to resistance R3 in parallel; and analog switch M4 is connected to resistance R4 in parallel.

If signal values for resistance fine adjustment to control object circuit 13 have a normal distribution as resistance fine-adjustment circuit 13-2 shown in FIG. 40, it is preferable that trimming pattern with a low risk is selected so as to be the median of the normal distribution as shown in FIGS. 41-47, and 48-51.

FIGS. 41-17, 48-51, and 52 are tables showing relationships between a trimming value and a trimming signal when trimming patterns with a low risk is set to be the median of the normal distribution. The example shown in FIGS. 41-47 assumes a 12-bit fuse input and an 8-bit output and a higher priority given to an adjustment range. The example shown in FIG. 48-54 assumes an 11-bit fuse input and an 8-bit output, and a higher priority given to the area. The example shown in FIG. 52 shifts the median of the outputs in accordance with a normal distribution.

FIGS. 41-47 show only trimming values with risk "2" or less defined as above. FIG. 41 shows trimming value 0-51 after conversion; FIG. 42 shows trimming value 52-110 after conversion; FIG. 43 shows trimming value 111-169 after conversion; FIG. 44 shows trimming value 170-228 after conversion; FIG. 45 shows trimming value 229-285 after conversion; FIG. 46 shows trimming value 286-344 after conversion; and FIG. 47 shows trimming value 345-376 after conversion. The trimming values 256-376 obtained as the result of conversion are used as spare bits.

FIGS. 48-51 show only trimming values with risk "2" or less defined as above. FIG. 48 shows trimming value 11-66 after conversion; FIG. 49 shows trimming value 67-125 after conversion; FIG. 50 shows trimming value 126-184 after conversion; and FIG. 51 shows trimming value 185-243 after conversion.

In FIG. 52, a trimming signal (five bits) output from trimming signal creating section 12*a*, 12*b*, or 12*c* is associated with a decimal value representing the trimming signal and original trimming values (a 6-bit binary value, a decimal value). Also FIG. 52 omits original trimming values 43 or more with the risk of "3" or more.

In the example shown in FIG. 52, trimming signal creating sections 12*a*, 12*b*, and 12*c* output 13 trimming signal representing trimming values 0-12 (in a decimal code). With this configuration, addition of one or more fuses into trimming circuit 11 can secure a requisite number of trimming signals if a larger number trimming signals are required, and selection of trimming patterns with a low risk for the median of a normal distribution can reduce the area occupied by the trimming circuit.

FIG. 53 is a table showing a converted output pattern (a trimming value), and resistance values of resistances R1-R4, and the total resistance value in association with one another. The table shows an example in which the total resistance value is selected from trimming patterns with lower risks, and an example in which the output median is shifted in accordance with a normal distribution.

In FIG. 53, trimming patterns with lower risks are sequentially selected on the basis of the example of conversion outputs shown in FIG. 10 and the output median is shifted on the basis of the example of conversion outputs shown in FIG. 13 to match a normal distribution. In FIG. 53, "ON" represents establishment of a short circuit of each of analog switches M1-M4 (resistance R1-R4).

In the example of selection for trimming pattern with lower risks, the adjustment range of a resistance value is from R0 to R0+R1+R2+R3+R4 while in the other example of the output median shifted according to a normal distribution, the adjustment range of a resistance value is from R0+r3 to R0+R1+R2+R3.

FIG. 54 is a table shows values of a variation stat of in the resistance value between points a and b, assuming R0=93 [kΩ], R1=8[kΩ], R2=4[kΩ], R3=2 [kΩ], and R4=1 [kΩ].

As shown in FIG. 54, if trimming patterns with lower risks are sequentially selected, the resistance value between points a and b is variable in the range between 93-108 kΩ at intervals of 1 kΩ. In this setting, with the manufacture variation in resistance value as high as ±7.5%, the variation in resistance value between a-b can be 0.5% or less.

In another example in which the output median is shifted according to the normal distribution, the resistance value between points a and b is variable in the range between 95-107 kΩ at intervals of 1 kΩ. In this setting, with the manufacture variation in resistance value as high as ±6%, the variation in resistance value between points a-b can be 0.5% or less.

The means to blow an object fuse can be realized by partially modifying a conventional test program using a semiconductor tester, therefore requiring no new equipment.

Here, a semiconductor tester is a device which automatically judges (tests) a state (non-defective/defective) of a semiconductor product (e.g., an IC, an LSI) at a high speed.

Such a semiconductor tester measures the state of control object circuit 13 to determine one or more fuses that are to be blown, and also determines one or more blown object fuses such that a decoder output value becomes a specific value.

For example, when a circuit in which the median of output is shifted in accordance with the normal distribution of signals to (destined for???) control object circuit 13 is used as described above, a conversion table exemplified by that shown in FIG. 13 is stored in a semiconductor tester and fuses are blown with reference to values obtained as a result of the measurement.

Such a conversion table may be replaced with a judgment formula (a conditional formula) directly written into the program.

As a substitute for a semiconductor tester, a versatile device such as a PC (Personal Computer) and a WS (Work Station) carries out the same operation as performed by the semiconductor tester.

If fuses are blown on the customer's side, blown object fuses can be blown by laser trimming, electric trimming or other method with reference to a table provided from a semiconductor manufacturer or the like.

With the disclosure of the embodiments of the present invention, those skilled in the art can carry out the invention.

The present invention can be applied to various electronic parts with trimming circuits in which a number of fuses are arranged and arbitrary blown object fuses are blown in accordance with trimming values.

What is claimed is:

1. An integrated circuit comprising:
    a trimming circuit including a plurality of fuses arranged in alignment among which one or more blown object fuses are blown according to a trimming value; and
    a trimming signal creating section, disposed downstream of said trimming circuit, creating a trimming signal corresponding to the trimming value on the basis of a signal output from said trimming circuit,
    every two of said blown object fuses being arranged so as to be interposed by at least one un-blown fuse in said trimming circuit.

2. An integrated circuit according to claim 1, wherein
    a trimming pattern is generated by expressing the trimming value in a binary code;
    if the trimming pattern has a prohibition pattern, the trimming pattern is regarded as an avoidance trimming pattern;
    if the trimming pattern does not include the prohibition pattern, the trimming pattern is selected as a usable pattern; and
    when each of binary bits in the usable trimming pattern is associated with one of the plurality of fuses, one or more fuses associated with bit "1" in the usable trimming pattern are set to be said blown object fuses.

3. An integrated circuit according to claim 2, wherein
    one or more of the prohibition patterns are prepared;
    one or more weights are assigned one to each of the prohibition patterns; and
    the trimming pattern with the first prohibition pattern is selected as the avoidance trimming pattern on the basis of the weight assigned to the first prohibition pattern included in the trimming pattern, so that said blown object fuses in said trimming circuit are determined.

4. An integrated circuit according to claim 2, wherein said trimming signal creating section comprises a decoder decoding the signal output from said trimming signal and creating, as the result of the decoding, a signal corresponding to the usable trimming pattern.

5. An integrated circuit according to claim 4, wherein said trimming signal creating section further comprises an encoder encoding the signal created correspondingly to the usable trimming pattern by said decoder and creating, as the result of the encoding, the trimming signal.

6. An integrated circuit according to claim 1, wherein said trimming signal creating section is a logic circuit.

7. An integrated circuit according to claim 1, wherein
    said trimming signal creating section comprises a partial converting circuit creating the trimming signal based on a part of the signal output from said trimming circuit, and
    said partial conversion circuit converts one or more lower bits representing a redundant pattern in the signal output from said trimming circuit.

8. An integrated circuit according to claim 1, wherein said blown object fuses are blown at positions in a direction orthogonal to a direction different from one another in which the plurality of fuses are arranged.

9. An integrated circuit according to claim 1, wherein said trimming signal creating section further comprises, at an input side or an output side, a virtually blowing signal terminal.

10. A production apparatus for producing an integrated circuit including a trimming circuit with a plurality of fuses arranged in alignment, said apparatus comprising:
   a determining section for determining one or more blown object fuses that are to be blown from the plurality of fuses in terms of a trimming value; and
   a blowing section for blowing the blown object fuses determined by said determining section,
   said determining section determining the blown object fuses such that every two of the blown object fuses are interposed by at least one un-blown fuse.

11. A production apparatus according to claim 10, wherein:
   a trimming pattern is generated by expressing the trimming value in a binary code; and
   said determining section
      determines the trimming pattern, if having a prohibition pattern, to be an avoidance trimming pattern,
      selects the trimming pattern, if not including the prohibition pattern, as a usable pattern; and
   when each of binary bits in the usable trimming pattern is associated with one of the plurality of fuses, sets one or more fuses associated with bit "1" in the usable trimming pattern to be the blown object fuses.

12. A production apparatus according to claim 11, wherein
   one or more of the prohibition patterns are prepared;
   one or more weights are assigned one to each of the prohibition patterns; and
   said determining section selects the trimming pattern with the first prohibition pattern as the avoidance trimming pattern on the basis of the weight assigned to the first prohibition pattern included in the trimming pattern, so that the blown object fuses are determined.

13. A production apparatus according to claim 10, wherein said blowing section blows the blown object fuses at positions different from one another in a direction orthogonal to a direction in which the plurality of fuses are arranged.

14. A production method for producing an integrated circuit including a trimming circuit with a plurality of fuses arranged in alignment, comprising the steps of:
   determining one or more blown object fuses to be blown from the plurality of fuses in terms of a trimming value; and
   blowing the blown object fuse determined in said step of determining,
   the blown object fuses are determined such that every two of the blown object fuses are interposed by at least one un-blown fuse in said step of determining.

15. A production method according to claim 14, wherein
   a trimming pattern is generated by expressing the trimming value in a binary code; and
   a said step of determining comprises the sub-steps of:
   determining the trimming pattern, if having a prohibition pattern, to be an avoidance trimming pattern,
   selecting the trimming pattern, if not including the prohibition pattern, as a usable pattern; and
   when each of binary bits in the usable trimming pattern associated with one of the plurality of fuses,
   setting one or more fuses associated with bit "1" in the usable trimming pattern to be the blown object fuses in said step of determining.

16. A production method according to claim 15, wherein:
   one or more of the prohibition patterns are prepared;
   one or more weights are assigned one to each of the prohibition patterns; and
   said step of determining selects the trimming pattern with the first prohibition pattern as the avoidance trimming pattern on the basis of the weight assigned to the first prohibition pattern included in the trimming pattern, so that the blown object fuses are determined.

17. A production method according to claim 14, wherein said step of blowing blows the blown object fuses at positions different from one another in a direction orthogonal to a direction in which the plurality of fuses are arranged.

* * * * *